(12) United States Patent
Augusto

(10) Patent No.: US 9,036,960 B2
(45) Date of Patent: May 19, 2015

(54) PHOTONIC VIA WAVEGUIDE FOR PIXEL ARRAYS

(71) Applicant: QUANTUM SEMICONDUCTOR LLC, San Jose, CA (US)

(72) Inventor: Carlos J. R. P. Augusto, San Jose, CA (US)

(73) Assignee: QUANTUM SEMICONDUCTOR LLC, San Jose, CA (US)

( * ) Notice: Subject to any disclaimer, the term of this patent is extended or adjusted under 35 U.S.C. 154(b) by 0 days.

(21) Appl. No.: 14/513,376

(22) Filed: Oct. 14, 2014

(65) Prior Publication Data

US 2015/0030298 A1    Jan. 29, 2015

Related U.S. Application Data

(62) Division of application No. 12/676,985, filed as application No. PCT/IB2007/004682 on Sep. 6, 2007, now Pat. No. 8,885,987.

(51) Int. Cl.
  *G02B 6/12*   (2006.01)
  *G02B 6/122*  (2006.01)

(52) U.S. Cl.
  CPC .... *G02B 6/1225* (2013.01); *G02B 2006/12166* (2013.01); *G02B 2006/12176* (2013.01)

(58) Field of Classification Search
  USPC .......................................................... 385/14
  See application file for complete search history.

(56) References Cited

U.S. PATENT DOCUMENTS

| 5,602,679 A    | 2/1997  | Dolgoff |
| 2003/0222223 A1 | 12/2003 | Kamei |
| 2005/0001146 A1 | 1/2005  | Quinlan |
| 2005/0036738 A1 | 2/2005  | Zhou |
| 2006/0115230 A1 | 6/2006  | Komoguchi |
| 2007/0200054 A1* | 8/2007 | Reznik et al. ............... 250/208.1 |

FOREIGN PATENT DOCUMENTS

FR    2897472    8/2007

OTHER PUBLICATIONS

Takahara J et al: "Guiding of a One-Dimensional Optical Beam With Nanometer Diameter" Optics Letters, OSA, Optical Society of America, Washington, DC, US. vol. 22, No. 7, Apr. 1, 1997, pp. 475-477.

* cited by examiner

*Primary Examiner* — Uyen Chau N Le
*Assistant Examiner* — Hoang Tran
(74) *Attorney, Agent, or Firm* — Sturm & Fix LLP

(57) ABSTRACT

Light guiding structures are provided to improve the light coupling between photonic active devices and the top of a metallization layer stack interconnecting these photonic active devices. Each light guiding structure comprises a hole extending between the near surface of the photonic active devices and the top surface of the metallization layer stack, said hole being filled with dielectrics or a combination of dielectrics and metals. Such a light guiding structure removes from the optical path of light rays, the interfaces between the metallization layers, thereby confining light laterally and enabling interconnects with increased thickness and more levels of metal. This results in the suppression of multiple reflections and optical crosstalk. The light guiding structures can have cross-section diagonals with sub-wavelength dimensions can be fabricated after all CMOS process steps, thus having minimal interference and maximal compatibility with CMOS processing.

15 Claims, 92 Drawing Sheets

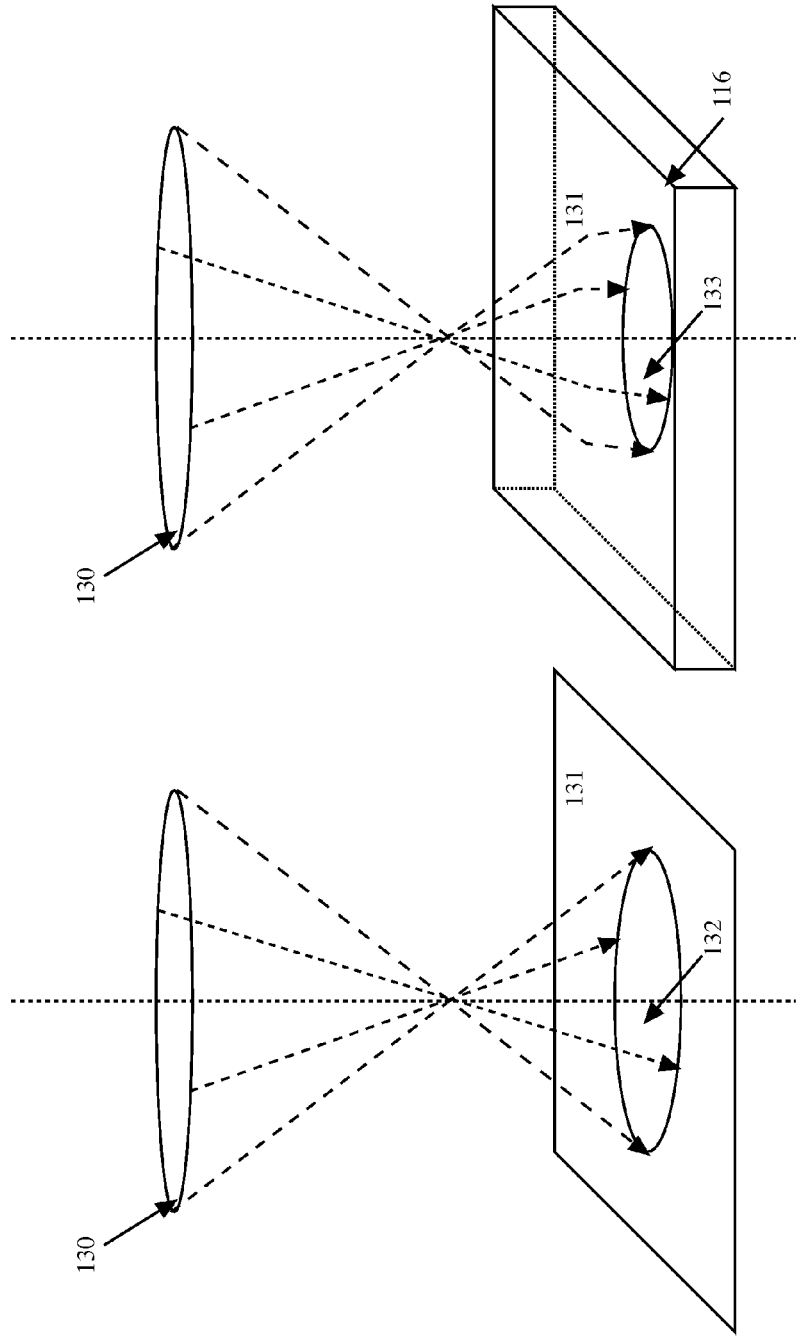

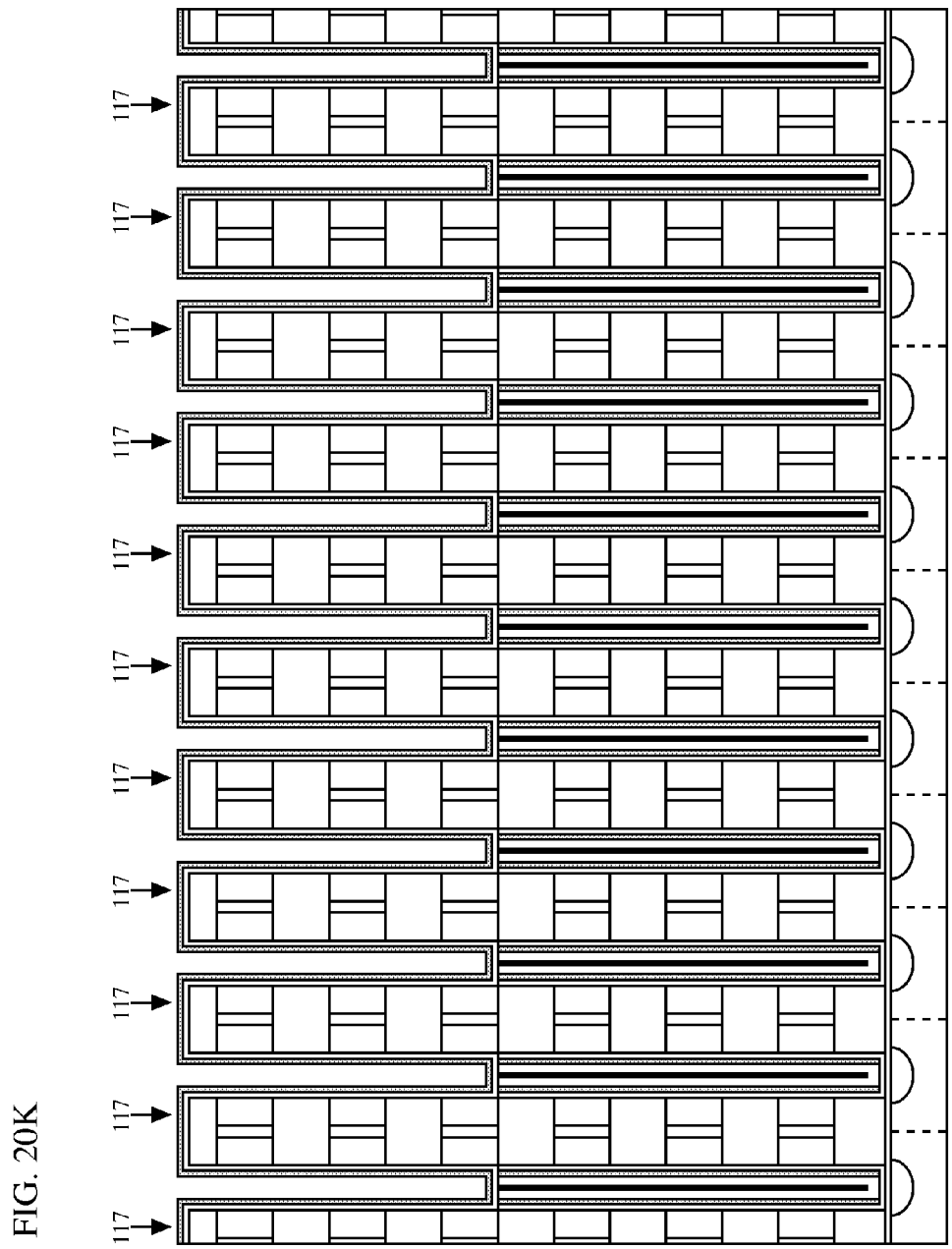

PHOTONIC VIA WAVEGUIDE FOR PIXEL ARRAYS

CROSS REFERENCE TO RELATED APPLICATIONS

This application is a Divisional of U.S. Ser. No. 12/676,985 filed Mar. 8, 2010, entitled PHOTONIC VIA WAVEGUIDE FOR PIXEL ARRAYS, which is a 371 National Phase of PCT/IB2007/004682 filed Sep. 6, 2007 and are hereby incorporated by reference herein in their entirety.

BACKGROUND OF THE INVENTION

The present invention relates to the coupling of light between a pixel comprising a light-sensor, and/or a light-emitter, and/or a light-valve, and other optical elements such as wavelength filters, polarization filters, beam splitters, etc. Such optical elements can be implemented with a varied set of technologies, including refractive optics, diffractive optics, 1D, 2D or 3D photonic crystals (or photonic band-gap materials), including purely dielectric structures, and/or metallodielectric structures, and/or metal structures with the possibility of using surface plasmon-polariton (SPP) effects.

Standard image sensors have microlens arrays, also referred to as microlenticular arrays or lenslet arrays, to focus the incoming light rays into the photo-diode region of each pixel, which in certain types of CCDs and in all types of CMOS Image Sensors (CIS) is only a fraction of the size of the total pixel. The ratio of the area of the light-sensing region over the entire pixel area is called the "Fill Factor". Therefore microlenses increase the optical fill factor over the pixel layout fill factor.

Typically, microlenses are fabricated on top of the Color Filter Array (CFA), which itself is fabricated on top of the passivation layer deposited over the last metal level of the image sensor integrated circuit.

This architecture for color filtering and maximizing the optical fill factor of imaging systems establishes a framework within which there has been incremental progress in optimizing each of these factors and their overall integration.

However, CIS made with CMOS technology of a particular generation, for example 0.13 µm, have not been able to use all the metal levels available for version of the process used to fabricate purely digital CMOS integrated circuits. This is because increasing the number of metal levels in the image sensor integrated circuit, inevitably increases the distance between the top of the passivation layer (on which the CFA and microlenses are made) and the photo-diode regions in the pixel matrix. As this distance increases, it becomes more likely that light focused by the microlens pertaining to a certain pixel, will actually be absorbed by the photo-diode of an another pixel. This is especially true for light rays that impinge on the microlens at high angles (angles far from the perpendicular to the substrate). This is also known as the "microlens problem". FIGS. 1A, 1B and 1C (Prior Art) show a typical cross section view of an image sensor, depicting the "microlens problem", especially visible in FIGS. 1B and 1C, in which a given microlens directs light to the wrong photo-diode.

For black & white image sensors, this problem results in light intensity cross-talk, and for color image sensors using CFAs, it also results in color cross-talk. Because of the severity of this problem, the number of metal layers used for on-chip interconnects has been generally kept to 4 or less.

Furthermore, after passing through the microlenses, light rays proceed to cross the color filters, the passivation layer, and all the interfaces between layers of different dielectric materials until they finally reach the surface of the light-sensing regions. All these layers have interfaces from which light is reflected back, and therefore never reaches the photo-sensing regions. FIG. 2 (Prior Art) shows reflection of light at the interfaces between different materials in the metallization stack. This problem is especially critical for copper metallization, which typically has one or more barrier layers (such as silicon nitride) at each metal level, resulting in a large number of interfaces between materials with significantly different indices of refraction, causing the reflection of an important fraction of the impinging light rays.

For CIS it would be highly advantageous to increase the number of metal levels possible to fabricate, because it would improve the performance and functionality of on-chip circuitry, which is one of the most attractive advantages of CIS over CCDs.

Conventional microlenses are typically made with soft materials, such as particular types of photo-resists, that are transparent to, and refract, light in the desired range of wavelengths (typically the visible range).

Microlenses are the last structures to be made during the wafer level fabrication of image sensors, because, if for no other reason, they are very sensitive to, and can be easily degraded by, the typical temperatures used in chemical vapor deposition (CVD), which is the preferred method to deposit films such as, for example, silicon dioxide and silicon nitride, or even diamond.

Also, one reason for making microlenses with such materials, is due to the fact that they are made on top of color filters, which are themselves also very sensitive to processing temperature. Were it not for the color filters, microlenses could be made with more rugged materials, such as diamond for example.

It should also be noted that in conventional image sensors, the plane of the microlenses is placed at the focal plane of the system lens. In order to avoid strong reflections from the top surface of the microlenses, the index of refraction of said microlenses should not be much larger than that of air, which, typically, is the only medium between the system lens and the microlenses.

As to the color filtering architecture used in standard imaging systems, it consists in the fabrication of a color filter array having each color filter aligned with a different pixel. The best known CFA is the Bayer pattern, in which there are two filters for green, one filter for red and one filter for blue. The filters consist of a thin film of an organic or inorganic material that allows the transmission of photons in the wavelength range corresponding to its color. However, the spectral purity of these filters is fairly poor in the sense that the transmission curve has a slow decrease towards zero for the wavelengths outside the desired interval, thereby significantly overlapping wavelengths that should only be transmitted by filters of other colors. The spectral purity of the filters can usually be increased by forming thicker films of the material used for color filtering, but that results in less light transmitted for the desired wavelengths. Therefore, for each color filter there is a tradeoff between spectral purity and transparency. Regardless of spectral purity, conventional color filtering always causes some attenuation in the wavelengths of interest.

In addition, the typical materials used for color filtering are intolerant of temperatures necessary to perform further processing using standard microstructure fabrication methods such as CVD for example, thereby placing severe restrictions on what other materials and structures can be fabricated after the formation of color filters. For example, from several points of view there would be many advantages to fabricating microlenses with materials such as diamond, due to its large index of refraction across a large range of wavelengths from the UV to the LWIR. However the temperatures and process steps necessary to deposit and pattern diamond cannot be tolerated by the typical materials used for color filters.

The present invention addresses the problems discussed above and provides an alternative structure to maximizing the optical fill factor and performing color filtering, that enables new possibilities for imaging systems. The new structure provides solutions, and the methods for their fabrication, to the problem of coupling light between the area corresponding to a pixel at the focal plane, located above the metallization stack, and the photo-diode region of the corresponding pixel, as well as to the problem of loss of light by the reflections at the interfaces between different materials in the metallization stack.

The structure according to the invention can be used in conjunction with, or substitute microlenses, depending on certain aspects of the implementation. In addition, the present invention may also be used in conjunction with, or it may substitute, conventional color filter arrays (CFAs), depending on certain aspects of the implementation. It is also possible to have an implementation in which both, the conventional microlens array and the conventional color filter array, can be substituted by the present invention.

In a scenario in which the new structure replaces conventional microlenses and color filters, after their fabrication, further processing becomes possible, including the formation of a region of high index of refraction, along with anti-reflection structures, at the focal plane produced by the system lens. Consequently, the image circle produced by the system lens has its lateral dimensions reduced, with respect to air, by a numerical factor given by the ratio of the indices of refraction of said region with high index of refraction over that of air. In this case, the lateral dimensions of the pixels in the imaging matrix, and the dimensions of the matrix itself, can also be scaled by the same numerical factor. It should be noted that this will not change the amount of light received by each pixel.

SUMMARY OF THE INVENTION

An object of the invention is a structure (called herein "Light-Tunnel") consisting of a dielectric-filled hole, extending from near the top surface of photo-diodes in a pixel matrix, to the top of the metallization stack and/or the passivation layer, said dielectric having a larger index of refraction than the Inter-Metal Dielectrics used in the metallization stack, and therefore existing between "Light-Tunnels" of adjacent pixels.

Another object of the invention is a "Light-Tunnel" consisting of a dielectric-filled hole with light-reflecting metal side walls, extending from near the top surface of photo-diodes in a pixel matrix, to the top of the metallization stack and/or the passivation layer.

Another object of the invention is a "Light-Tunnel" consisting of a dielectric-filled hole with light-reflecting metal side walls, extending from near the top surface of photo-diodes in a pixel matrix, to the top of the metallization stack and/or the passivation layer, and in which the diameter of the holes can be varied to create cavity effects for different wavelengths, and thus substituting conventional color filters.

Yet another object of the invention is a "Light-Tunnel" consisting of a dielectric-filled hole with light-reflecting metal side walls and metal column at the center of said hole, extending from near the top surface of photo-diodes in a pixel matrix, to the top of the metallization stack and/or the passivation layer.

Another object of the invention is a "Light-Tunnel" consisting of a dielectric-filled hole with a metal column at the center of said hole, extending from near the top surface of photo-diodes in a pixel matrix, to the top of the metallization stack and/or the passivation layer.

Another object of the invention is a "Light-Tunnel" consisting of a dielectric-filled hole with or without light-reflecting metal side walls, extending from near the top surface of photo-diodes in a pixel matrix, to the top of the metallization stack and/or the passivation layer, and in which the diameter at the bottom is much smaller than the diameter at the top, where it can match the lateral dimensions of the pixel.

Another object of the invention is a "Light-Tunnel" consisting of a dielectric-filled hole with or without light-reflecting metal side walls, extending from near the top surface of photo-diodes in a pixel matrix, to the top of the metallization stack and/or the passivation layer, and in which the diameter at the bottom is much smaller than the diameter at the top, where it can match the lateral dimensions of the pixel, and where a radial gradient in the index of refraction can be formed, thereby forming GRIN lenses and thus substituting conventional microlenses.

Yet another object of the invention is a method of fabrication, in which the Light-Tunnels are fabricated in a single stage, after all processing steps related to the metallization are finished, but before and/or after the deposition of the passivation layer.

Another object of the invention is a method of fabrication, in which the Light-Tunnels are fabricated in multiple stages, with only the last stage occurring after all the processing for the fabrication of the metal interconnects are done, and all other stages inserted into the processing of the metal interconnects.

Another object of the invention is a "Light-Tunnel" fabricated according to any of the described methods of fabrication, in which bends are made, enabling the coupling light between the focal point of a pixel and a photo-diode that are not vertically aligned with each other, in which at least one horizontal waveguiding structure is fabricated at the top of the metallization stack.

Another object of the invention is a "Light-Tunnel" fabricated according to any of the described methods of fabrication, in which bends are made, enabling the coupling light between the focal point of a pixel and a photo-diode that are not vertically aligned with each other, in which at least one horizontal waveguiding structure is fabricated at some intermediate point of the fabrication of metallization stack.

Yet another object of the invention is the fabrication of "Light-Tunnels" that are wavelength-selective, by suitable selection of the geometry and lateral dimensions of the dielectric-filled holes and/or metal side walls, thereby simultaneously providing waveguiding and color filtering to the light beams coupled to said "Light-Tunnels".

Another object of the invention is the fabrication of "Light-Tunnels" that are polarization-selective, by suitable selection of the geometry and lateral dimensions of the dielectric-filled holes and/or metal side walls, thereby simultaneously providing waveguiding and polarization filtering to the light beams coupled to said "Light-Tunnels".

Another object of the invention is the fabrication of "Light-Tunnels" with planar perforated metal this films, connected to the side wall metal film, and/or to the metal film at the center, and/or both, in which the metal film thickness and pattern of the perforations determine wavelength selectivity and/or polarization selectivity of the light that is coupled to the photo-diodes.

The present invention can be applied, for example, to pixel matrices incorporated into image sensor systems and/or image display systems. The description of the invention which follows will be performed using the example of image sensors.

BRIEF DESCRIPTION OF THE DRAWING FIGURES

Figure 2:
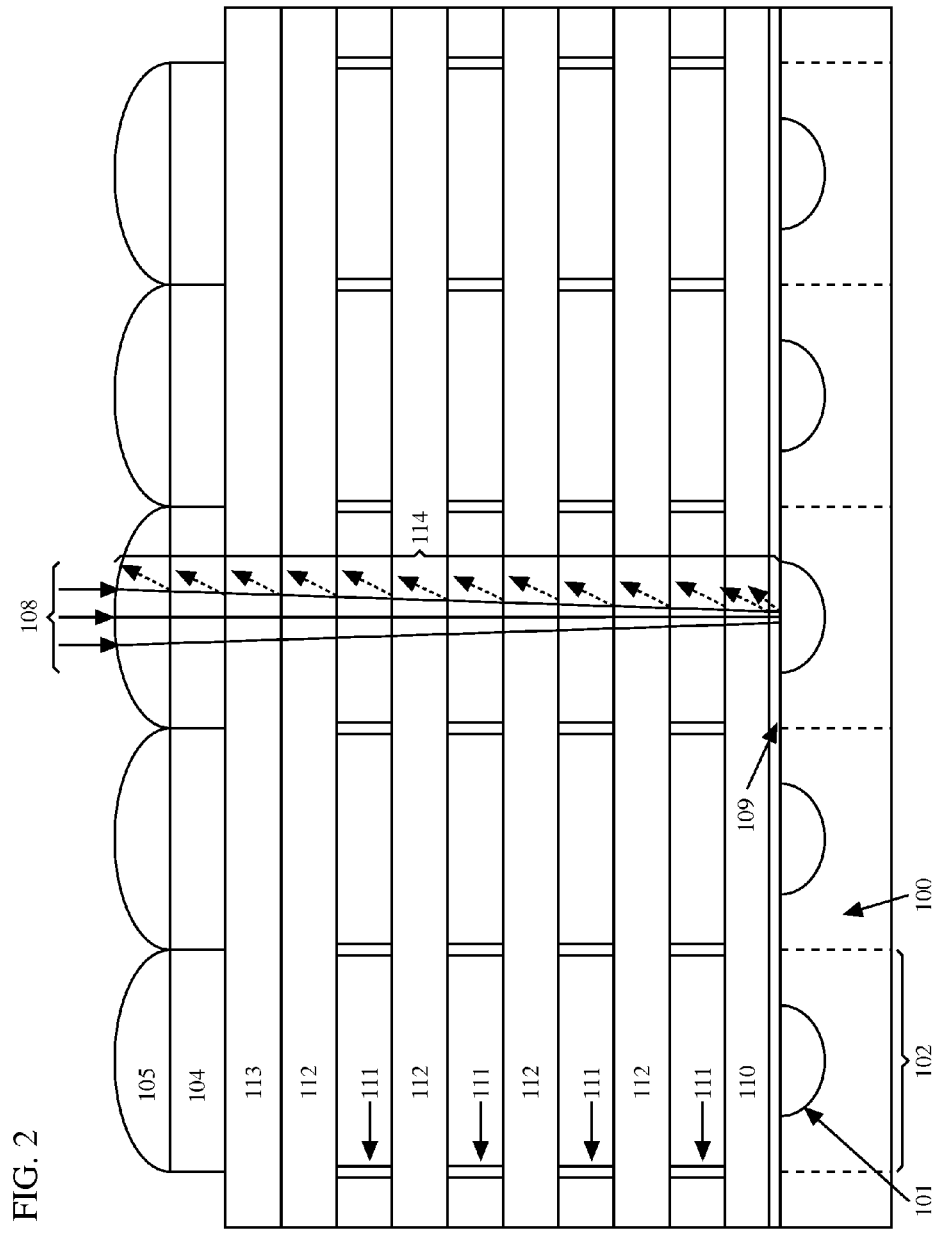

FIG. 2 (Prior Art) is a schematic cross section of multiple pixels in a sensor matrix, showing a semiconductor substrate (100), a pixel region (102) which comprises a photo-diode (101), a pre-metal dielectric barrier layer (109) which typically is silicon nitride, a pre-metal dielectric (110) which typically is silicon oxide, several metal levels (111) and several inter-metal dielectric layers (112) which typically are silicon oxide or dielectrics with a low permeability, also known as low-k dielectrics. On top of the metallization layer stack, it also shows a passivation layer (113)—typically silicon nitride, conventional color filters (104), and conventional microlenses (105). There is also a schematic representation of impinging light rays (108) and their reflection (114) at the several interfaces between layers in the metallization stack.

Figure 3:
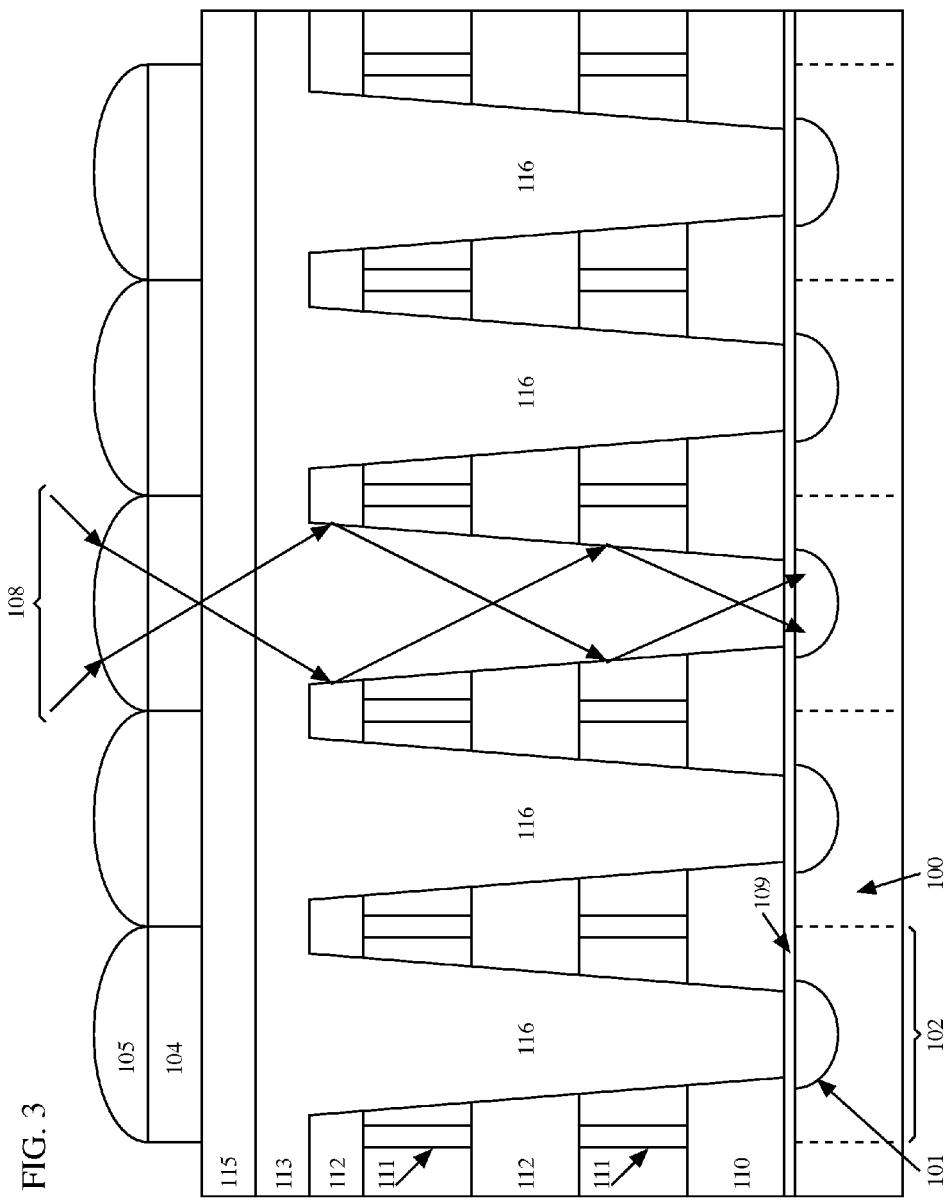

FIG. 3 is a schematic cross section of multiple pixels in a sensor matrix showing Light-Tunnels (116), also showing a semiconductor substrate (100), a pixel region (102) which comprises a photo-diode (101), a pre-metal dielectric barrier layer (109) which typically is silicon nitride, a pre-metal dielectric (110) which typically is silicon oxide, several metal levels (111) and several inter-metal dielectric layers (112) which typically are silicon oxide or dielectrics with a low permeability, also known as low-k dielectrics. On top of the metallization layer stack, it also shows a passivation layer (113)—typically silicon nitride, conventional color filters (104), and conventional microlenses (105). There is also a schematic representation of impinging light rays (108) and their reflection (114) at the several interfaces between layers in the metallization stack.

Figure 4:
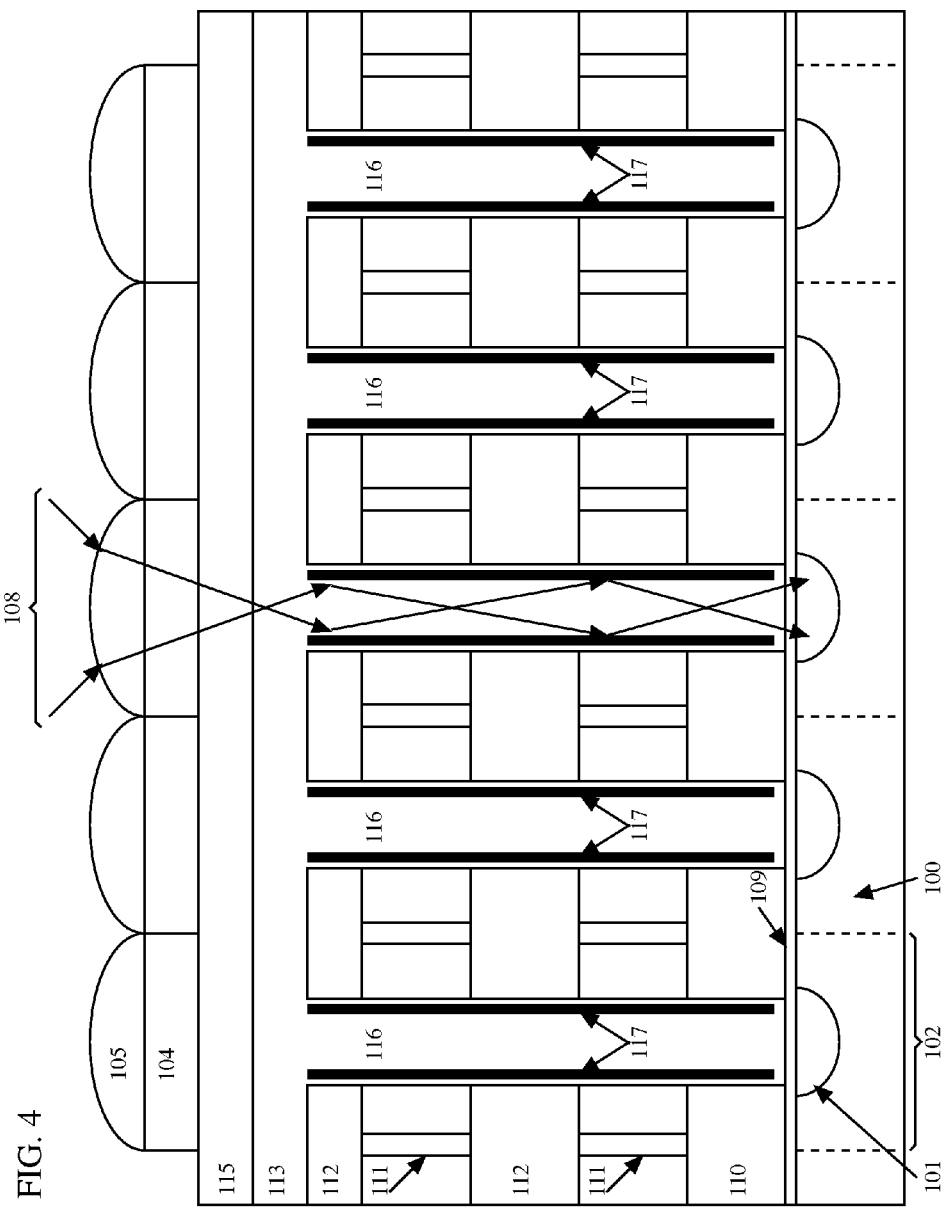

FIG. 4 is similar to FIG. 3, but with Light-Tunnels having side wall (117) reflectors (metal films).

Figure 5:
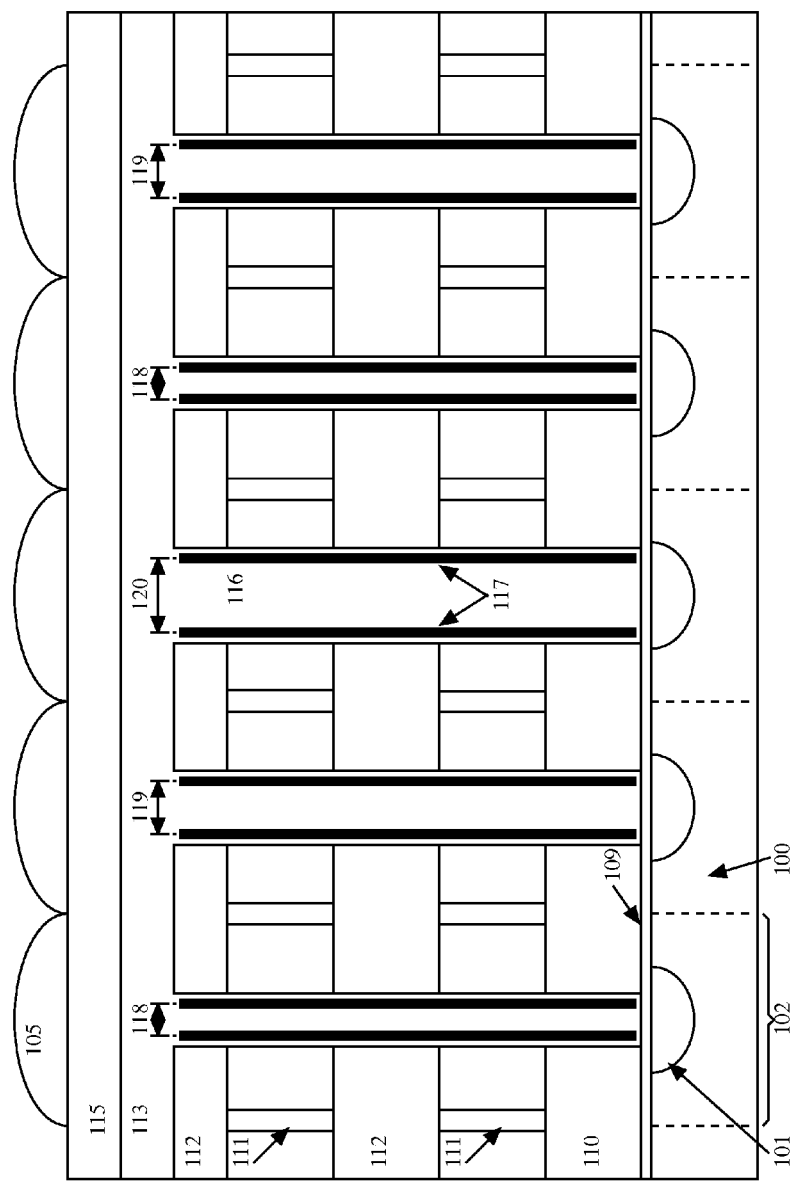

FIG. 5 is similar to FIG. 4, but in which the lateral dimensions of the Light-Tunnels are purposefully varied to achieve wavelength selectivity: the narrowest Light-Tunnel (118) transmits shorter wavelengths, the middle sized (119) Light-Tunnels transmit mid-range wavelengths, and the widest (120) Light-Tunnel transmits longer wavelengths.

Figure 6:
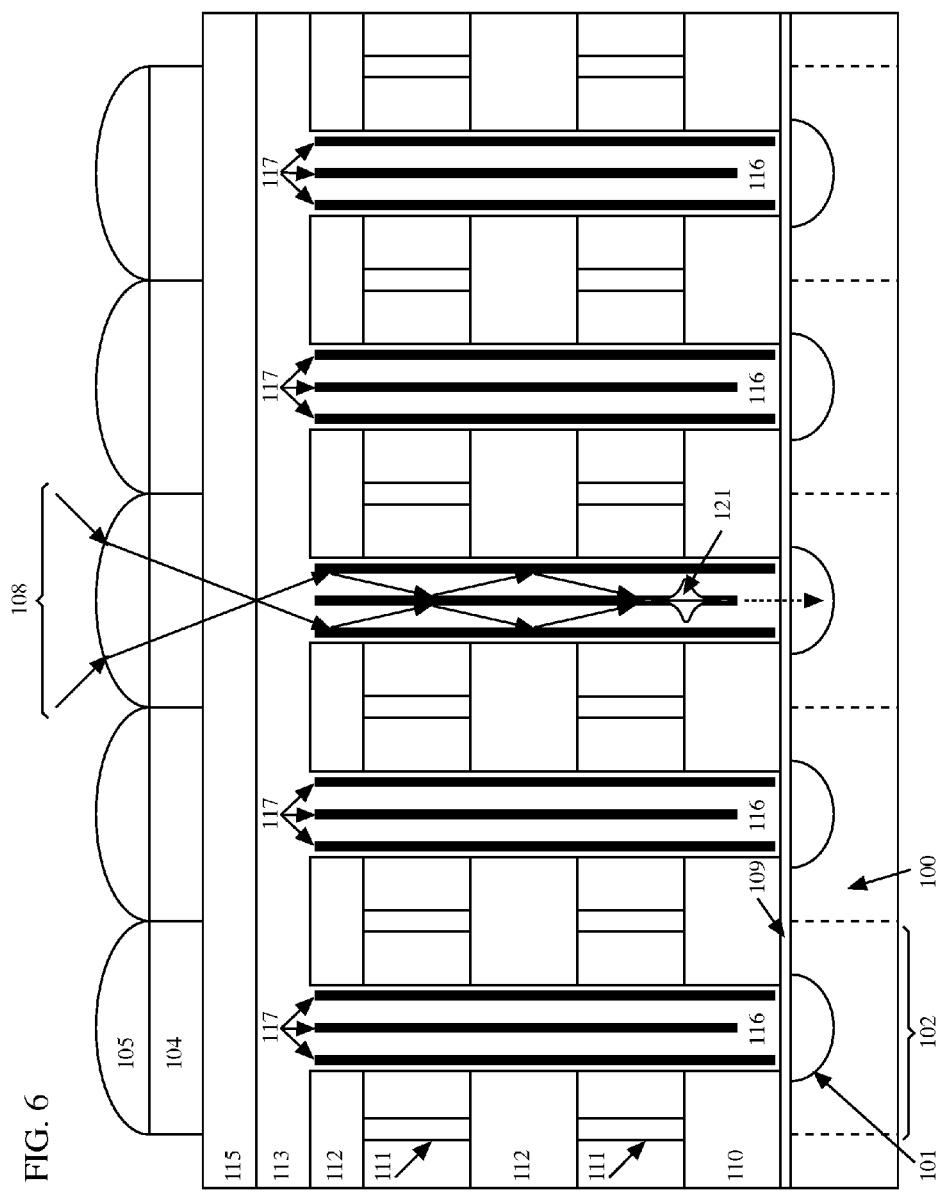

FIG. 6 is similar to FIG. 4, but shows Light-Tunnels having a metal (117) structure at the center, and depicting a representation (121) of surface plasmon-polaritons (SPP) at the surface of said metal structure.

Figure 7:
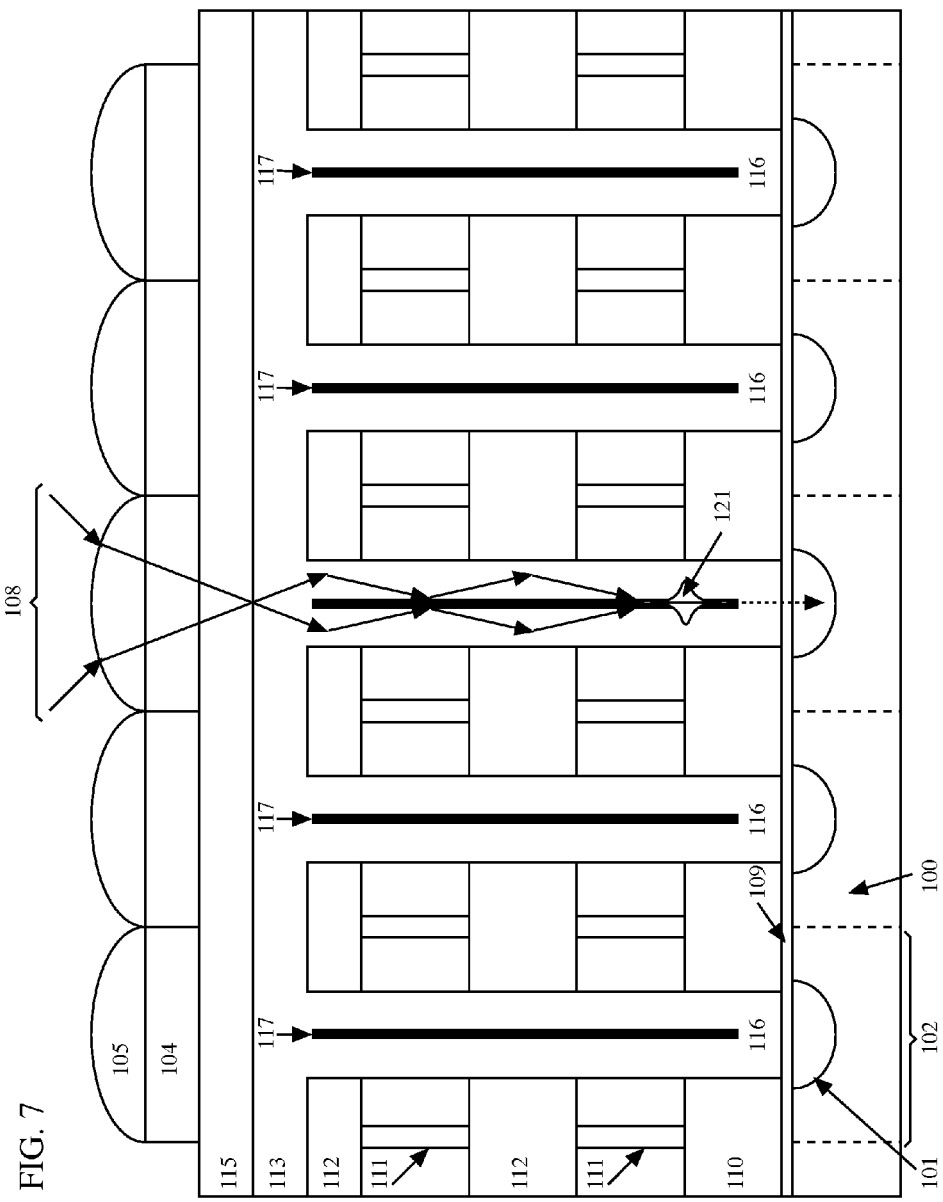

FIG. 7 is similar to FIG. 6, with Light-Tunnels having a metal structure at the center (117), and depicting a representation (121) of surface plasmon-polaritons (SPP) at the surface of said metal structure, but without side wall reflectors (metal films).

Figure 8:
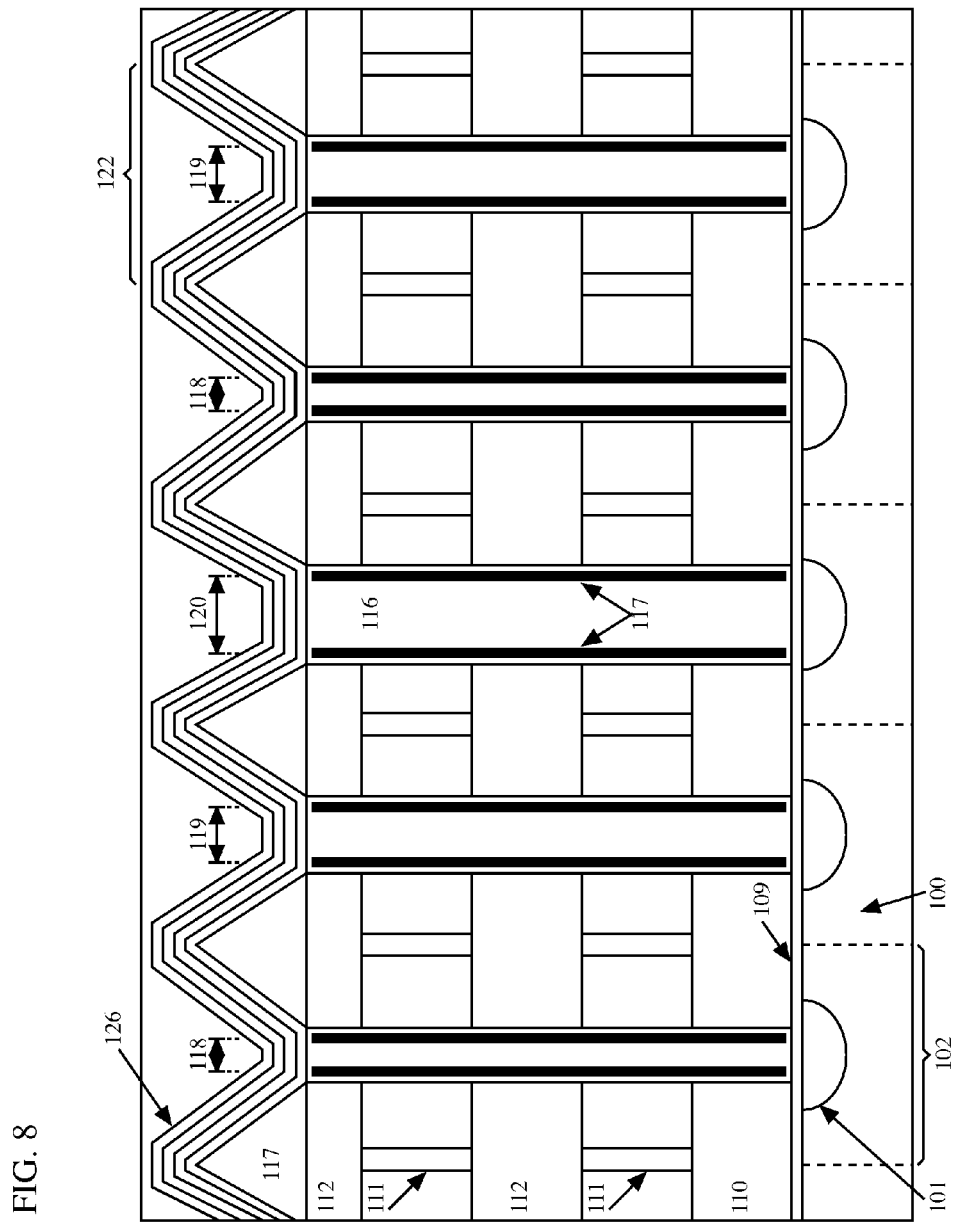

FIG. 8 is a schematic cross section of multiple pixels in a sensor matrix showing Light-Tunnels (116), also showing a semiconductor substrate (100), a pixel region (102) which comprises a photo-diode (101), a pre-metal dielectric barrier layer (109) which typically is silicon nitride, a pre-metal dielectric (110) which typically is silicon oxide, several metal levels (111) and several inter-metal dielectric layers (112) which typically are silicon oxide or dielectrics with a low permeability, also known as low-k dielectrics. The Light-Tunnels (116) have side wall (117) reflectors (metal films), have a top region that is wider than the bottom region, said top region comprising a region in which the index of refraction is larger a the center (126) forming a GRadient Index (GRIN) lens that is shaped in an inverted truncated cone or pyramid (122). The lateral dimensions of the Light-Tunnels are purposefully varied to achieve wavelength selectivity: the narrowest Light-Tunnel (118) transmits shorter wavelengths, the middle sized (119) Light-Tunnels transmit mid-range wavelengths, and the widest (120) Light-Tunnel transmits longer wavelengths.

Figure 9:
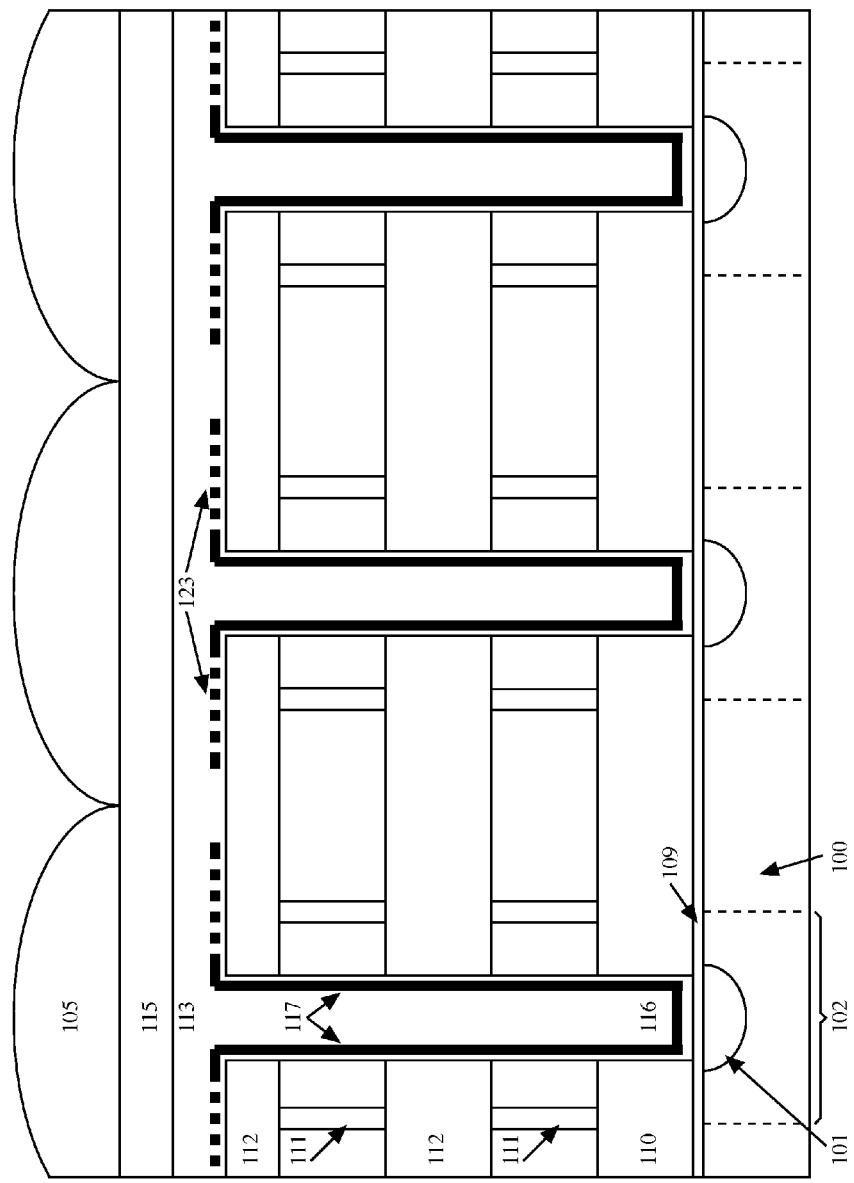

FIG. 9 is a schematic cross section of multiple pixels in a sensor matrix showing Light-Tunnels (116), also showing a semiconductor substrate (100), a pixel region (102) which comprises a photo-diode (101), a pre-metal dielectric barrier layer (109) which typically is silicon nitride, a pre-metal dielectric (110) which typically is silicon oxide, several metal levels (111) and several inter-metal dielectric layers (112) which typically are silicon oxide or dielectrics with a low permeability, also known as low-k dielectrics. On top of the metallization layer stack, it also shows a passivation layer (113)—typically silicon nitride, an anti-reflection layer (115) having a vertically graded index of refraction, and conventional microlenses (105). The metal side walls (117) of the Light-Tunnels (116) are connected to a perforated planar metal film (123) positioned at the top of the metallization stack. The structured planar metal thin film can be used to select wavelength and/or polarization of the photons to be guided to the photo-diodes.

Figure 10:
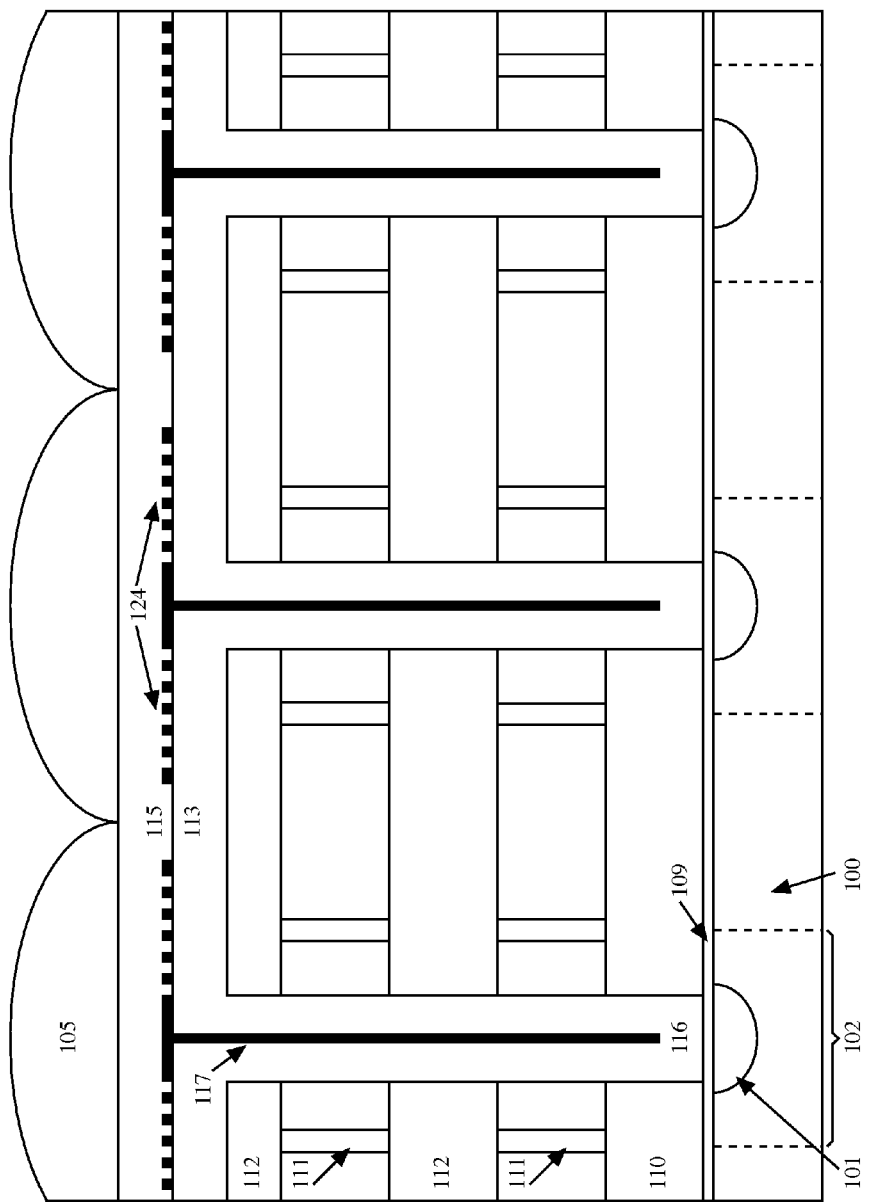

FIG. 10 is a schematic cross section of multiple pixels in a sensor matrix showing Light-Tunnels (116), also showing a semiconductor substrate (100), a pixel region (102) which comprises a photo-diode (101), a pre-metal dielectric barrier layer (109) which typically is silicon nitride, a pre-metal dielectric (110) which typically is silicon oxide, several metal levels (111) and several inter-metal dielectric layers (112) which typically are silicon oxide or dielectrics with a low permeability, also known as low-k dielectrics. On top of the metallization layer stack, it also shows a passivation layer (113)—typically silicon nitride, an anti-reflection layer (115) having a vertically graded index of refraction, and conventional microlenses (105). The center metal structures (117) of the Light-Tunnels (116) are connected to a perforated planar metal film (124) positioned at the top of the metallization stack. The structured planar metal thin film can be used to select wavelength and/or polarization of the photons to be guided to the photo-diodes.

Figure 11:
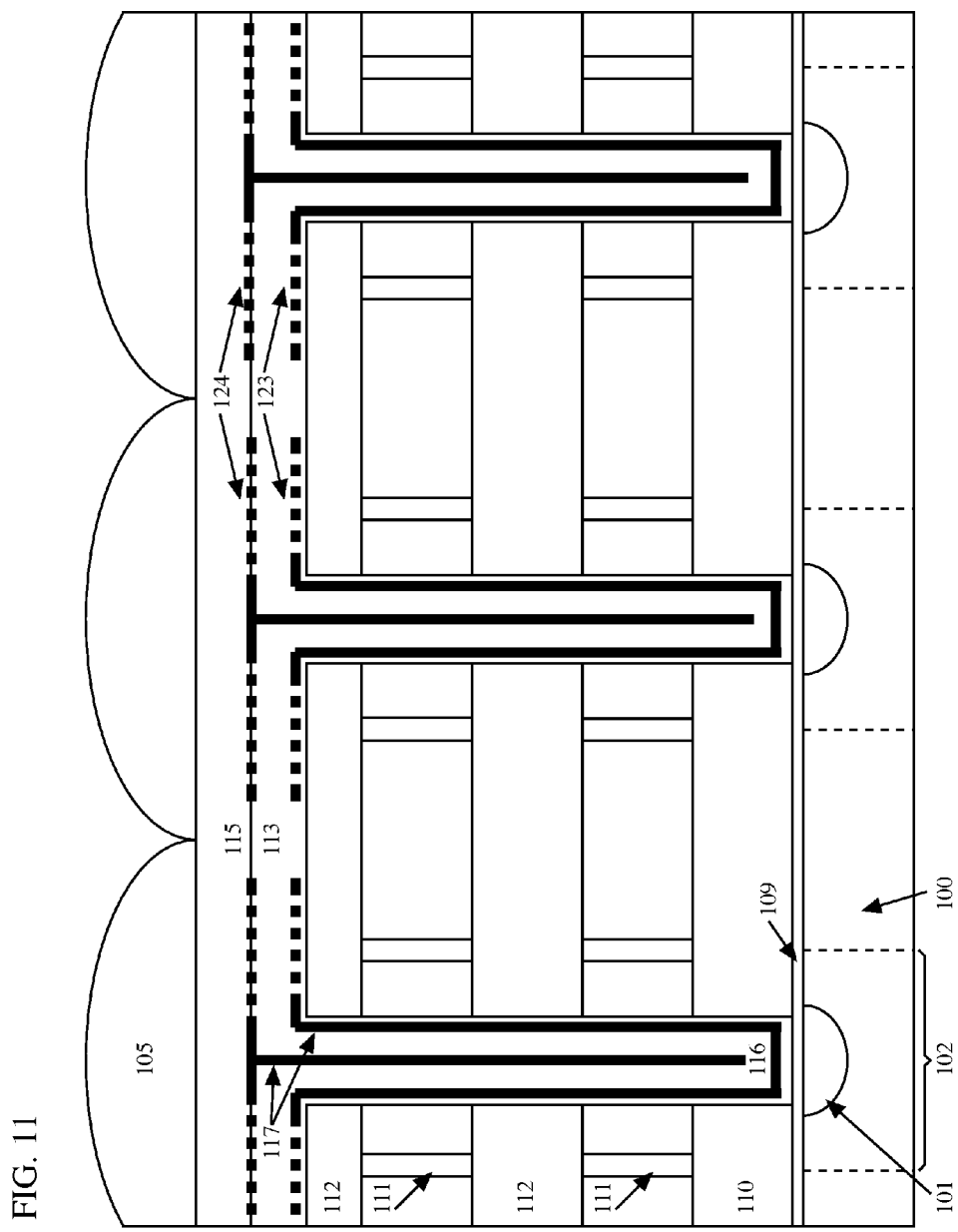

FIG. 11 is a schematic cross section of multiple pixels in a sensor matrix showing Light-Tunnels (116), also showing a semiconductor substrate (100), a pixel region (102) which comprises a photo-diode (101), a pre-metal dielectric barrier layer (109) which typically is silicon nitride, a pre-metal dielectric (110) which typically is silicon oxide, several metal levels (111) and several inter-metal dielectric layers (112) which typically are silicon oxide or dielectrics with a low permeability, also known as low-k dielectrics. On top of the metallization layer stack, it also shows a passivation layer (113)—typically silicon nitride, an anti-reflection layer (115) having a vertically graded index of refraction, and conventional microlenses (105). The metal side walls (117) of the Light-Tunnels (116) are connected to a perforated planar metal film (123) positioned at the top of the metallization stack. The center metal structures (117) of the Light-Tunnels (116) are connected to a perforated planar metal film (124) positioned at the top of the metallization stack. The structured planar metal thin film can be used to select wavelength and/or polarization of the photons to be guided to the photo-diodes. The patterns in the two top planar metal films could be identical and aligned, or could be identical but with a pre-determined shift in one or two directions in the plane of the films, or it could simply be different for each of the films.

Figure 12:
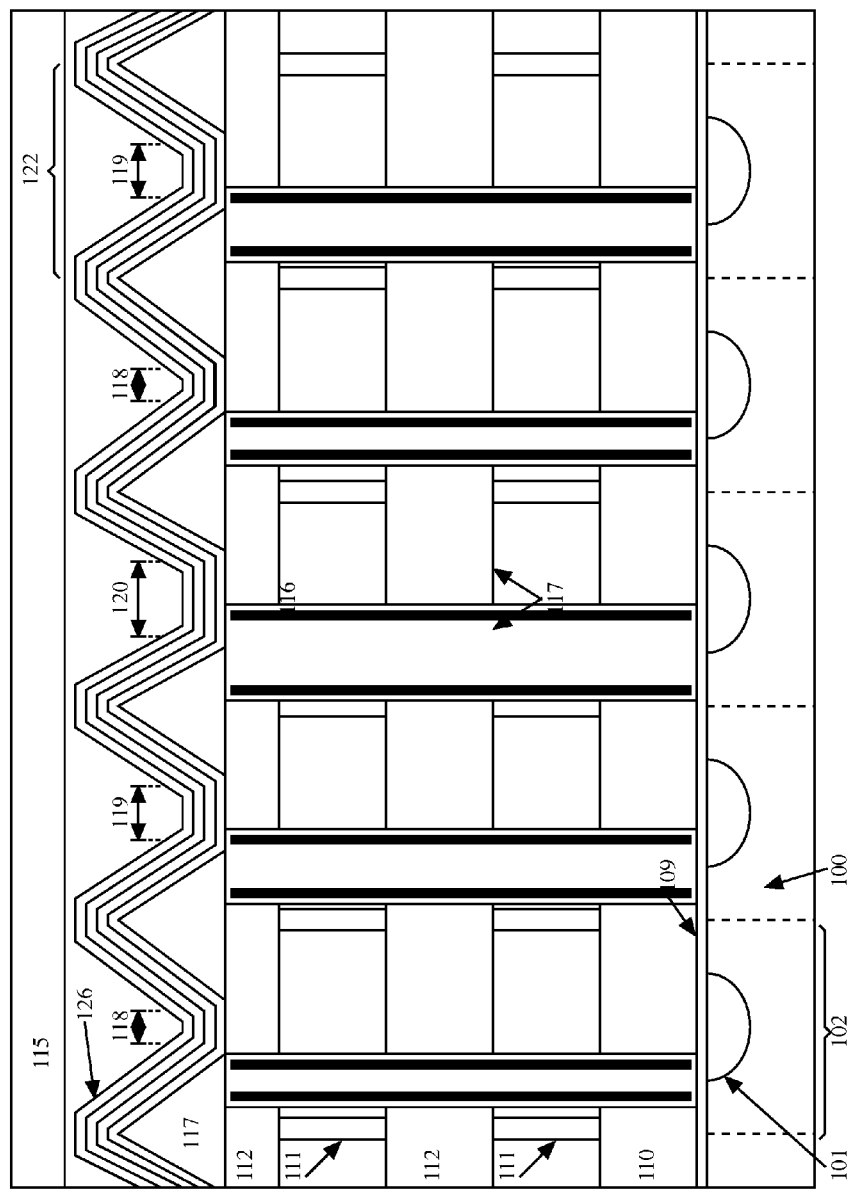

FIG. 12 is similar to FIG. 8, and in which the anti-reflection structure, positioned on top of the Light-Tunnels, consists of a planar film (115) with varying composition and correspondingly a varying index of refraction along the vertical direction (the direction of deposition). The index of refraction is largest at the bottom where it interfaces with the Light-Tunnels, and smallest at the top where the film ends and therefore where it interfaces with air.

Figure 13:
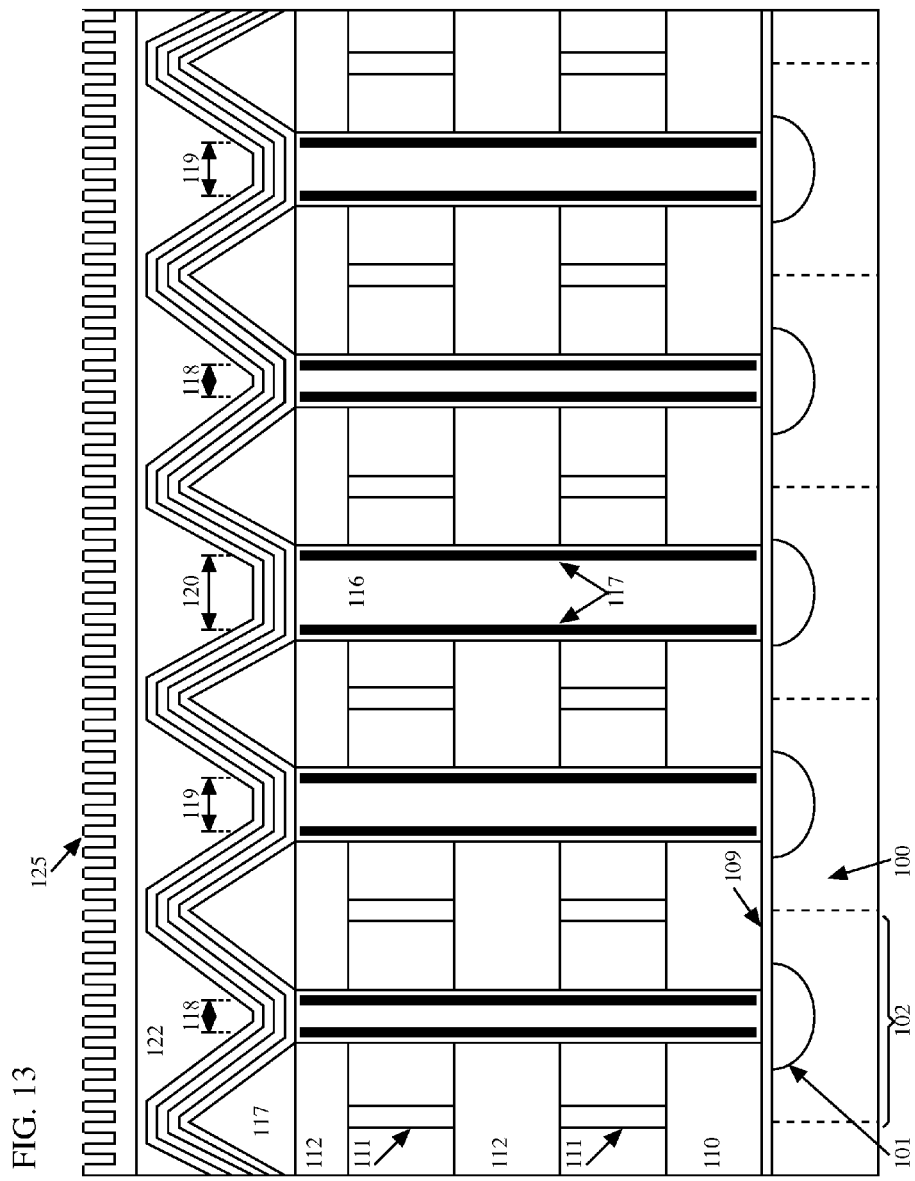

FIG. 13 is similar to FIG. 8, and in which the anti-reflection structure, positioned on top of the Light-Tunnels, consists of a film (125) with a large index of refraction, for example having the same index of refraction of the inner region of the Light-Tunnels, with suitable thickness and whose top surface is patterned with subwavelength features, which are known to suppress reflection.

FIG. 14 (Prior Art) shows the image circle (132) at a focal plane (131) in air as produced by a system lens (130).

FIG. 15 shows the image circle (133) at a focal plane (131) in a medium with high index of refraction (116) as produced by a system lens (130) identical to that of FIG. 14.

FIGS. 16A to 16F, show the sequence of process steps describing the fabrication flow of one implementation of the present invention, in which the Light-Tunnels are made of dielectric films.

FIGS. 17A to 17I, show the sequence of process steps describing the fabrication flow of one implementation of the present invention, in which the Light-Tunnels are made of dielectric films and have side wall reflectors.

FIGS. 18A to 18M, show the sequence of process steps describing the fabrication flow of one implementation of the present invention, in which the Light-Tunnels are made of dielectric films have side wall reflectors, and their diameter at the top matches the pixel size.

Figure 19A:
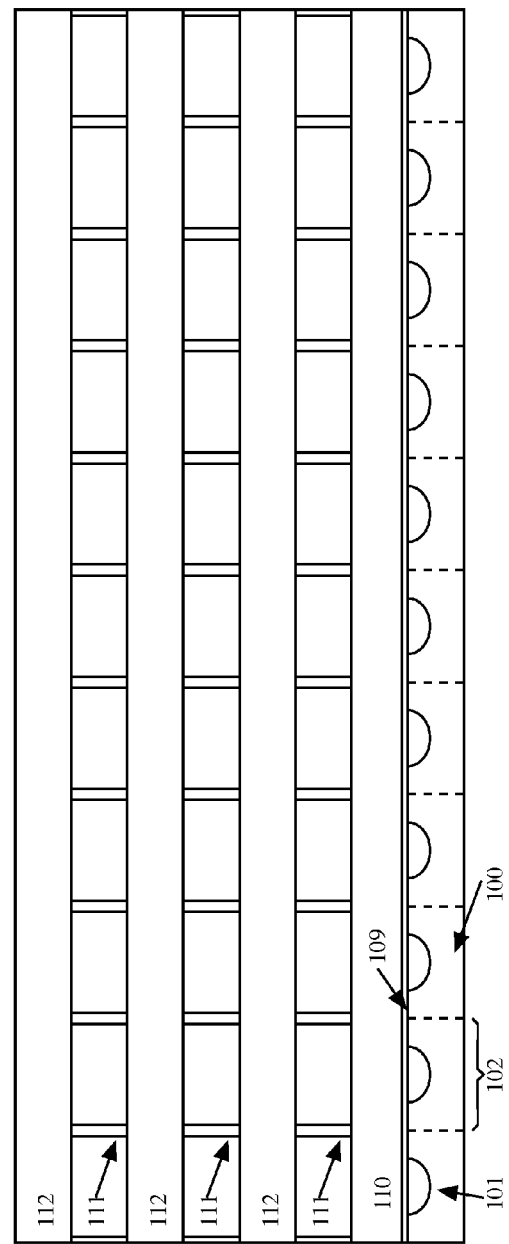
Figure 19B:
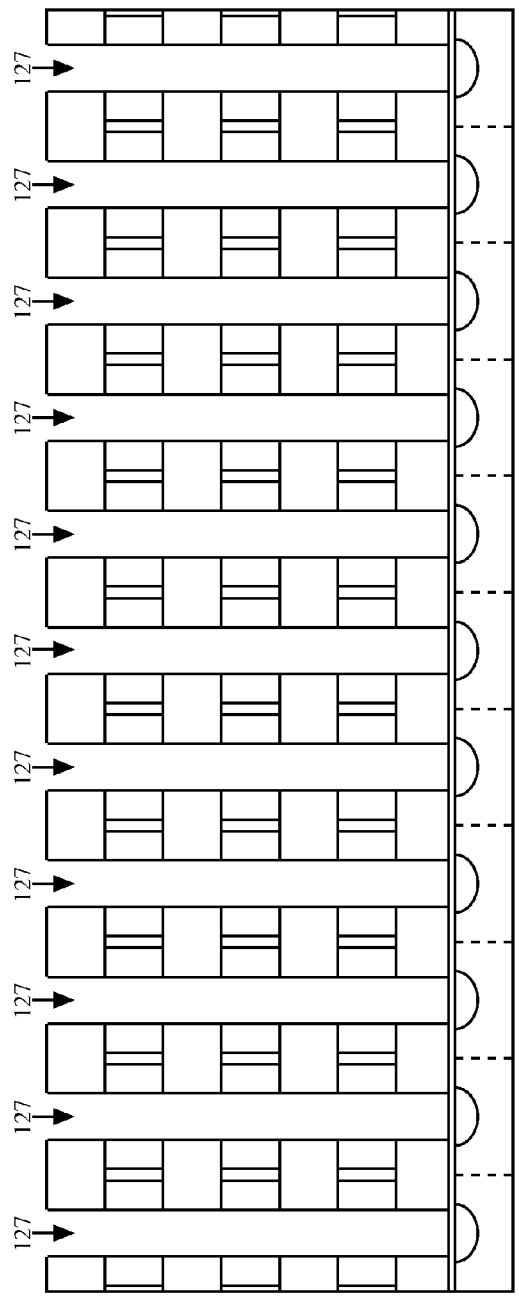
Figure 19C:
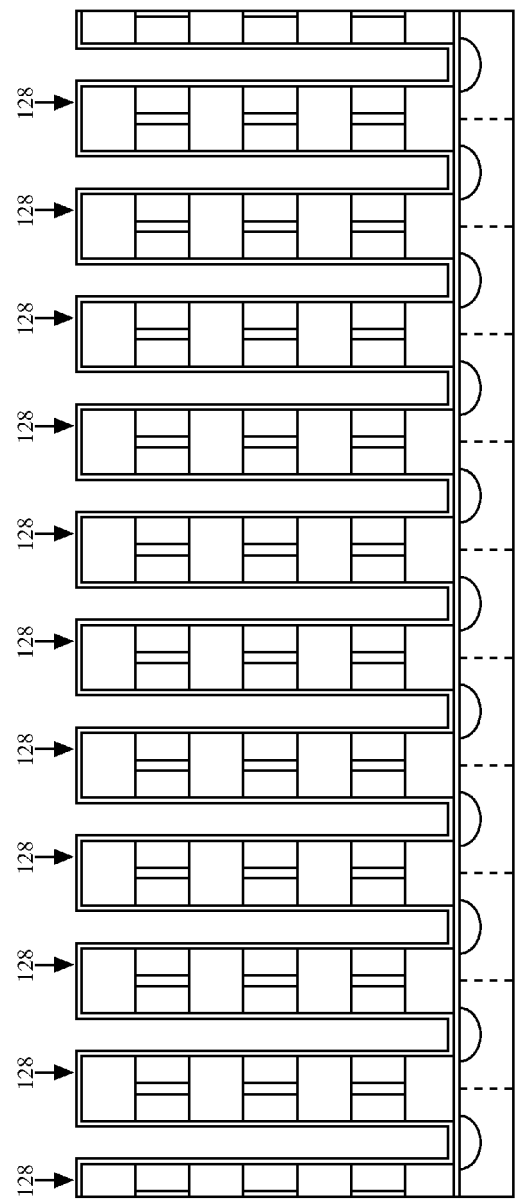
Figure 19D:
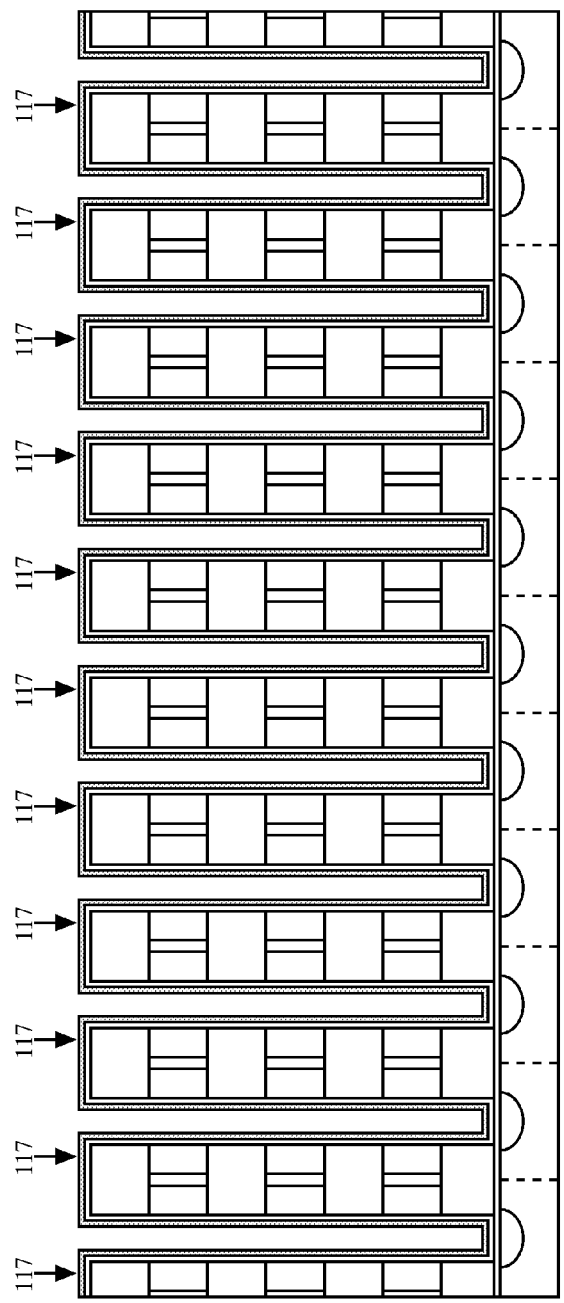
Figure 19E:
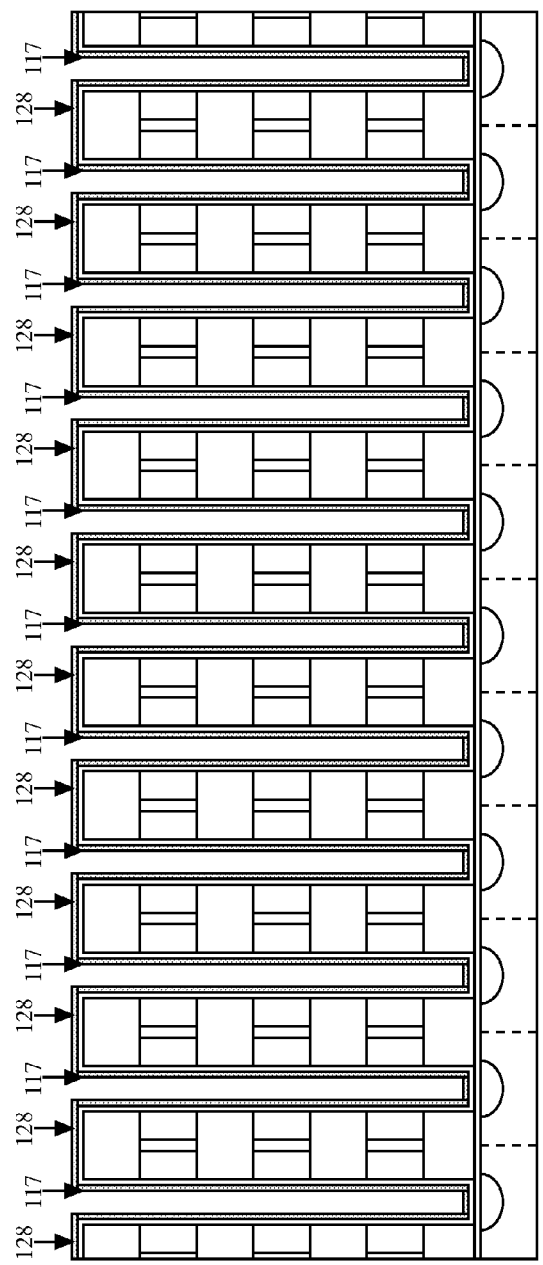
Figure 19F:
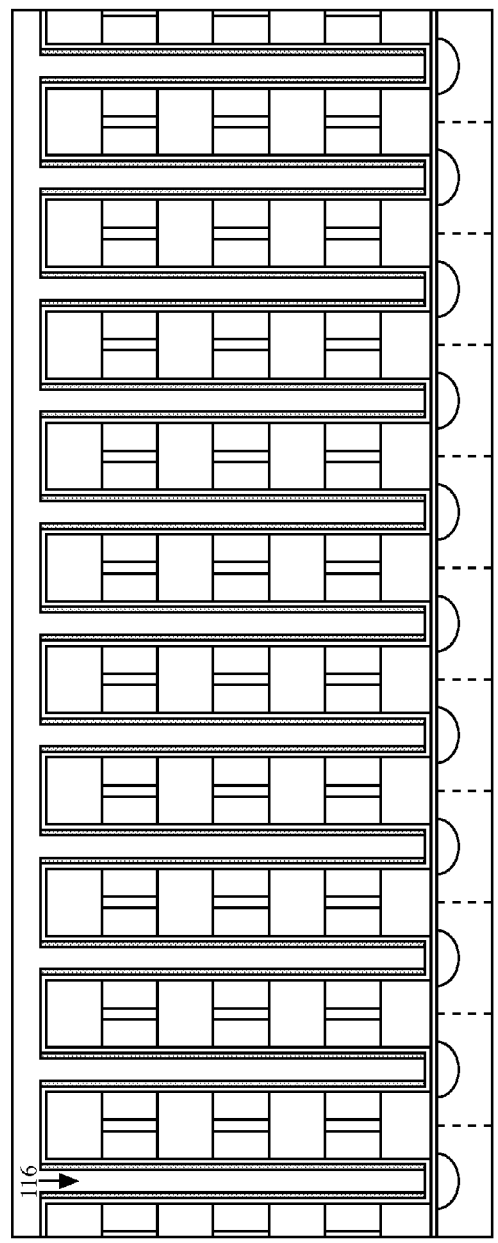
Figure 19G:
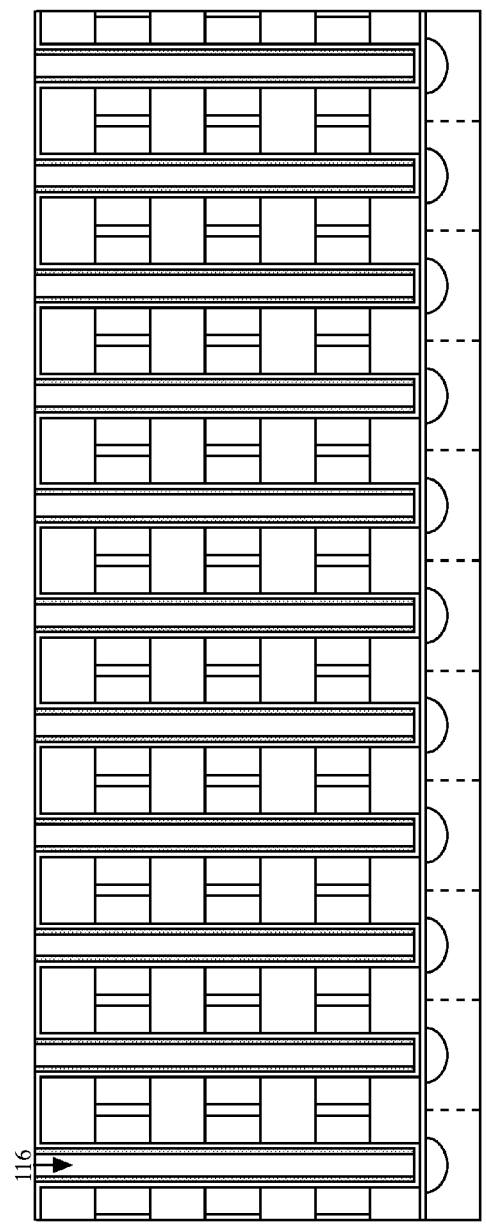
Figure 19H:
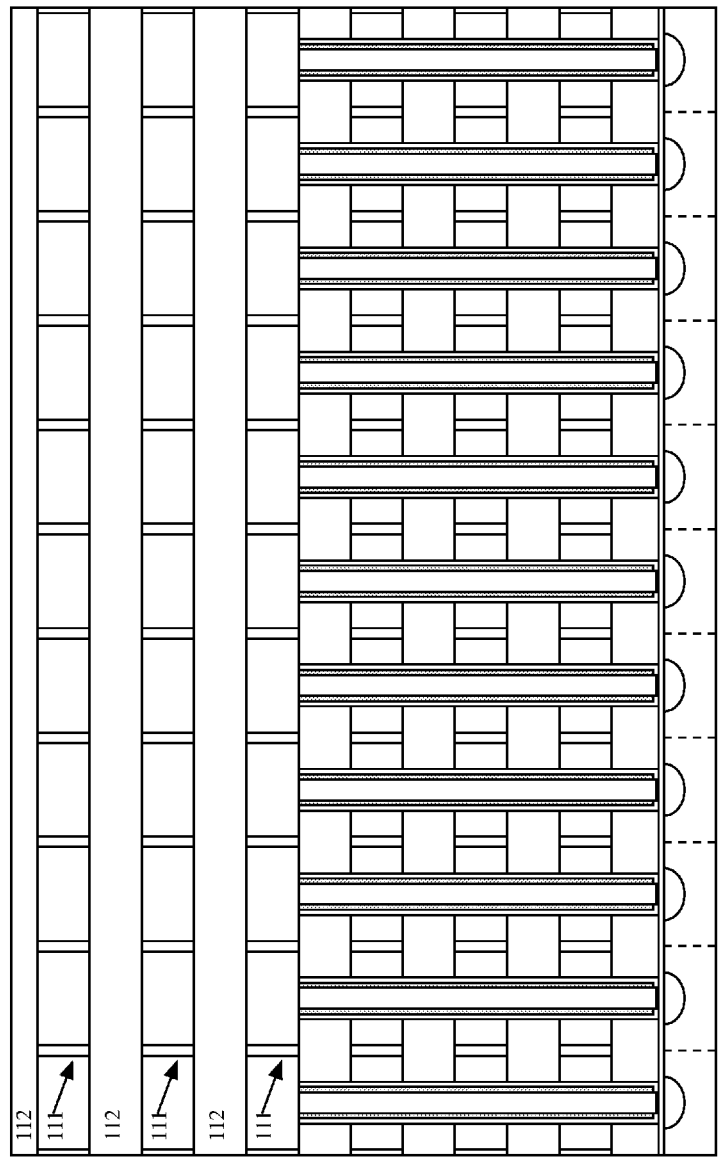
Figure 19I:
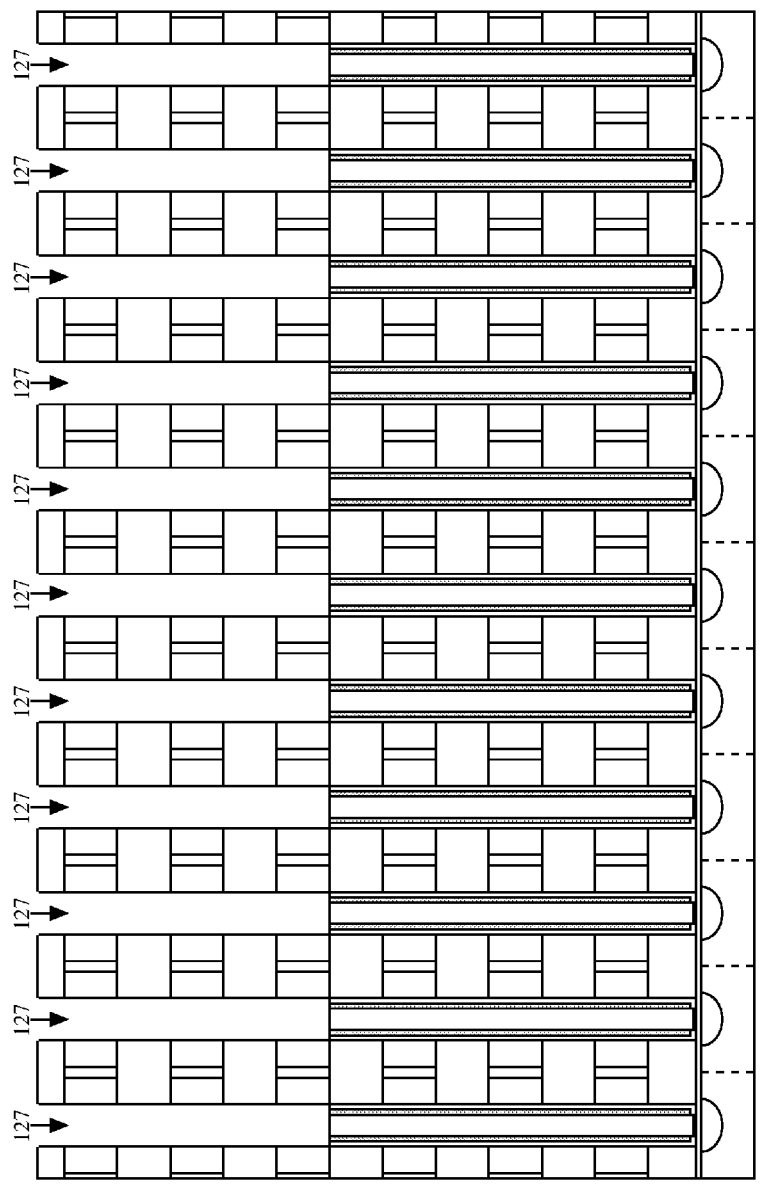
Figure 19J:
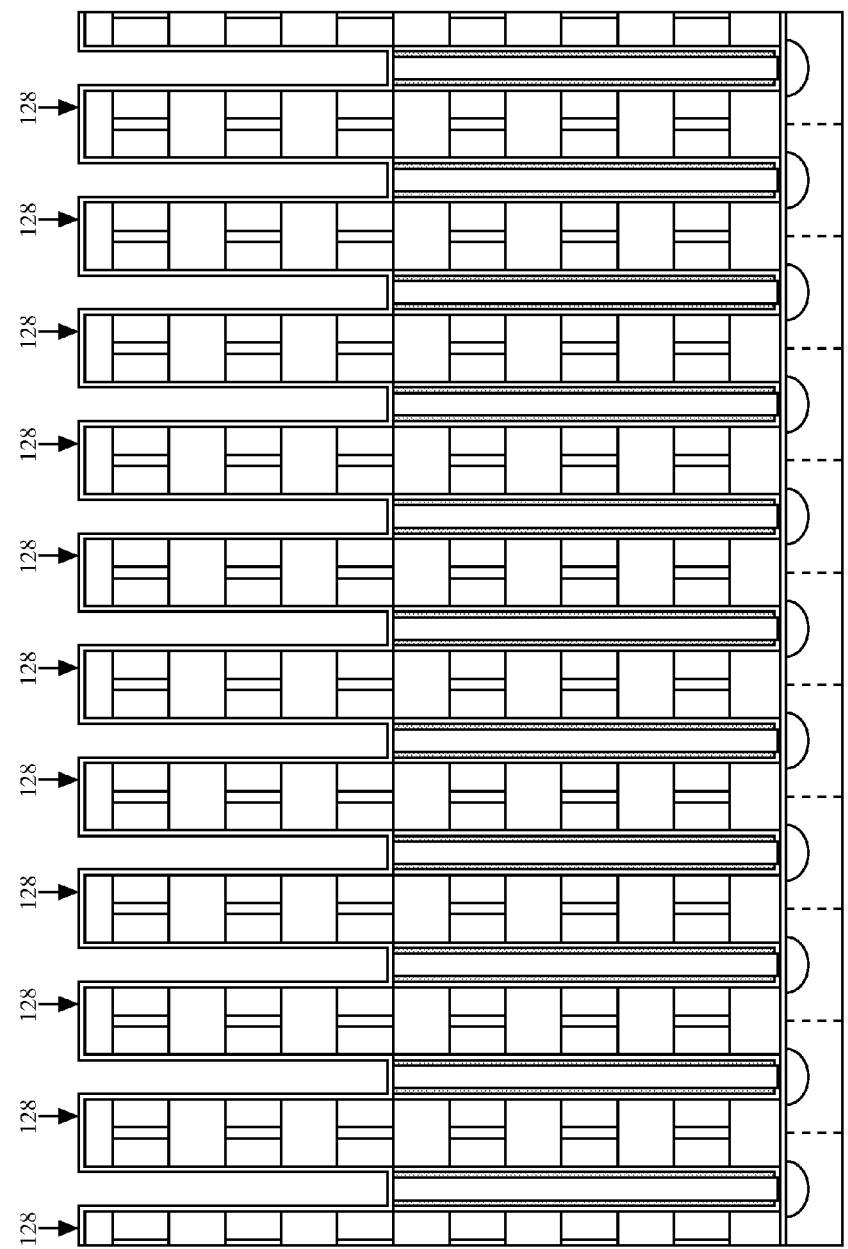
Figure 19K:
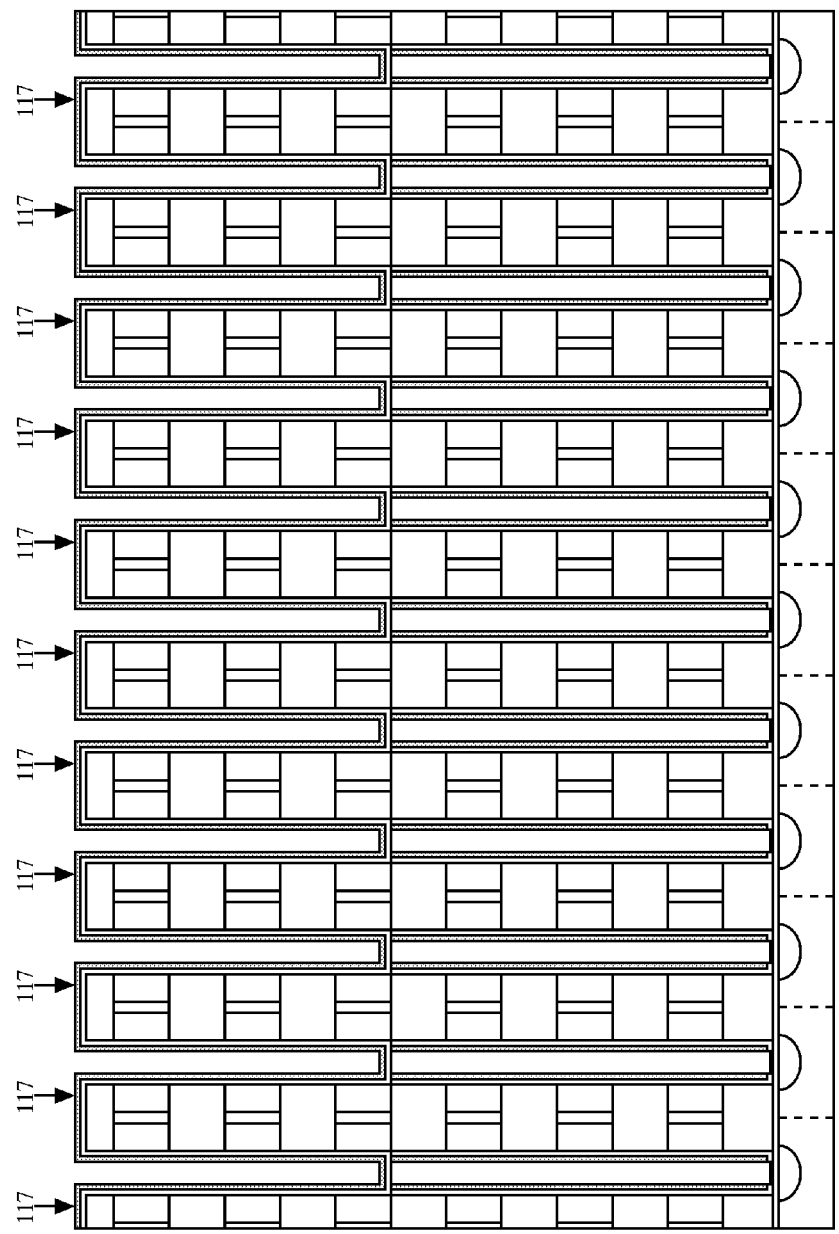
Figure 19L:
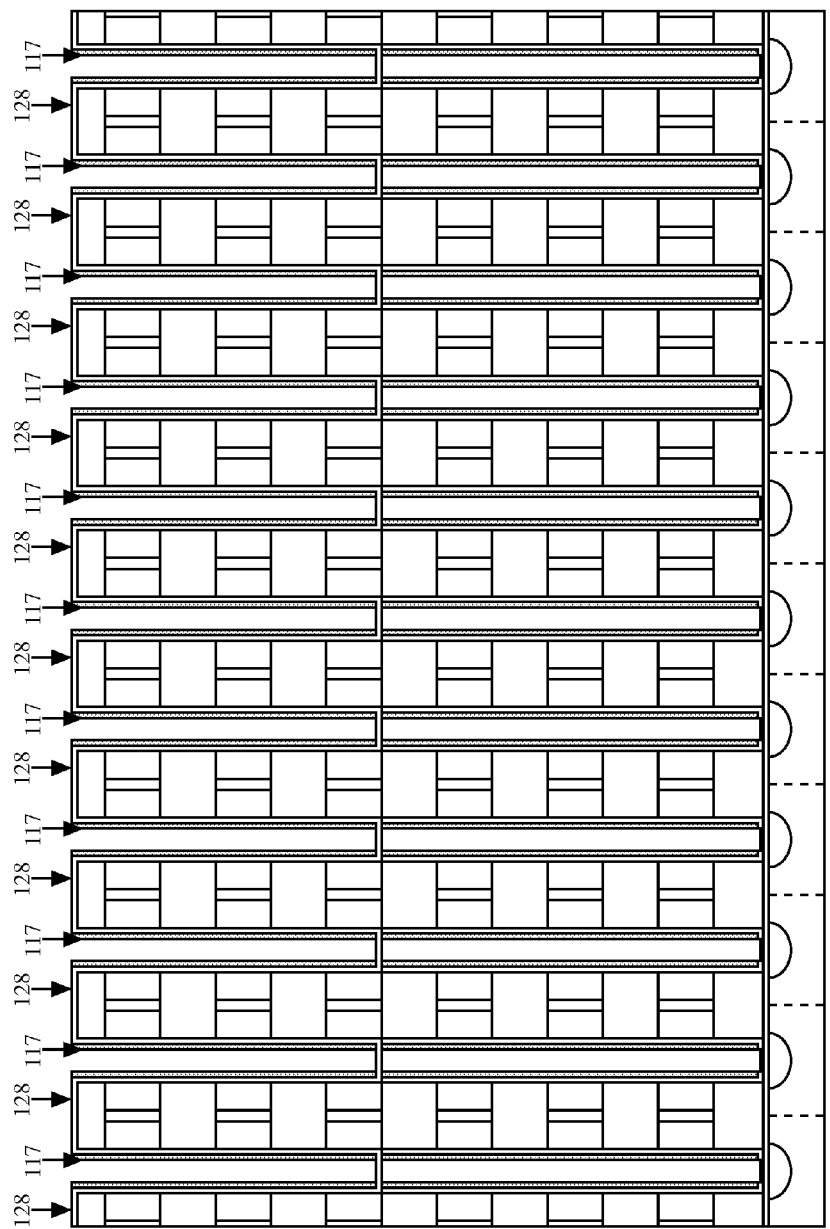
Figure 19M:
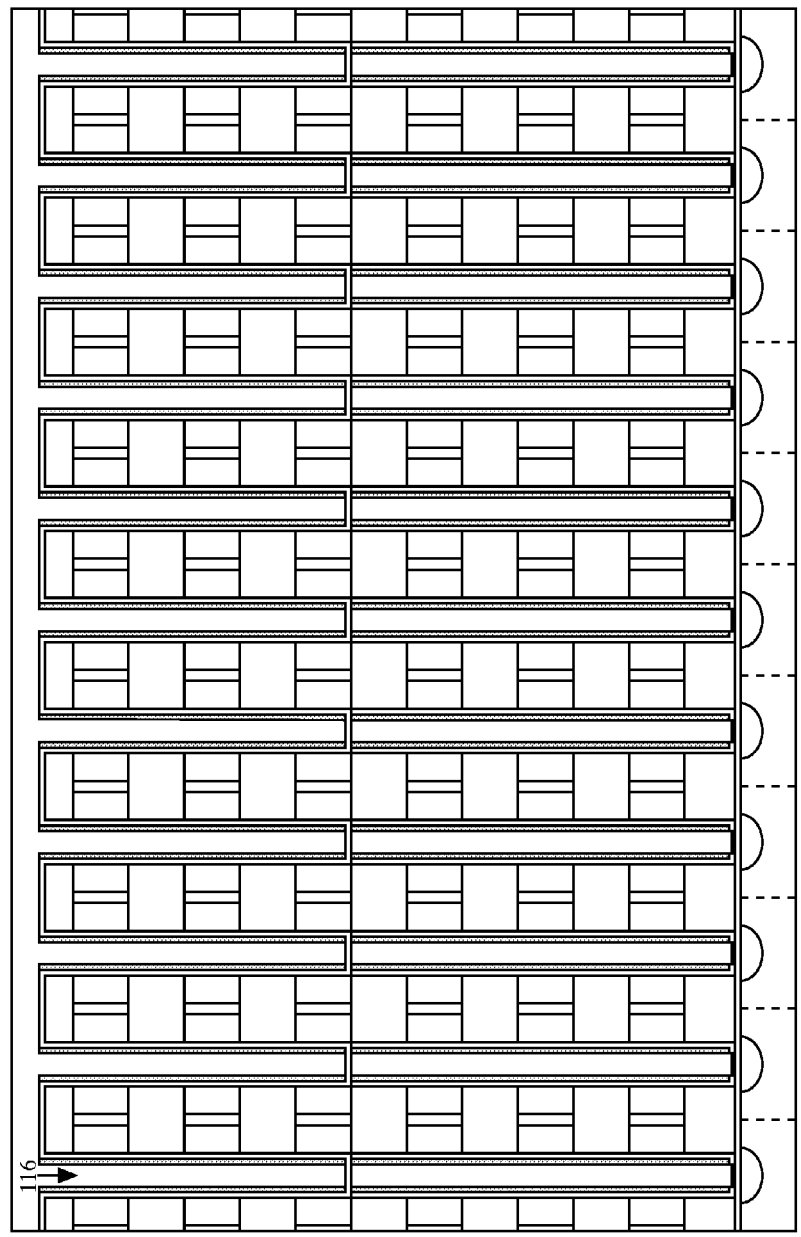
Figure 19N:
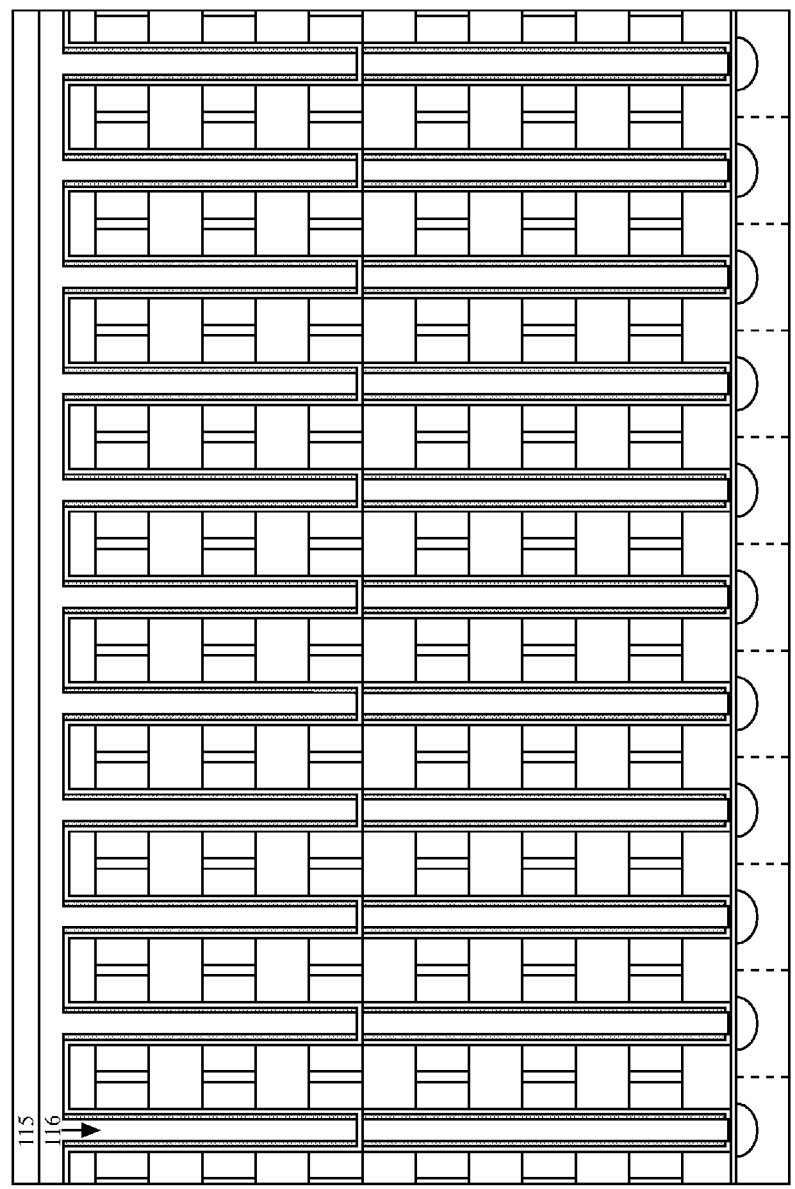
Figure 19O:
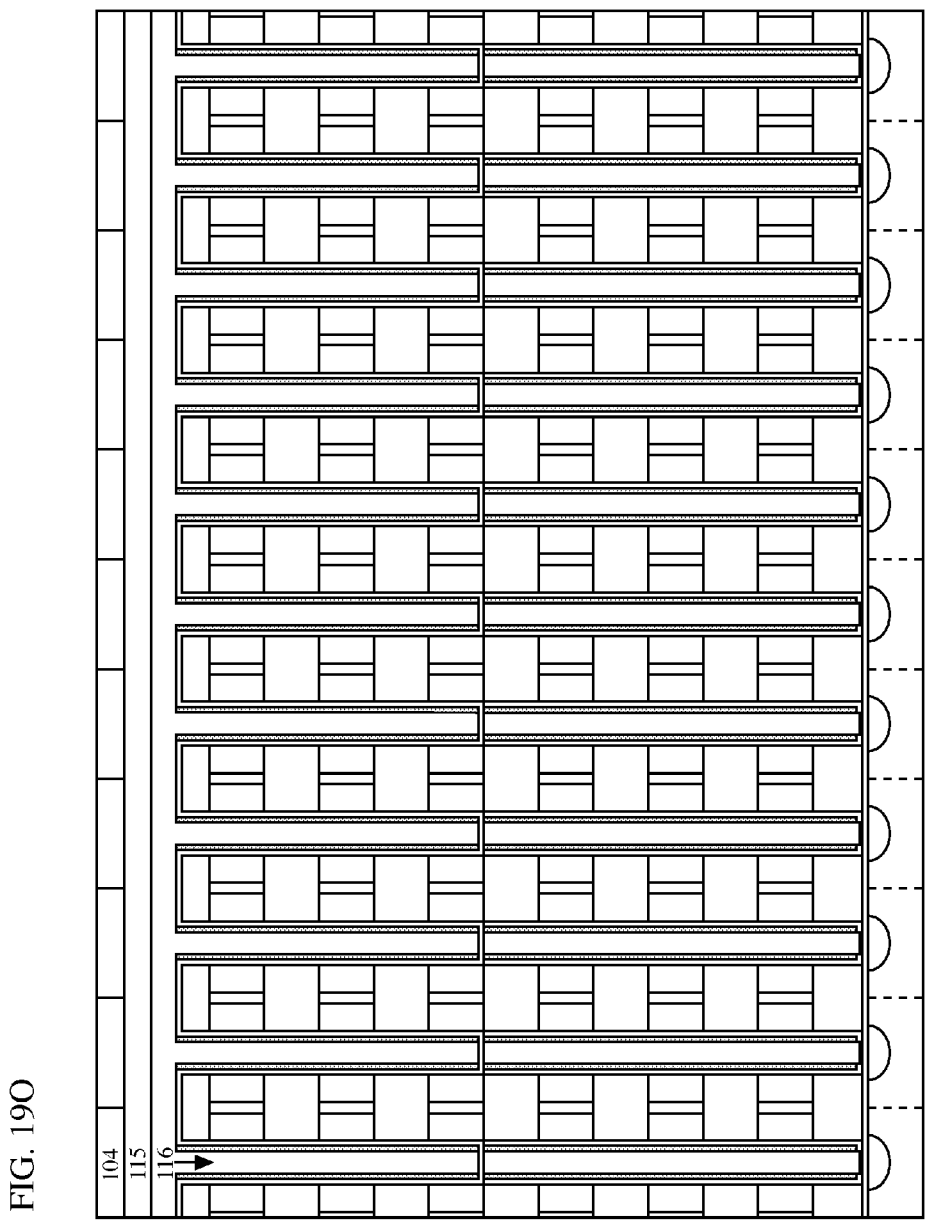
Figure 19P:
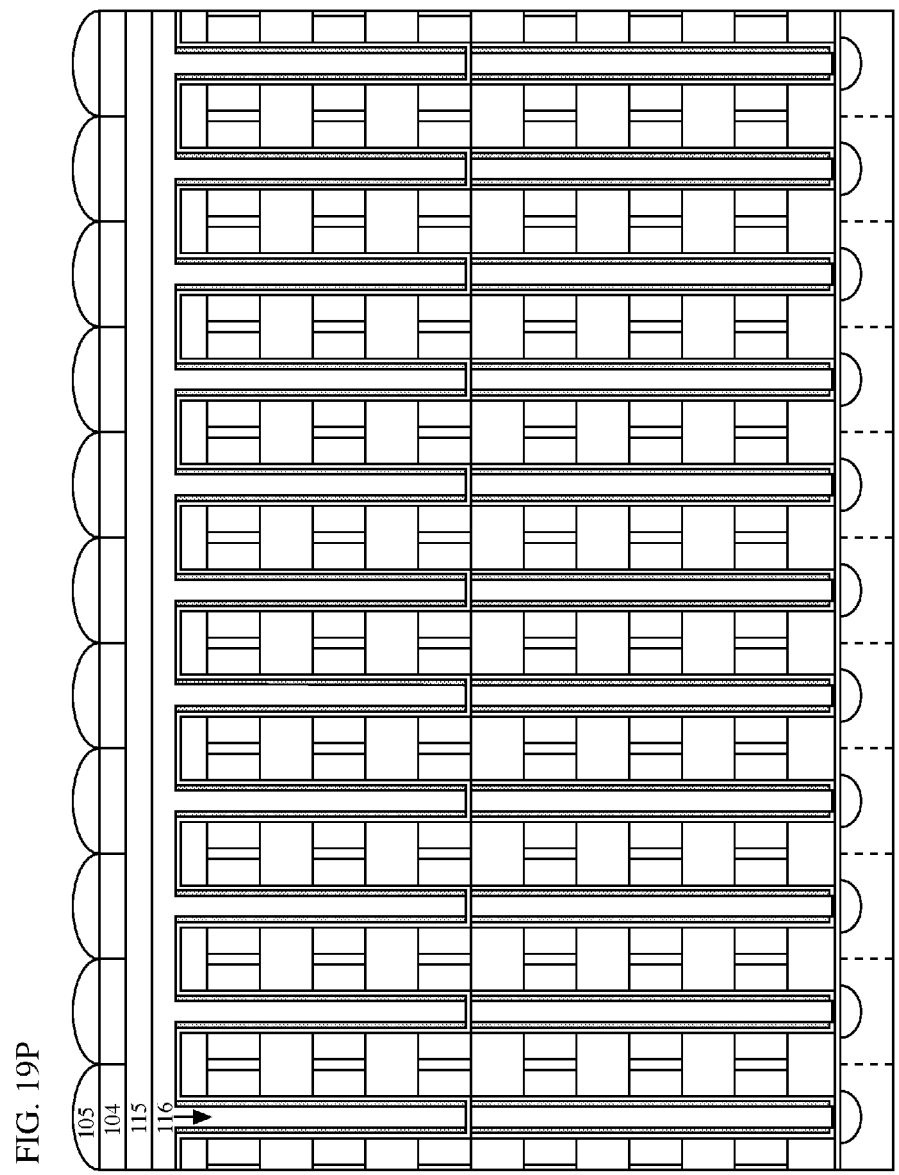

FIGS. 19A to 19P, show the sequence of process steps describing the fabrication flow of one implementation of the present invention, in which the Light-Tunnels are made of dielectric films, have side wall reflectors, and are made in two stages.

Figure 20A:
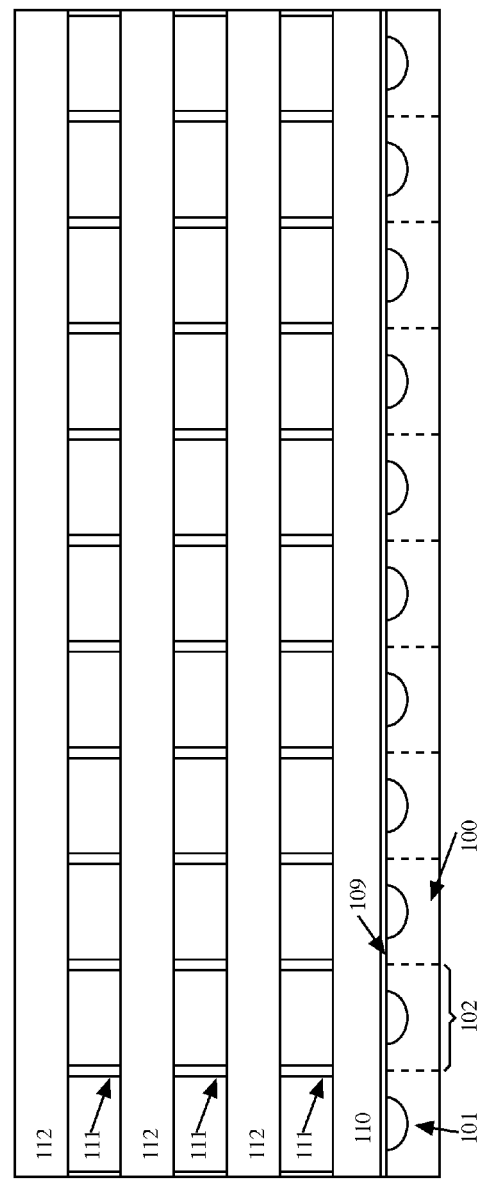
Figure 20B:
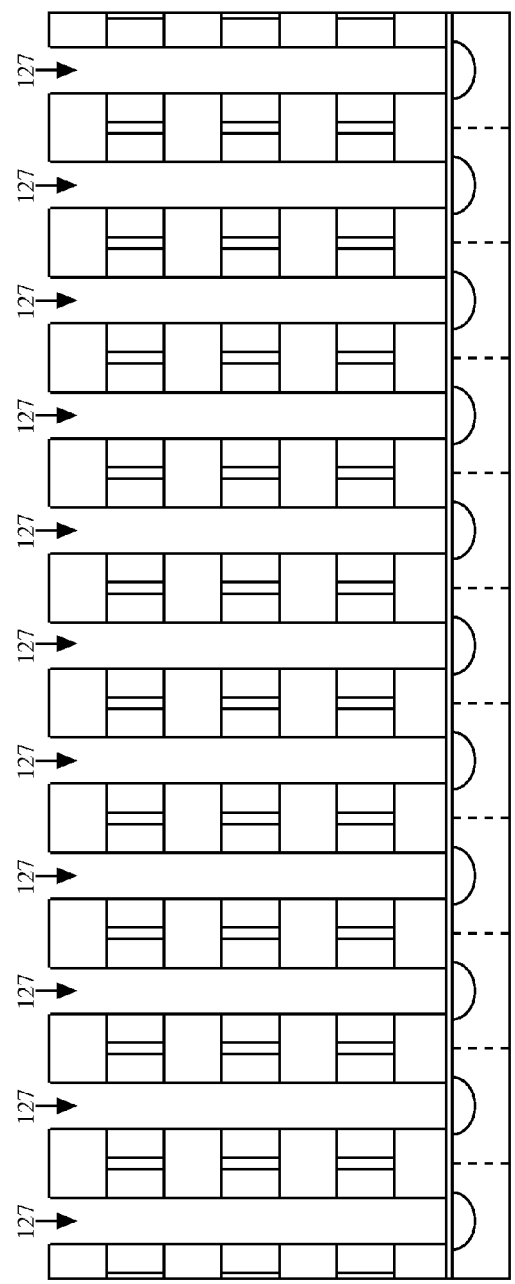
Figure 20C:
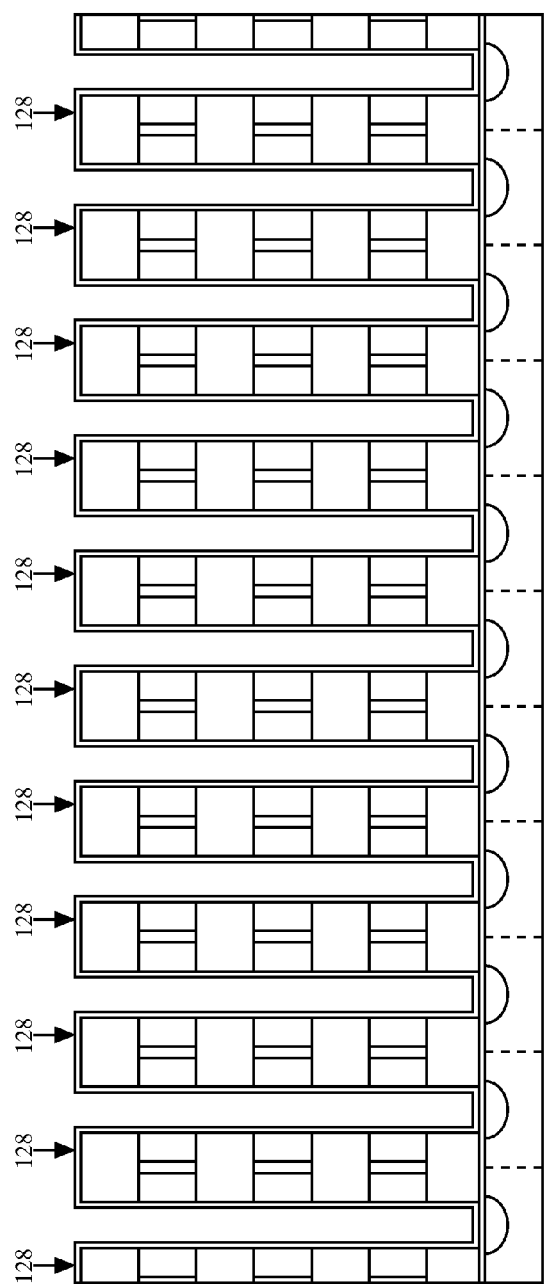
Figure 20D:
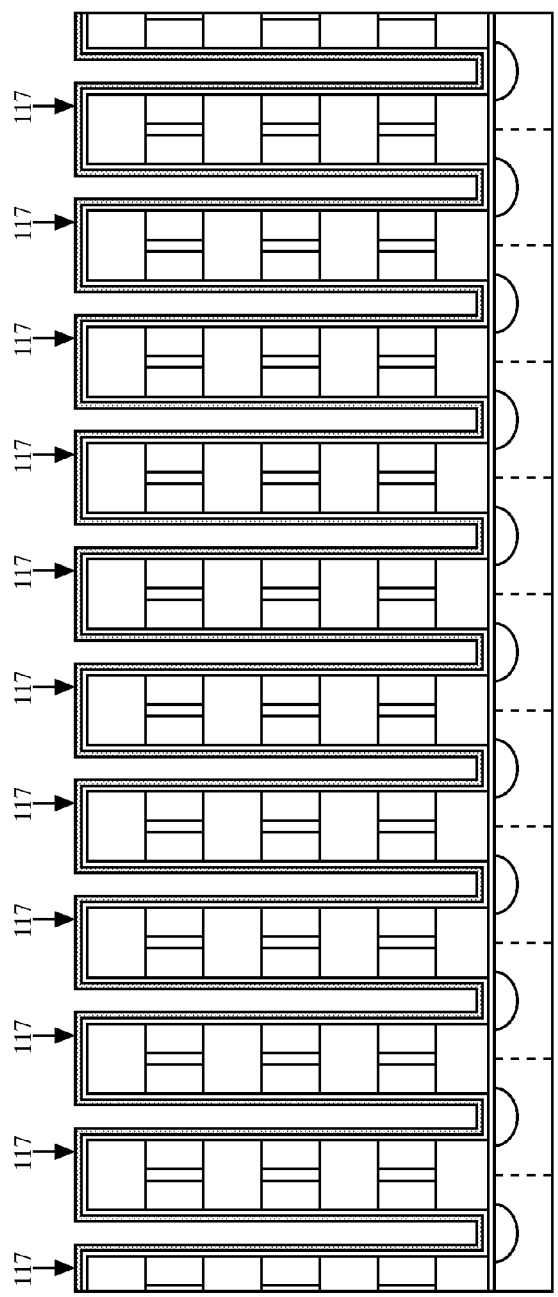
Figure 20E:
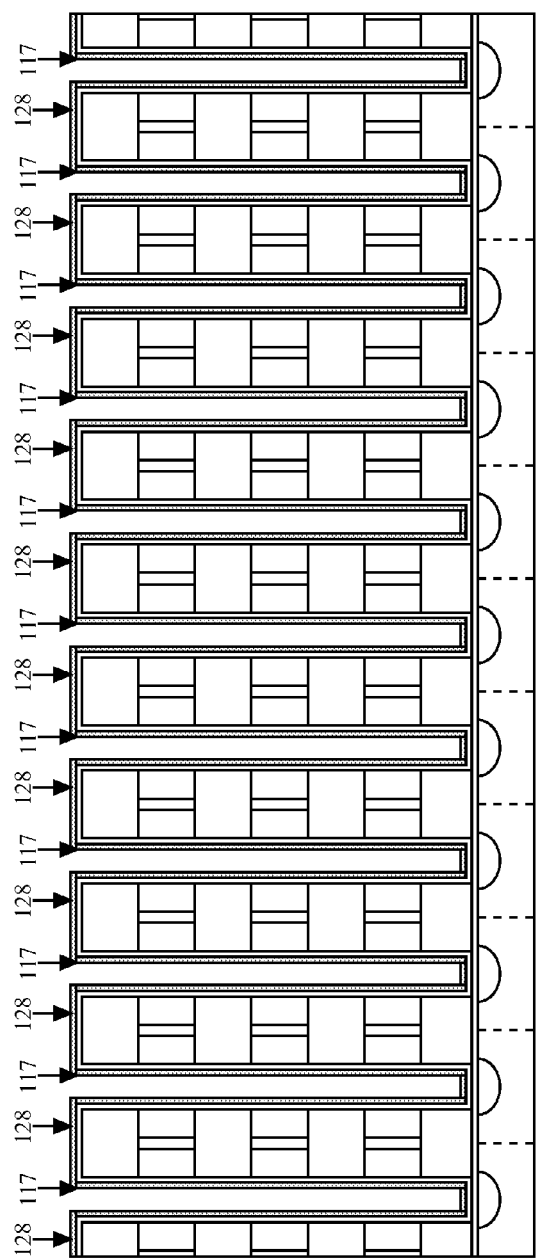
Figure 20F:
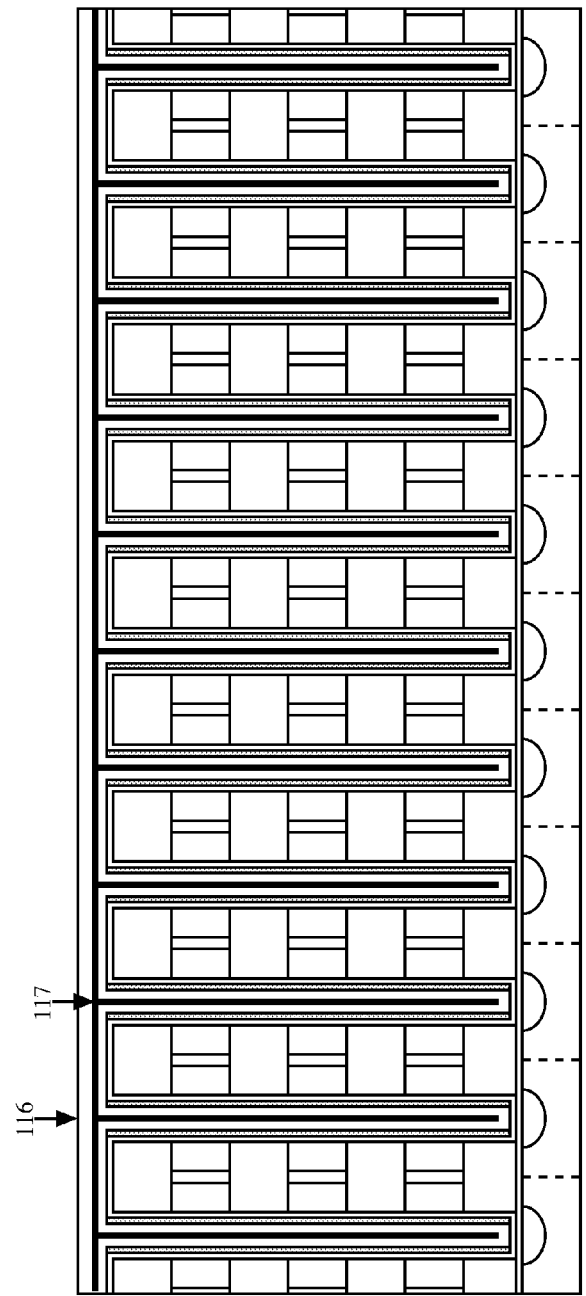
Figure 20G:
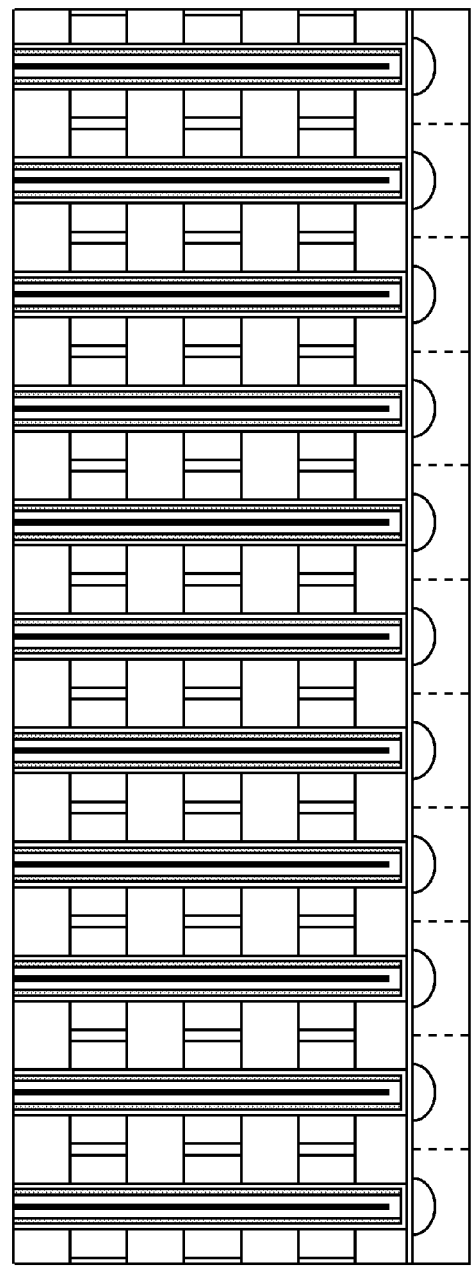
Figure 20H:
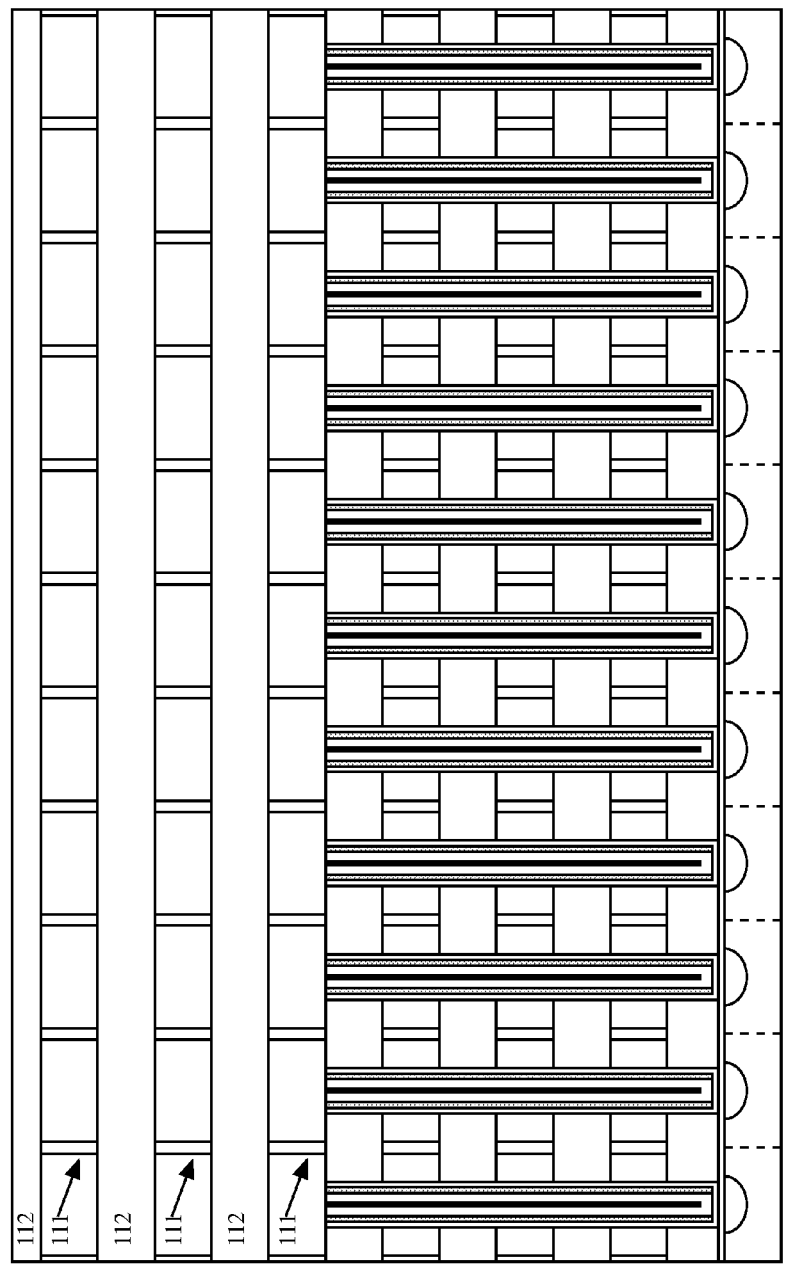
Figure 20I:
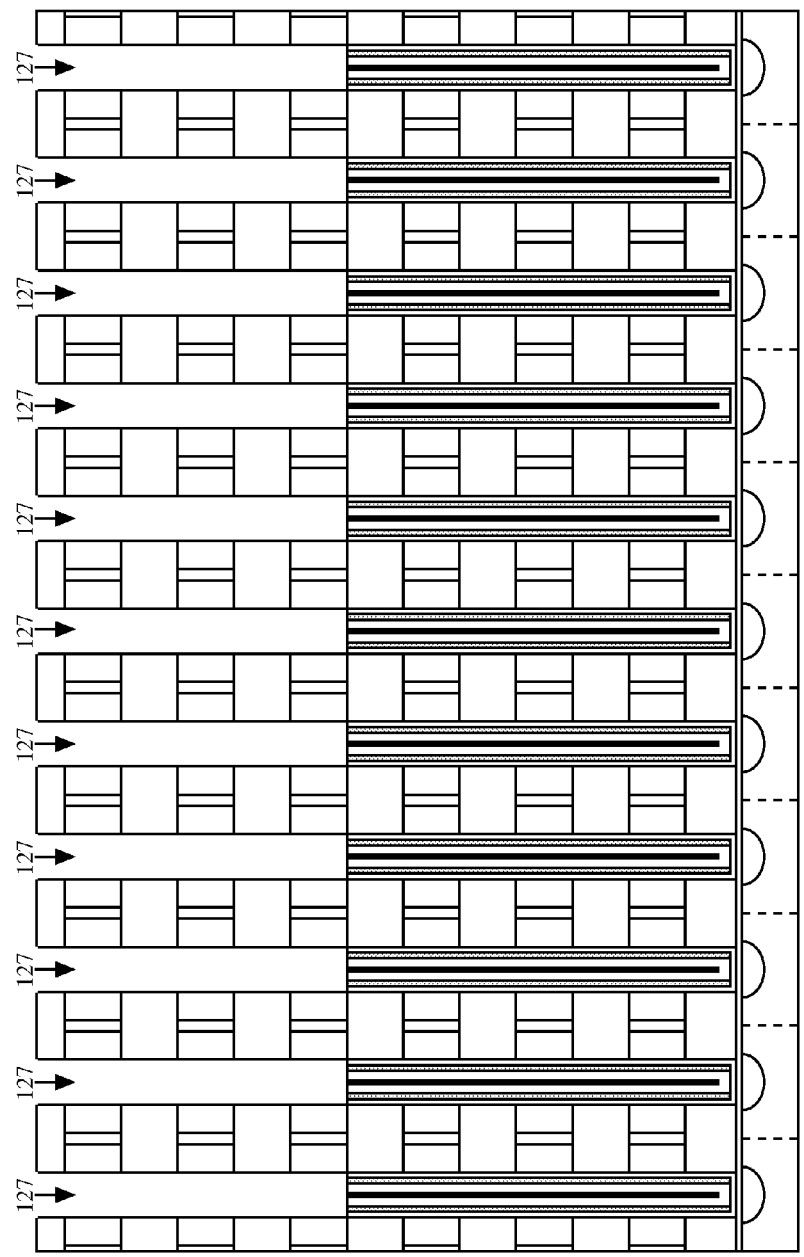
Figure 20J:
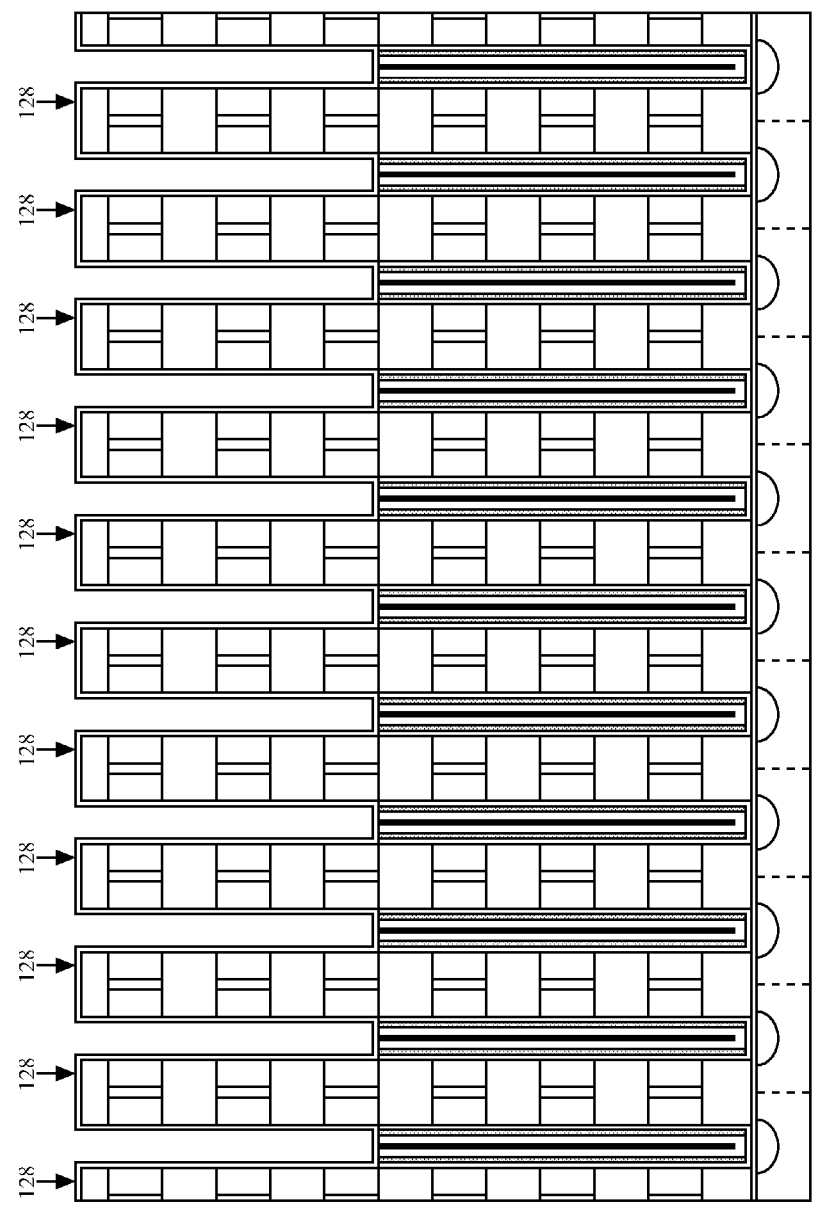
Figure 20L:
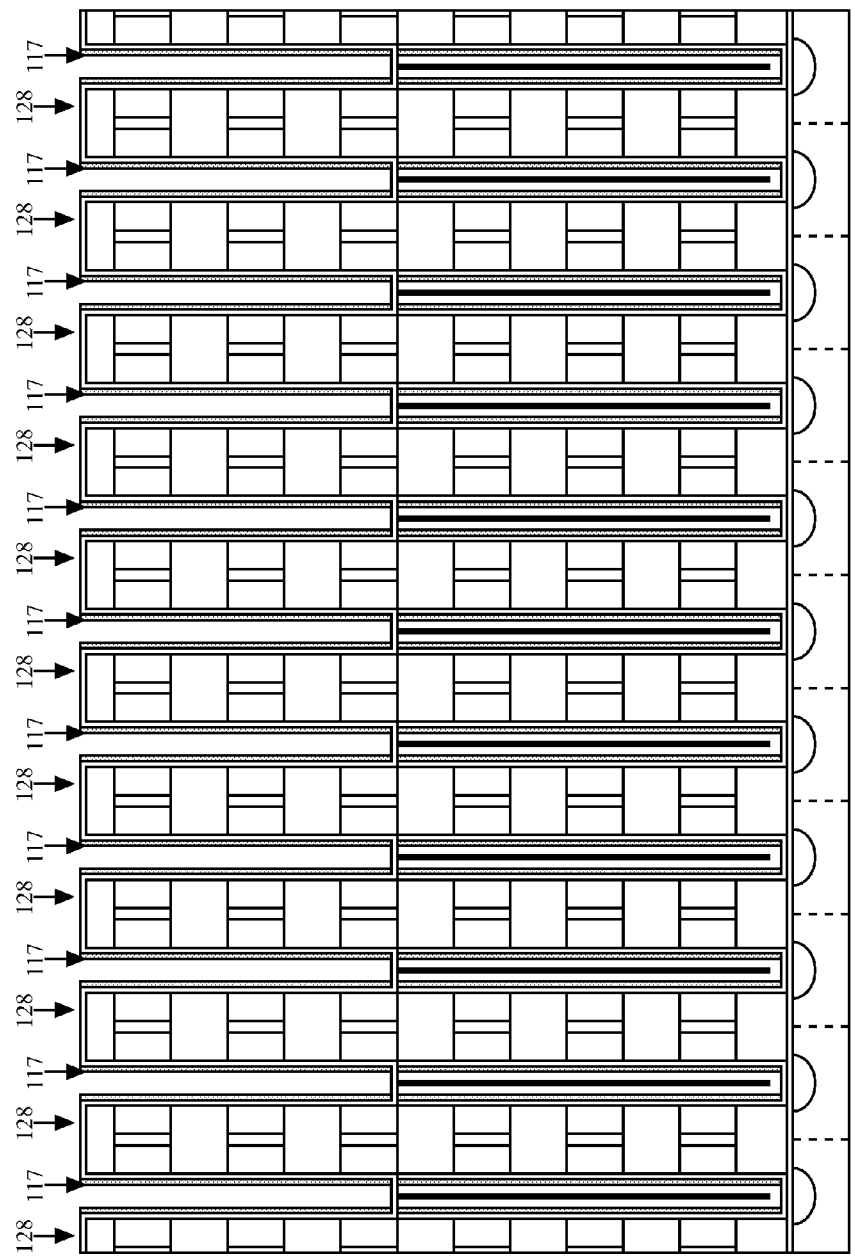
Figure 20M:
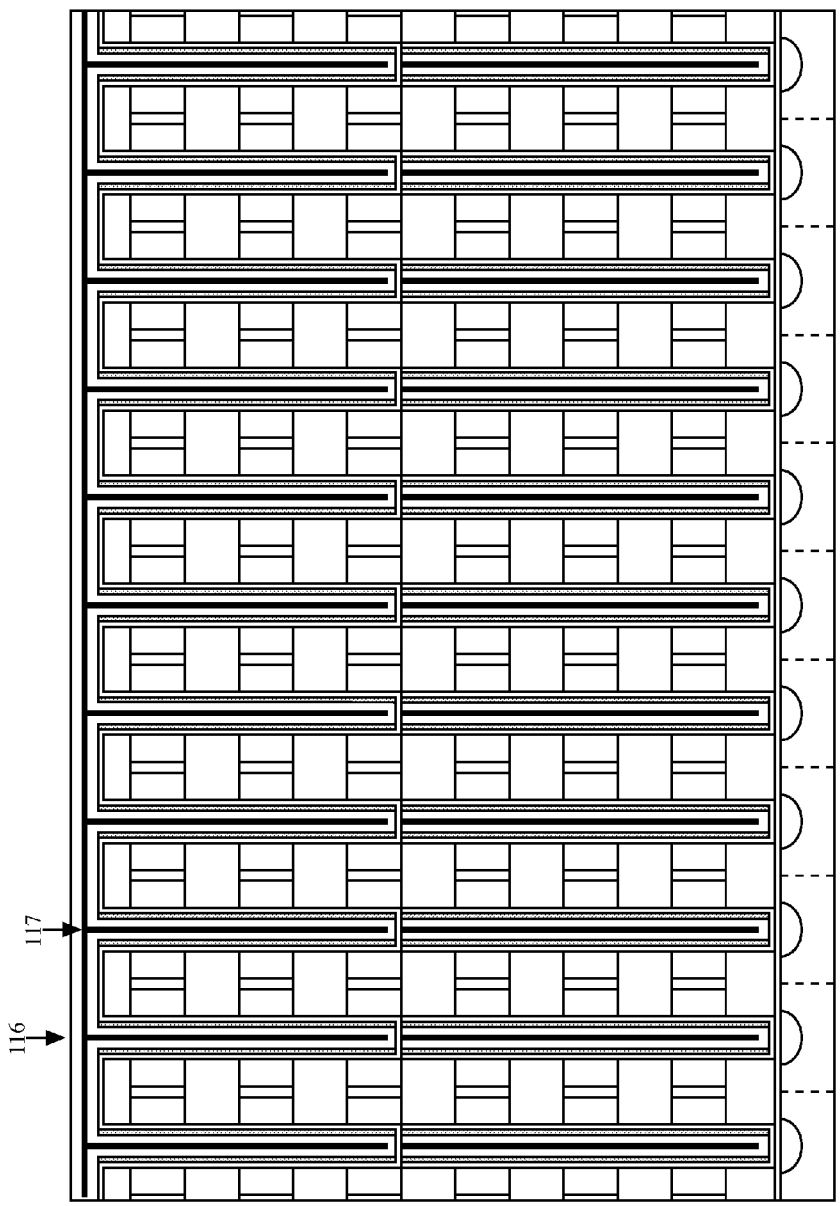
Figure 20N:
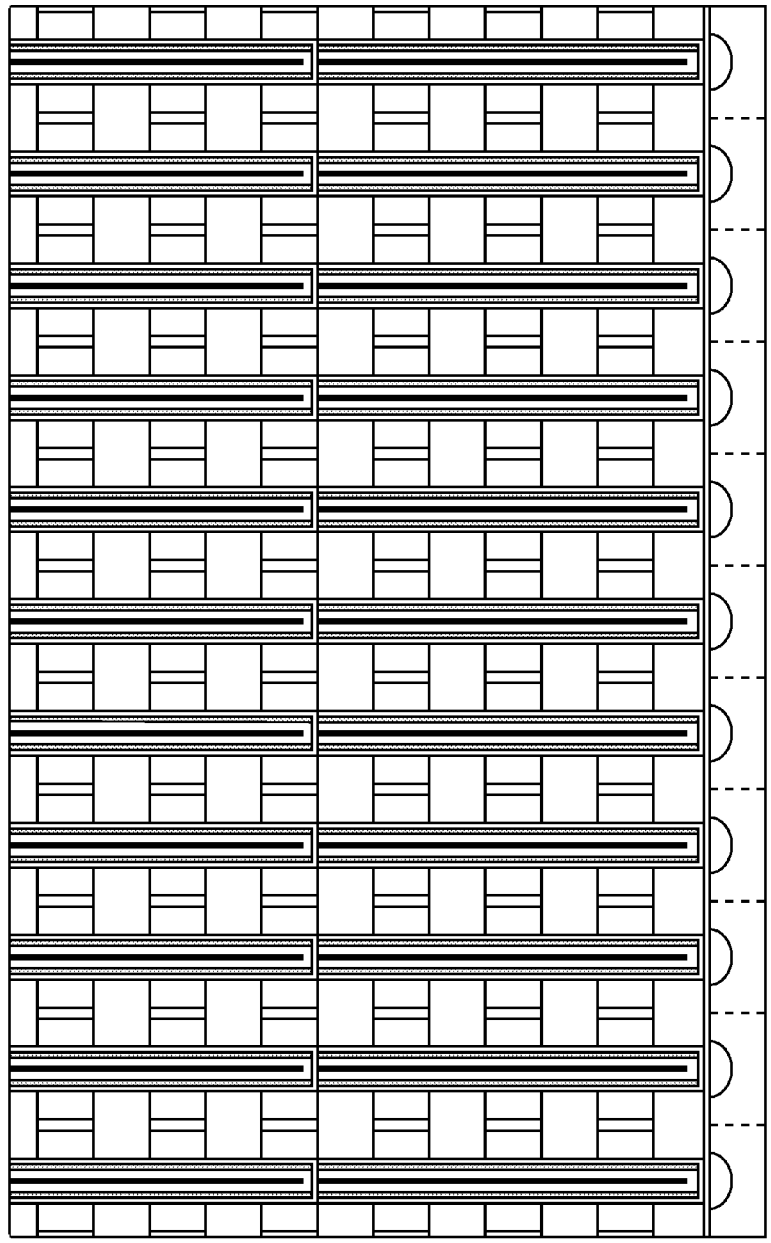
Figure 20O:
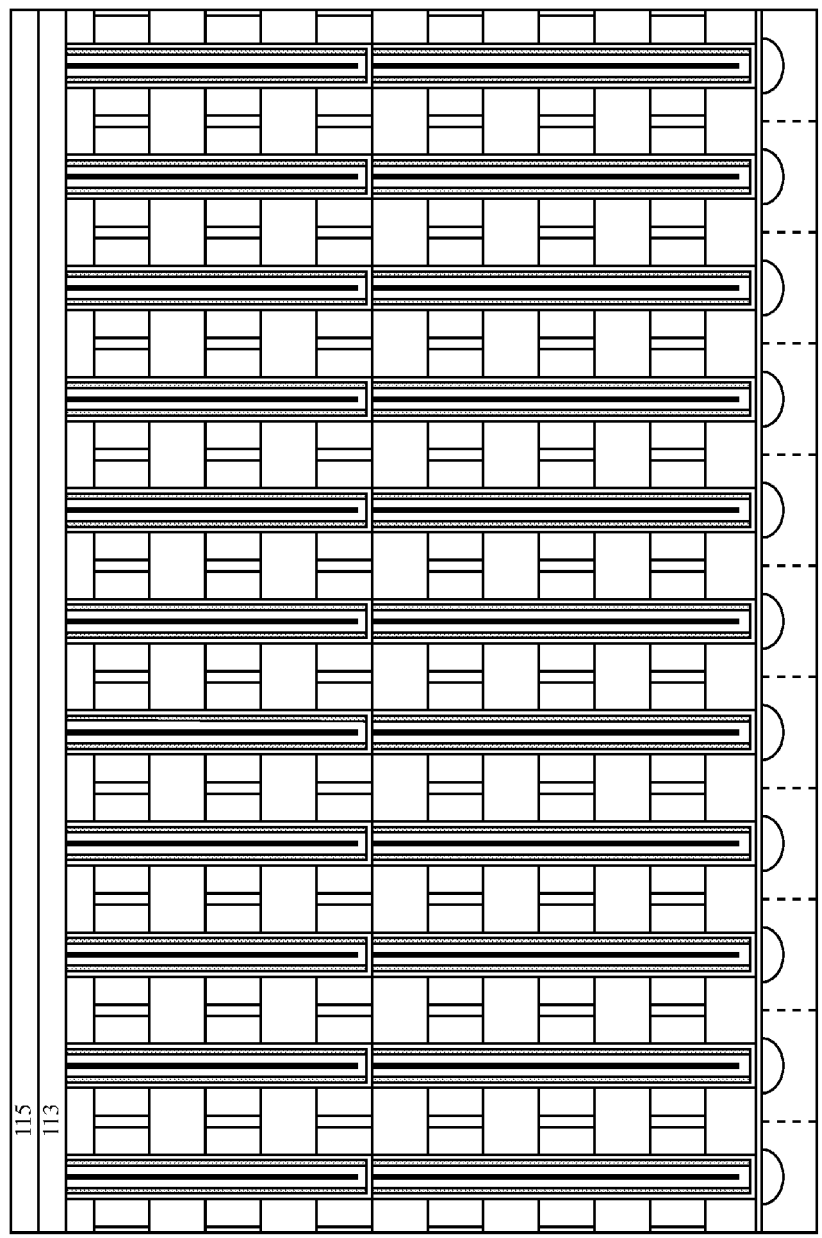
Figure 20P:
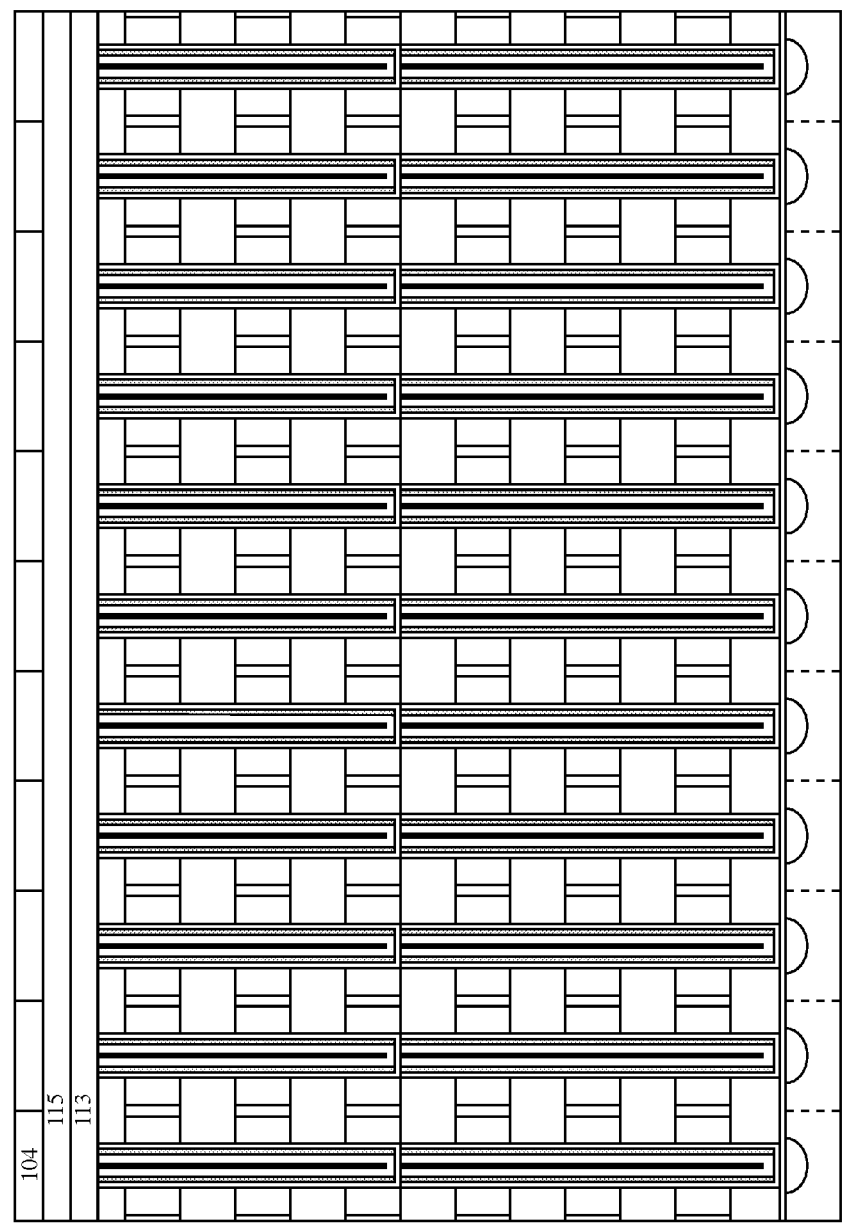
Figure 20Q:
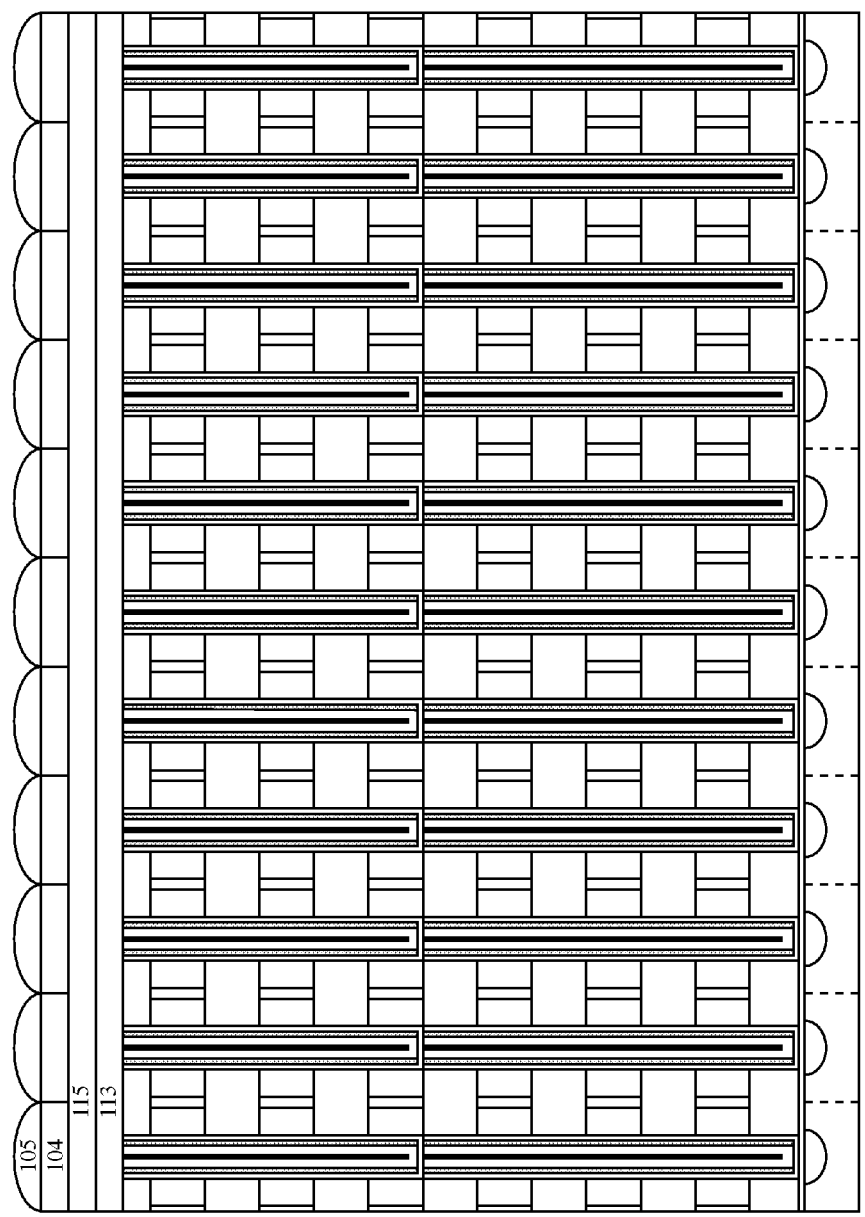

FIGS. 20A to 20Q, show the sequence of process steps describing the fabrication flow of one implementation of the present invention, in which the Light-Tunnels are made of dielectric films, have side wall reflectors, have a metal column at the center, and are made in two stages.

Figure 21A:
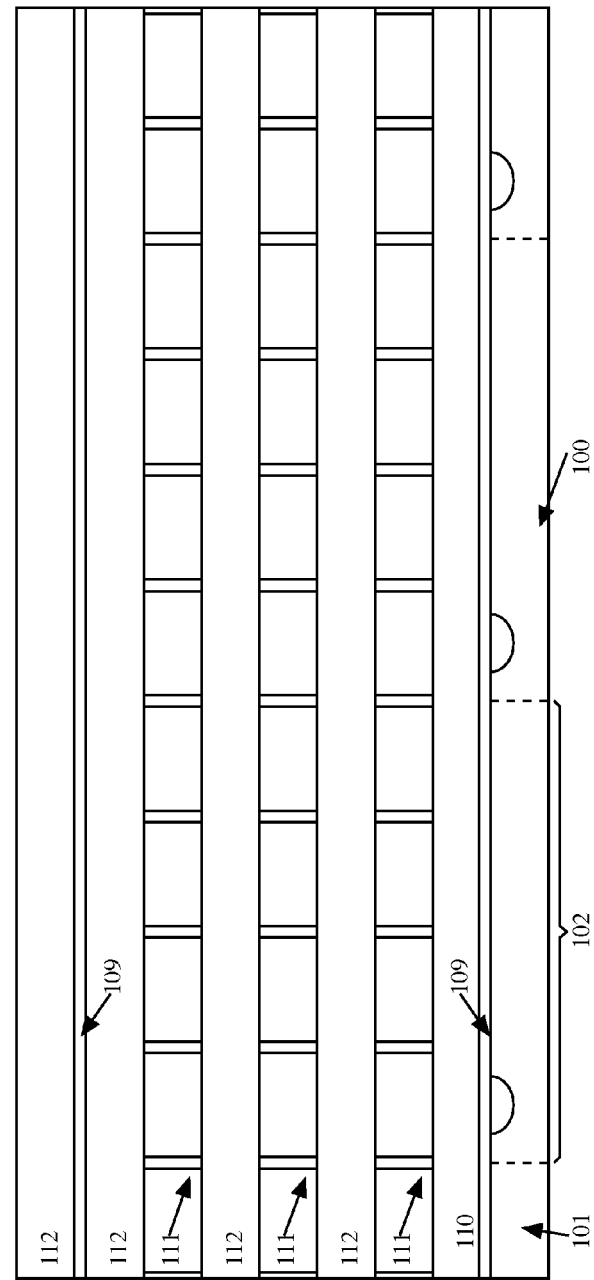
Figure 21B:
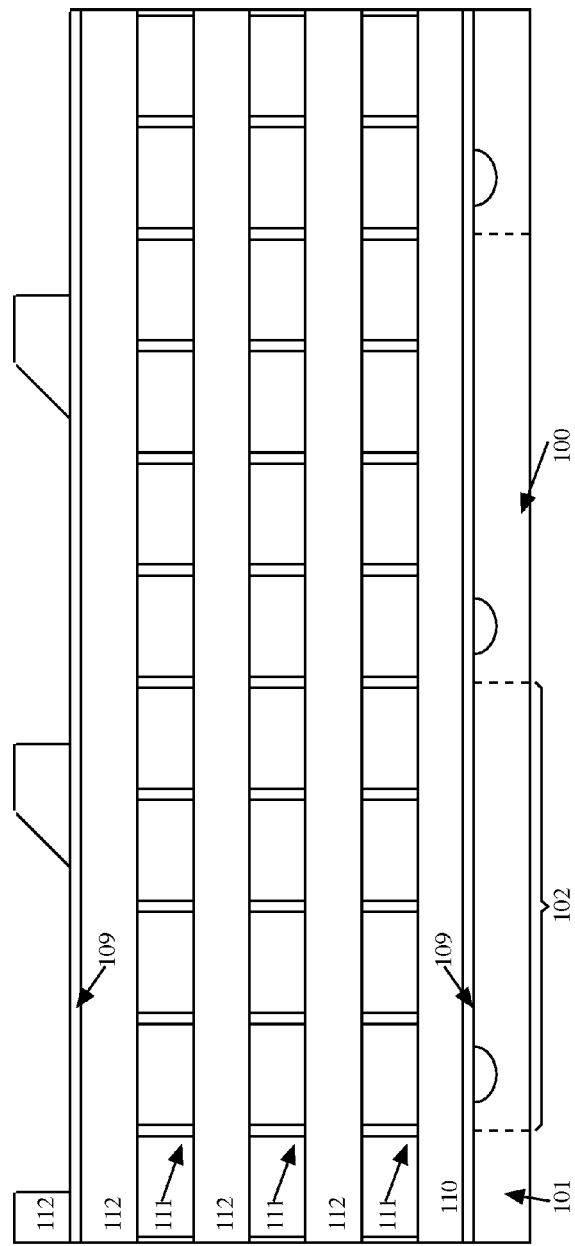
Figure 21C:
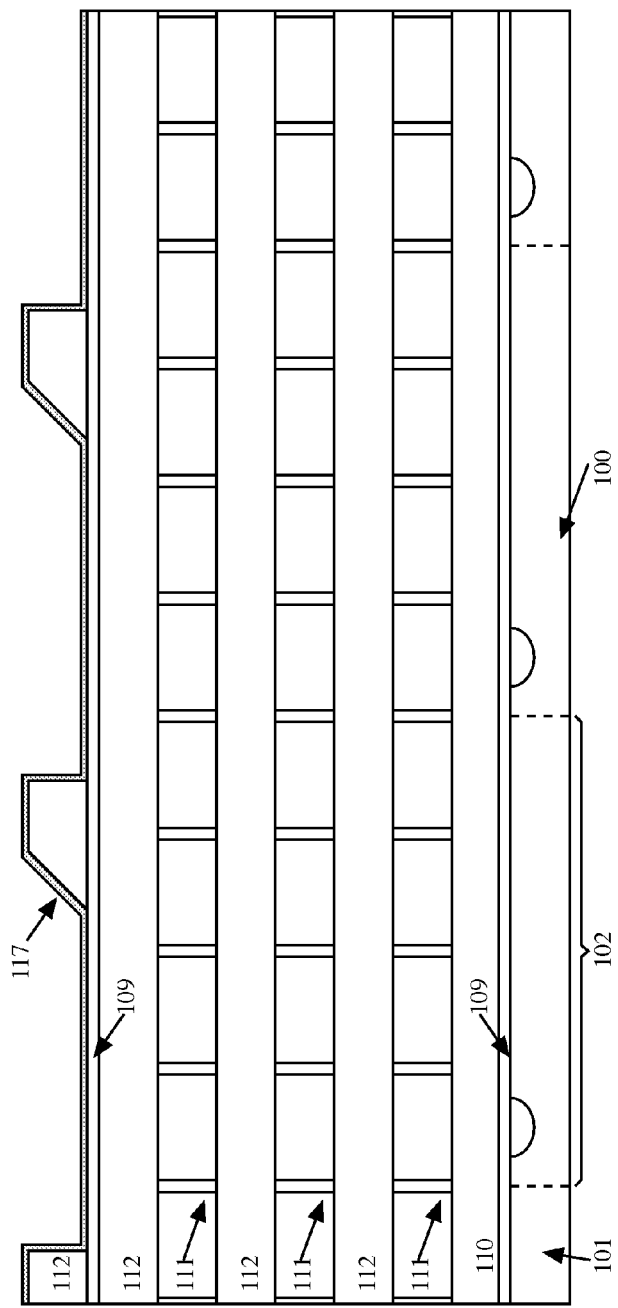
Figure 21D:
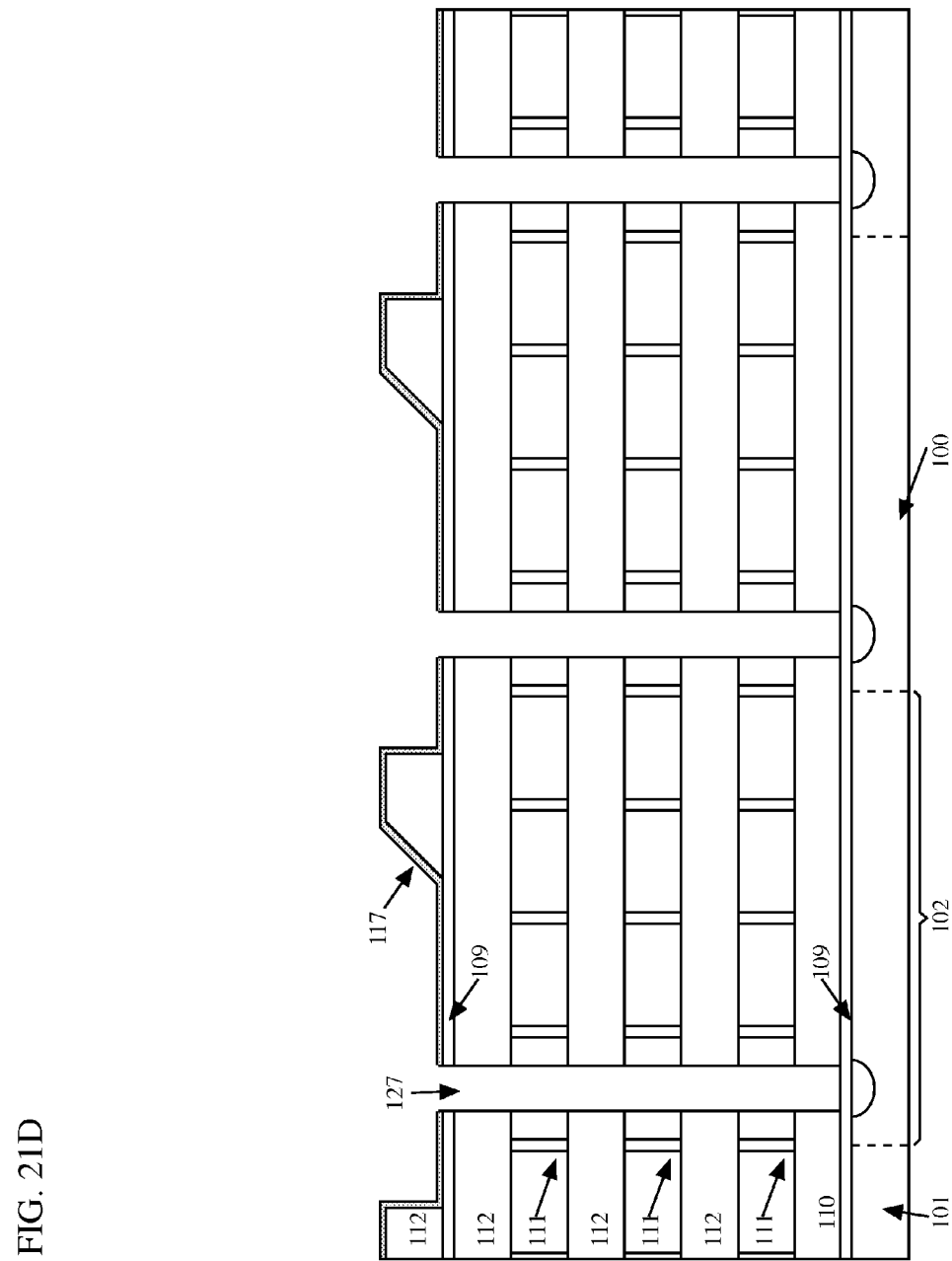
Figure 21E:
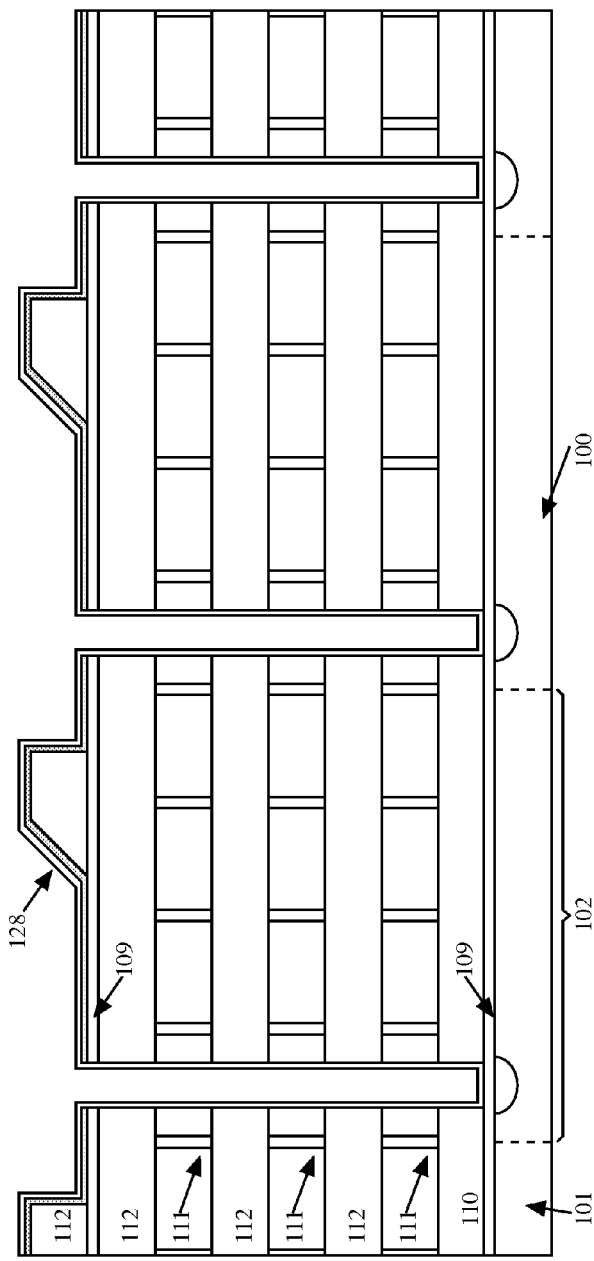
Figure 21F:
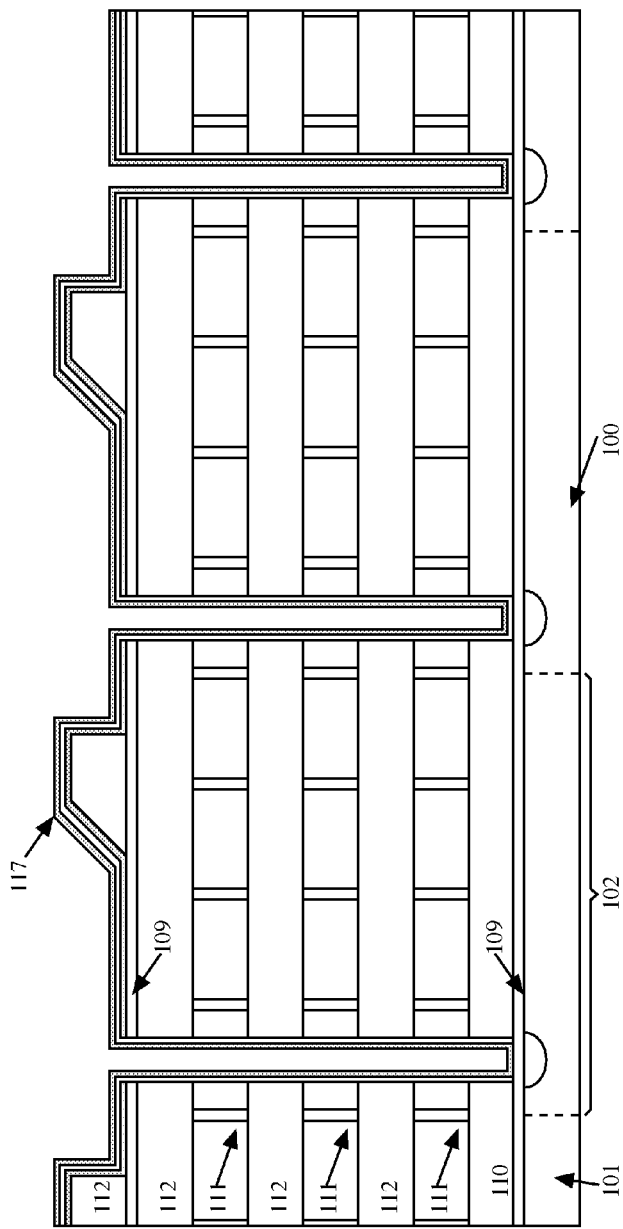
Figure 21G:
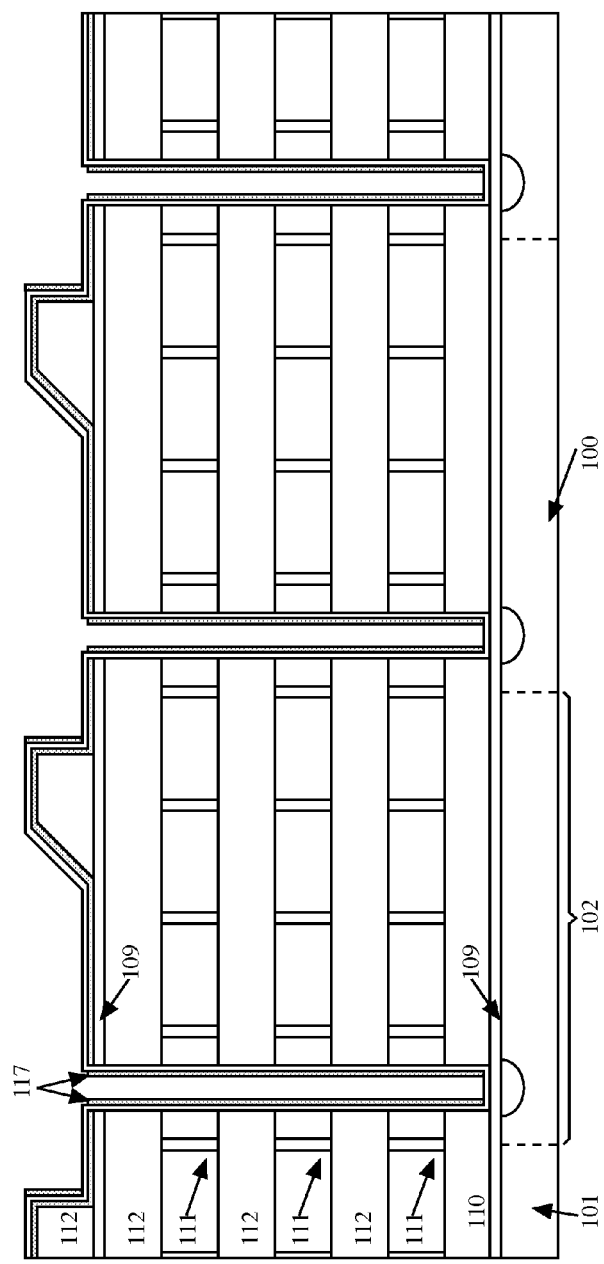
Figure 21H:
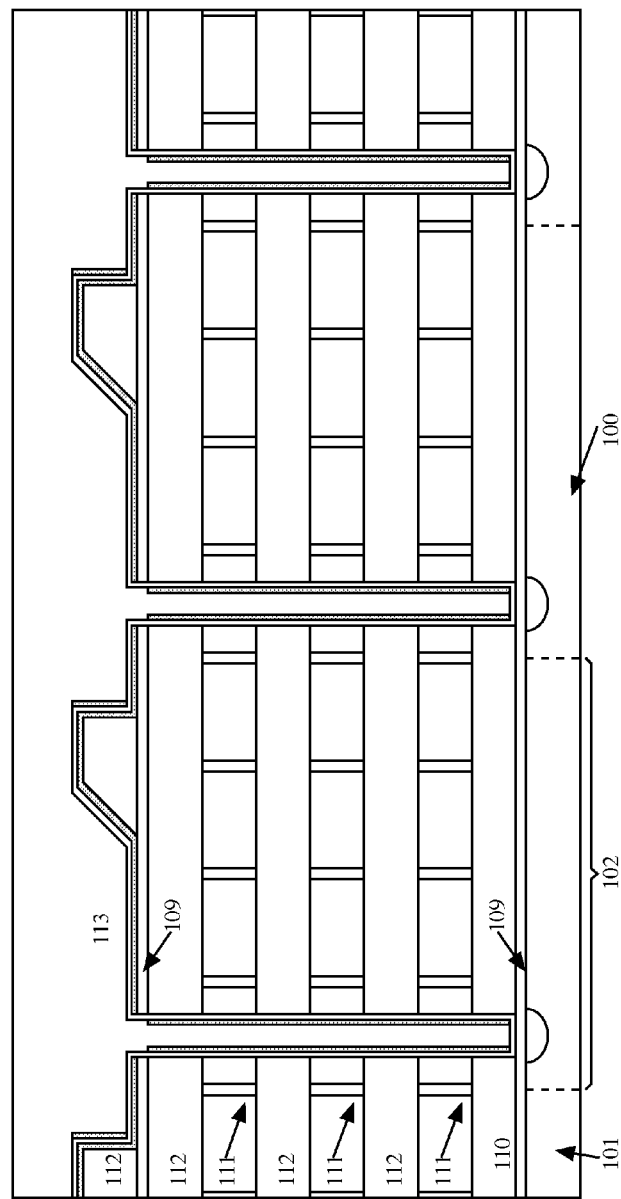
Figure 21I:
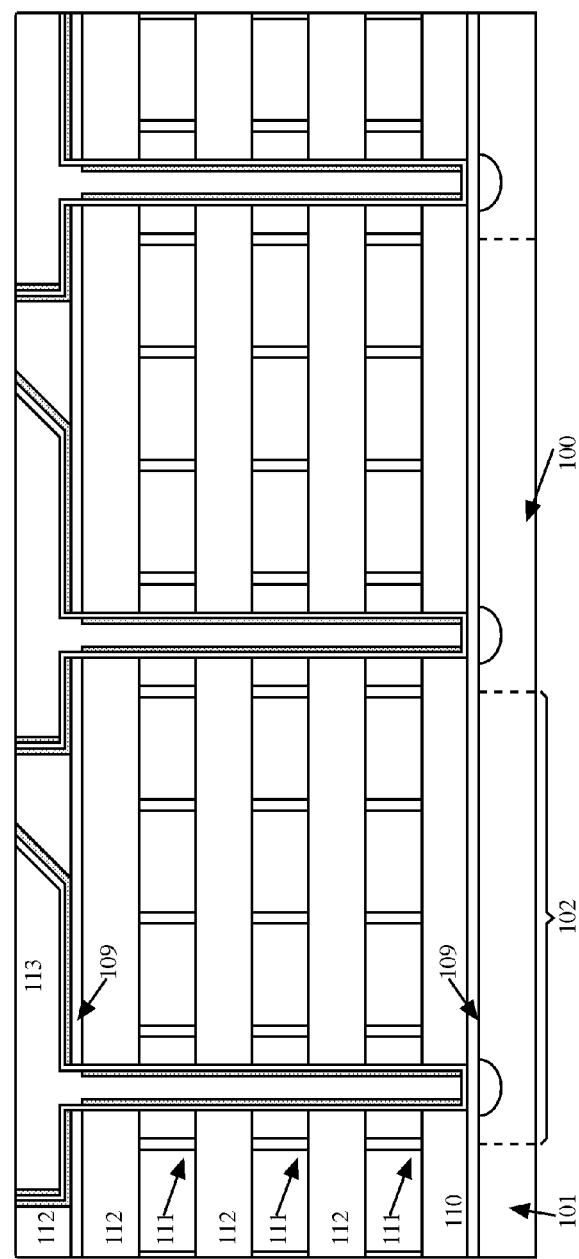
Figure 21J:
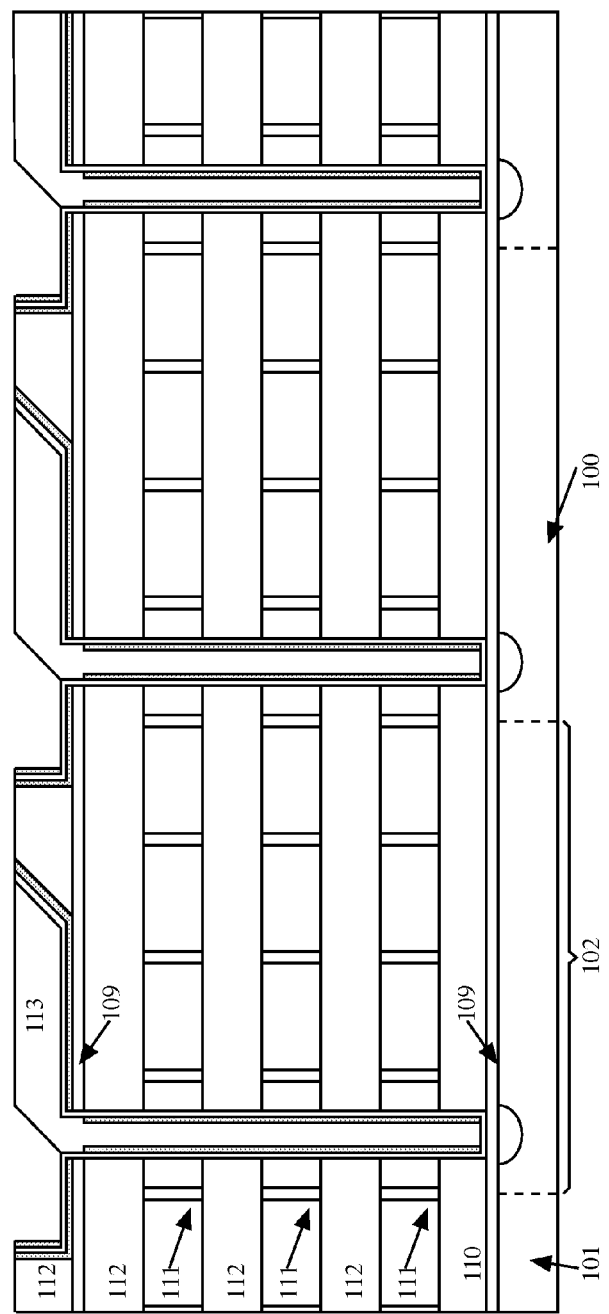
Figure 21K:
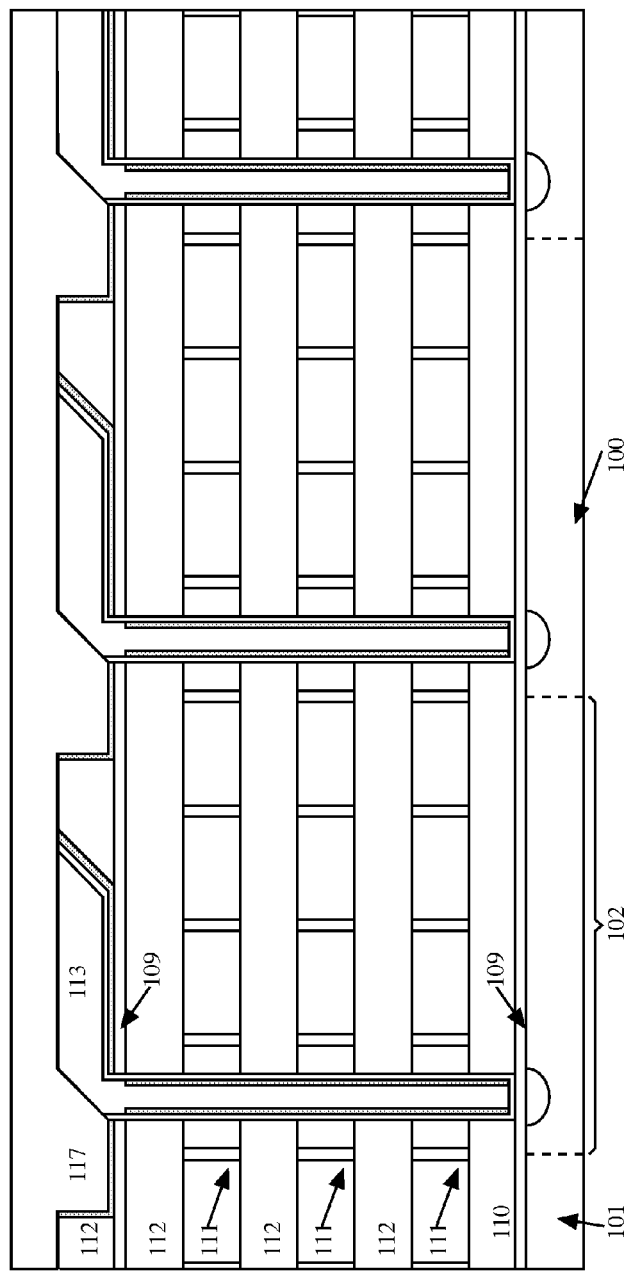
Figure 21L:
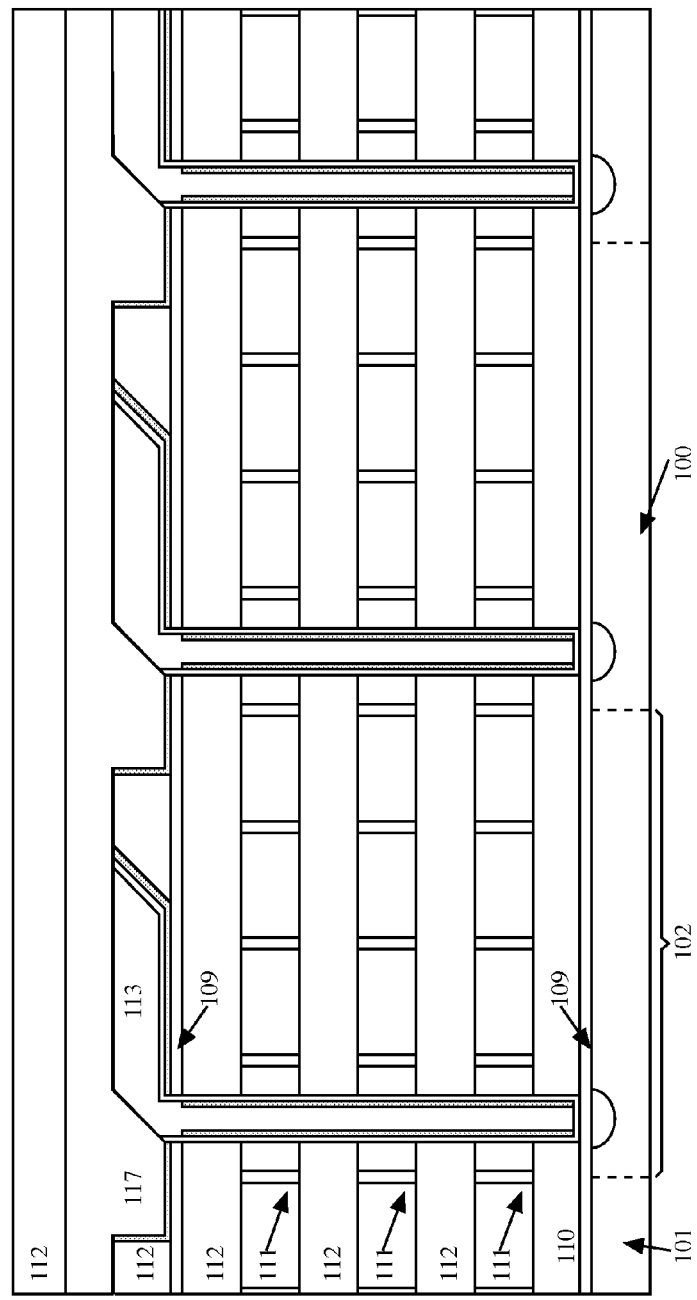
Figure 21M:
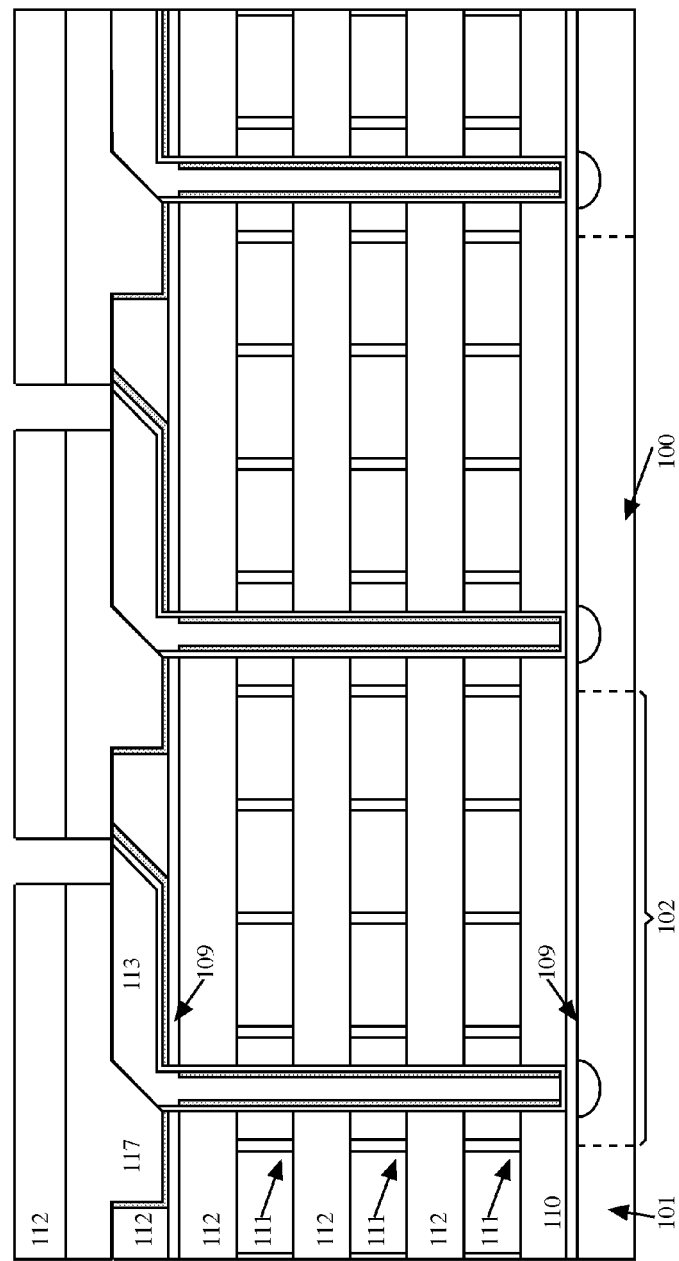
Figure 21N:
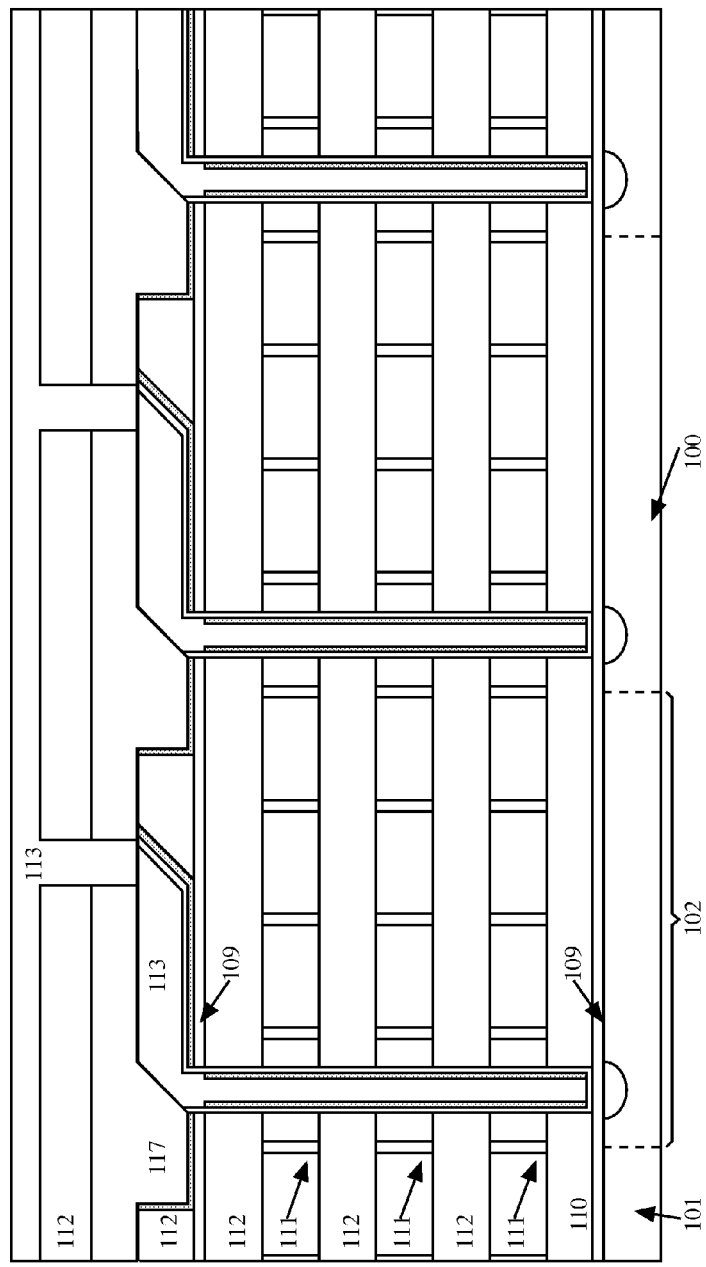
Figure 21O:
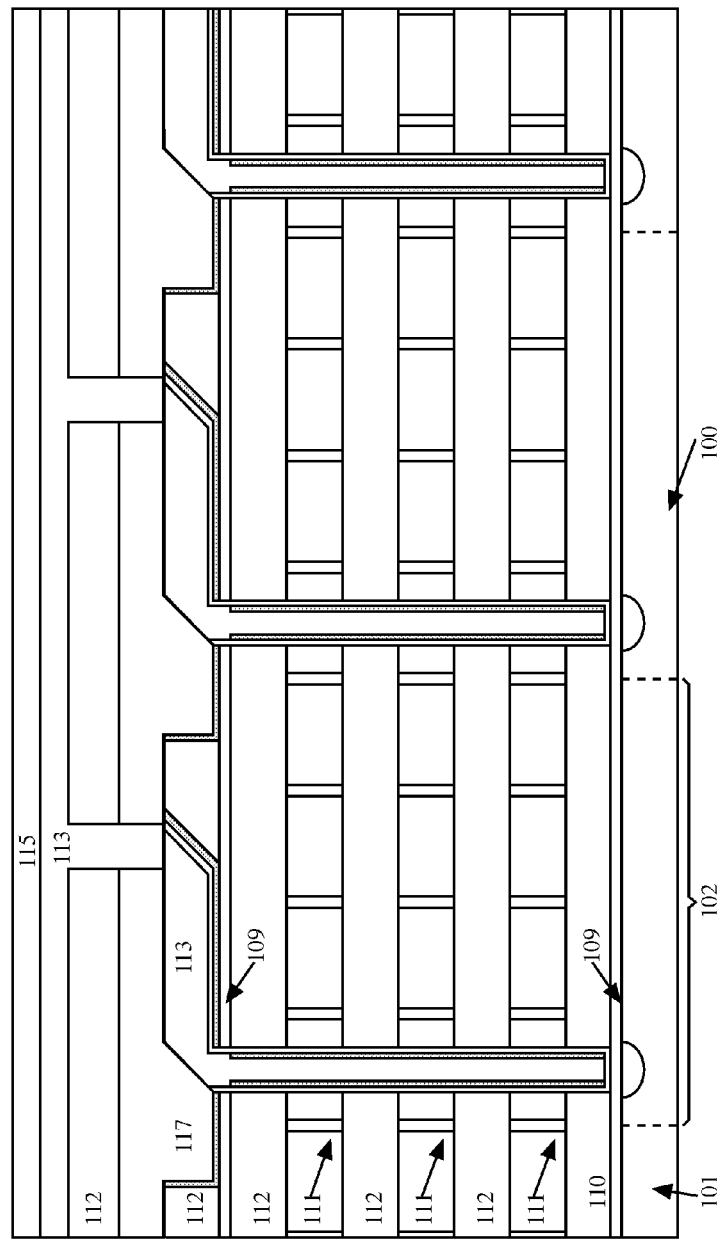
Figure 21P:
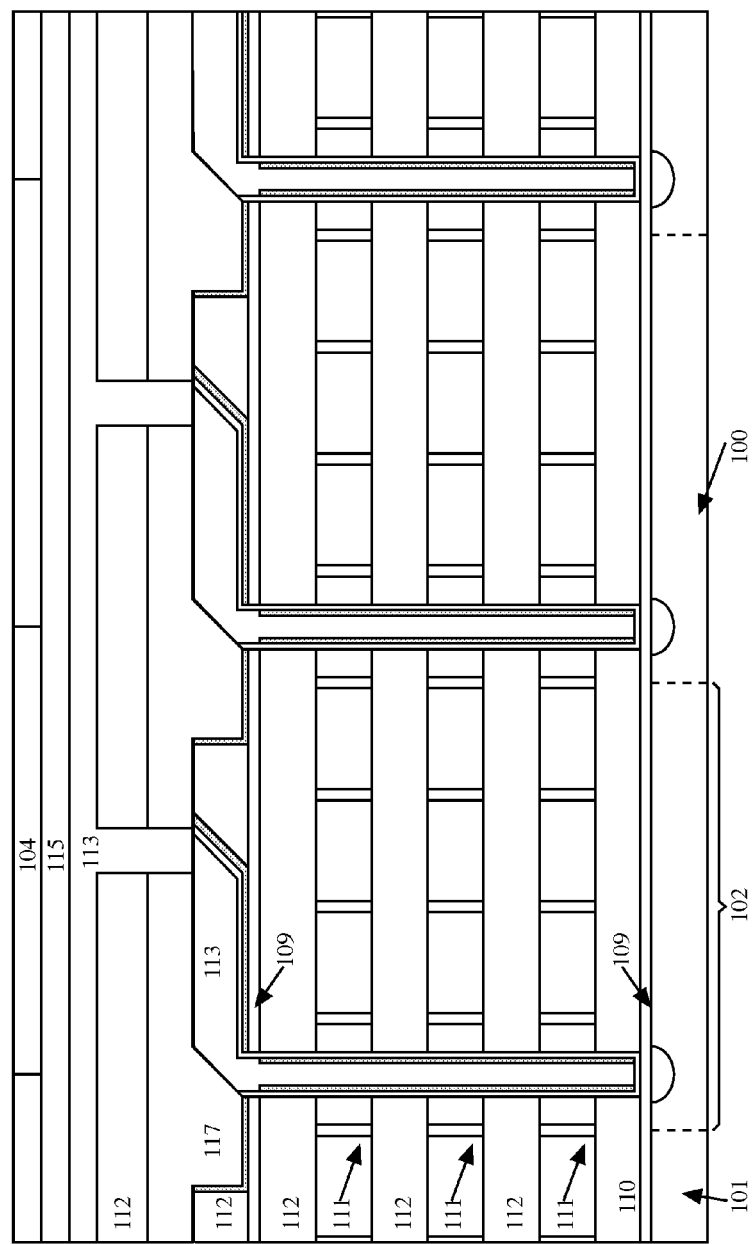
Figure 21Q:
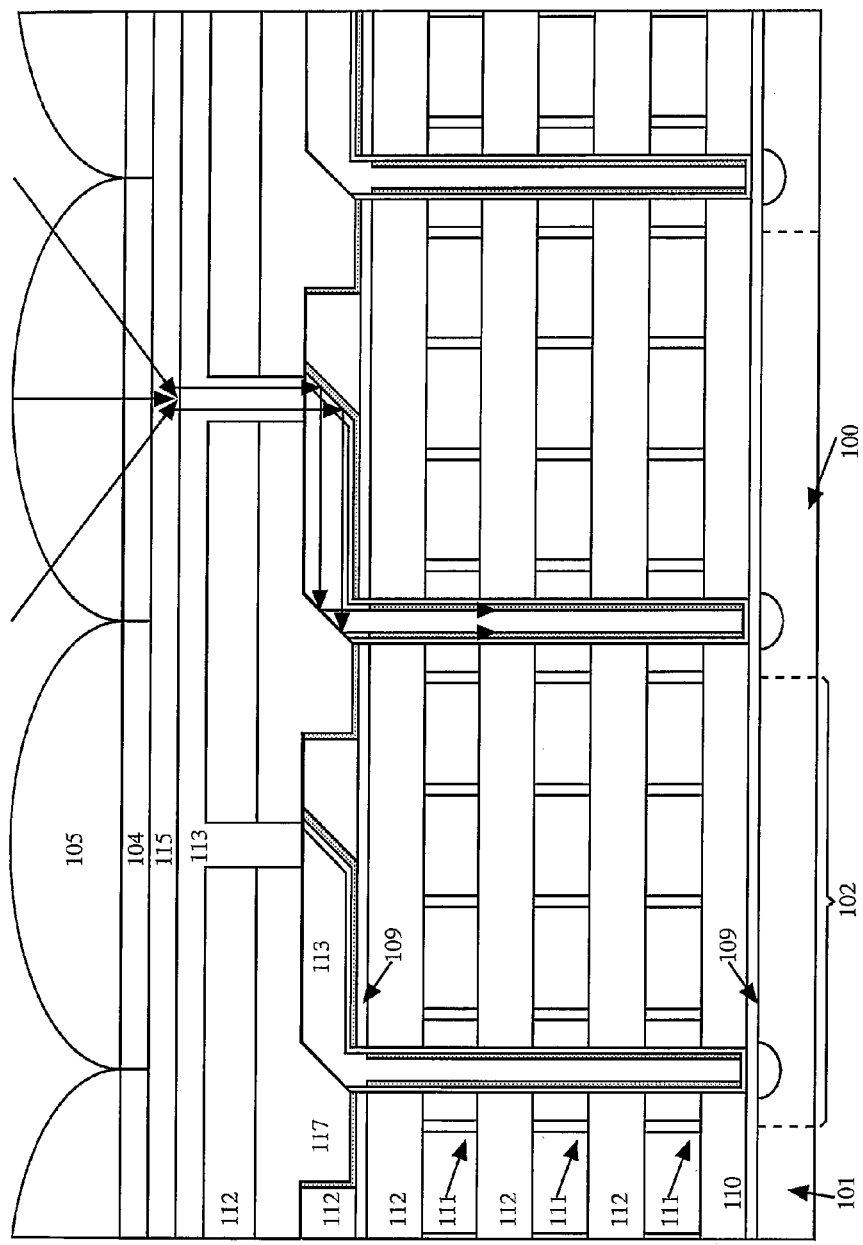

FIGS. 21A to 21Q, show the sequence of process steps describing the fabrication flow of one implementation of the present invention, in which the Light-Tunnels are made of dielectric films, have side wall reflectors, are made in two stages, and individual Light-Tunnels may have bends in different directions.

DETAILED DESCRIPTION OF THE INVENTION

Regions in the Drawing Figures

100—Substrate.
101—Photo-diode.
102—Pixel.
103—Metallization stack.
104—Color filters.
105—Microlenses.
106—Iris.
107—Lens.
108—Light rays.
109—Dielectric barrier film (for example silicon nitride).
110—Pre-metal dielectric (typically silicon oxide).
111—Metal lines.
112—Inter-metal dielectric.
113—Passivation layer.
114—Reflected light rays.
115—Layer with Graded Index of Refraction (graded in the vertical direction-direction of deposition).
116—High Index of Refraction material, for example silicon nitride or diamond.
117—Metal.
118—First width of Light-Tunnels.
119—Second width of Light-Tunnels.
120—Third width of Light-Tunnel
121—Representation of a Surface Plasmon-Polariton at the surface of a metal layer.
122—Inverted truncated cone or pyramid geometry with radially graded index of refraction (forming a GRIN lens).
123—Perforated metal film connected to side wall metal films.
124—Perforated metal film connected to center metal columns.
125—Layer patterned with subwavelength features for anti-reflection purposes.
126—Conformally deposited layers with varying index of refraction (forming a GRIN lens).
127—Holes into the metallization stack.
128—Thin dielectric layer.
130—Convergent lens.
131—Focal plane.
132—Image circle in air.
133—Image circle in material with high index of refraction.

The Concept of Light-Tunnels

In its simplest form, providing a Light-Tunnel according to the invention consists in fabricating holes, extending from the top surface of the last layer of the metallization stack, or from the top surface of the passivation layer, down to near the surface of the photo-diodes. Typically a silicon nitride barrier layer is formed prior to the deposition and planarization of the pre-metal dielectric films. Said barrier layer could become the bottom of said hole, which is subsequently filled with dielectric materials having a higher index of refraction than the dielectrics in the metallization stack.

The filling of said hole can be done with conformal deposition, non-conformal deposition, or a sequence of steps combining both types of deposition processes. Conformal deposition processes, such as Atomic Layer Deposition (ALD), allow a radial variation in the film composition, including the fabrication of a radial gradient in the index of refraction and/or the incorporation of metal films for example.

Because of alignment tolerances, it is not possible to have a perfect alignment between the side walls of the Light-Tunnels and the boundary of the light-sensing area of the photo-diodes. For this reason, at the bottom, the cross section circle of the Light-Tunnel must be inside the perimeter of the photo-diode; while at the top the cross section diameter is limited only by the lateral dimensions of the respective pixel, which in conventional imaging systems also determine the lateral dimensions of the color filters and microlenses. For applications with light travelling in the opposite direction, the cross-section diameter of the Light-Tunnels, near the interface with an LED or a Light-Valve, would be larger than the lateral dimensions of said LED or Light-Valve.

Light-Tunnels can be engineered so that: (1) their diameter at the bottom and at the top are roughly the same, (2) there is a moderate increase in diameter from the bottom to the top, or (3) the diameter at the top is much larger than the diameter at the bottom.

One implementation of the current invention is shown in FIG. 3, in which the hole is filled with a single material, having a higher index of refraction than the surrounding materials, that keeps the light rays within its outer perimeter, thereby forcing them to impinge onto the photo-diode. The Light-Tunnel is depicted with the optional feature of having a narrower cross section at the bottom and wider one at the top. FIG. 3 also shows the optional formation of microlenses on top of the color filters.

Another implementation of the current invention is shown in FIG. 4, in which the outer wall of the Light-Tunnel comprises reflecting layers, such as metal thin films, that prevent light from escaping from this region. The metal thin films as shown in FIG. 4, i.e., only on the side walls, can be formed by the sequence of deposition and etchback, similarly to "spacers". For Light-Tunnels with diameters of the order of the wavelength of light, there may be a cavity effect, in which certain wavelengths will be resonantly enhanced while others are dampened. Wavelength selectivity, that is, color filtering, can then be tuned across a pixel matrix by simply varying the lateral dimensions of the Light-Tunnels, which is something that can be done with a single layout/patterning mask for all color filters, without requiring extra processing steps for each color filter. FIG. 5 shows an implementation in which wavelength selectivity is achieved with a variation in the lateral dimensions of Light-Tunnels with metallic side walls: the narrowest Light-Tunnel transmits shorter wavelengths, and the widest Light-Tunnel transmits longer wavelengths.

Another implementation of the current invention is shown in FIG. 6, in which there is a metallic column at the center of the Light-Tunnel. This implementation may be inherently suitable to couple incoming light rays to surface plasmon-polaritons (SPPs). This is because there is an angle of incidence for which there is "attenuated total reflection", that results in the optimal coupling of said light rays to said metal structures, and for which the solution depicted in FIG. 6 increases the probability of light rays hitting the metal surface at the angle for which there is "attenuated total reflection". The higher the aspect ratio of the "Light-Tunnel", the higher the likelihood of light impinging on the metal surface at that optimal angle.

The metal films at the perimeter of the Light-Tunnels shown in FIG. 4 may be adequate, by themselves, for the coupling of SPPs.

FIG. 7 shows an alternative implementation of Light-Tunnels, having a metallic column at the center, but without metallic side walls.

Another implementation of present invention, is shown in FIG. 8, in which the diameter of the Light-Tunnel at the top is much larger than the diameter at the bottom. Such configuration can be accomplished using known micro-fabrication techniques, by which it is possible to fabricate Light-Tunnels with two distinct regions, and consists in forming holes through the metallization stack, with the top of said holes being shaped as an inverted truncated cone or pyramid (with a squared, rectangular or hexagonal shape for example), in which the lateral dimensions at the top, match the lateral dimensions of the respective pixel.

This enables the Light-Tunnel to gather all the light impinging on the area corresponding to the respective pixel, and guide that light to the photo-diode. With such an implementation of Light-Tunnels it is not necessary to fabricate microlenses, since the reason for their inclusion was to direct all light impinging on the surface area of a pixel to the respective photo-diode. As it will be seen later in this document, there are several potential advantages to replacing conventional microlenses by this implementation of Light-Tunnels.

The holes are filled through the conformal deposition (for example with Atomic Layer Deposition—ALD) of a sequence of thin dielectric films with an increasing index of refraction, thereby filing the hole with a graded index material with radial symmetry: the index of refraction is largest at the center of the hole and smallest at the perimeter of the hole.

The deposition of the last film, the one that fills the center of the holes, and has the highest index of refraction, may at one point switch from optimized process conditions for conformal deposition, to optimize process conditions for the opposite purpose, that is, to have a higher deposition rate in the vertical direction than laterally, which are the typical conditions for planarization purposes.

The radial gradient in the index of refraction, creates a "GRaded INdex" (GRIN) lens for each pixel. When light impinges on a GRIN lens, the light rays are bent towards the region or material possessing the largest index of refraction, which in this case is the center of the Light-Tunnel.

The geometry of the top of the holes (inverted truncated cone/pyramid) with fairly sharp edges separating adjacent Light-Tunnels and therefore separating adjacent pixels, insures that the GRIN lens structure, is in positioned at the focal plane.

A metal thin film can also be embedded (deposition and possibly etchback) inserted in the sequence mentioned above, such as to form a thin metal wall at the perimeter of the holes and/or to form a column at the center of the holes.

Light-Tunnels and Color Filtering

The concept of "Light-Tunnels" is not tied to any color filtering architecture: it can be used for black & white imaging, in which case color filters are not used at all; it can be used with color filter arrays such as the Bayer pattern; it can be used with wavelength-selective light sensing devices such as those described in U.S. Pat. No. 5,965,875, or those described in U.S. Pat. No. 6,891,869, or those described in U.S. patent application Ser. No. 11/176,538 (see the section on Multiple Vertically Stacked Optoelectronic/Photonic Devices).

Regarding the utilization of the Light-Tunnels as color filters, it should be noted that such effect depends on the geometry and lateral dimensions of the Light-Tunnels to produce a wavelength-selective transmission (waveguiding) of light rays to the photo-diodes. The transmitted wavelengths should not suffer any attenuation and could be resonantly enhanced, while the transmission of all other wavelengths would be strongly attenuated. FIG. 5 shows the implementation in which wavelength selectivity is achieved with a variation in the lateral dimensions of Light-Tunnels with metallic side walls: the narrowest Light-Tunnel transmits shorter wavelengths, and the widest Light-Tunnel transmits longer wavelengths.

Performing color filtering with Light-Tunnels would have several advantages over conventional color filter arrays (CFAs) because:

(1) The wavelength selection is defined in the layout mask for all wavelengths of interest, and therefore a number of variations can be implemented simultaneously for a number of wavelengths, with only one patterning step and without incurring in additional processing steps, thus resulting in a less complex and less costly fabrication of color filters.

(2) A Light-Tunnel designed to transmit a certain wavelength range, for example in the range of the color green, would not absorb or attenuate light in that range, while conventional CFAs do absorb or attenuate the wavelength that they are supposed to transmit. In fact increasing the thickness of the color filter is one of the methods used to increase the spectral purity of the filters used in CFAs, which inevitably results in less light being transmitted through the filter.

(3) A Light-Tunnel is composed of structures and materials that are compatible with CMOS processing, and do not have the thermal restrictions of the materials used in conventional CFAs. This is quite relevant for the fabrication of structures after forming the color filters. For example, the fabrication of microlenses is constrained by the low thermal budget that conventional color filters can withstand. If instead of being made on top of conventional color filters, the microlenses were going to be made on top of wavelength-selective Light-Tunnels, a much wider range of materials and processing steps could be used for the fabrication of microlenses.

With suitable choice of geometry and lateral dimensions, a Light-Tunnel may be made polarization-insensitive, or can be specifically optimized for a particular polarization. Light-Tunnels with symmetric cross sections can be used for polarization-insensitive propagation.

Examples of symmetric cross sections include circles, hexagons, squares, crosses, etc. For polarization-sensitive plasmon propagation, Light-Tunnels with asymmetric cross sections can be used. Examples of asymmetric structures include thin vertical metal slabs, in which the orientation determines the polarization filtering properties.

Light-Tunnels and Light Coupling to Surface Plasmon-Polariton Structures

U.S. Pat. No. 7,153,720 ("CMOS image sensor") shows the monolithic integration of Surface Plasmon-Polariton (SPP) structures with CMOS image sensor devices. The SPP structures were used to make a "Light-Funnel" that performs a role similar to that of microlenses, but it can squeeze light to dimensions much smaller than the wavelength, which conventional microlenses cannot do since they are diffraction-limited. It should be noted that SPPs can propagate over distances of millimeters, that is, far exceeding the total thickness of a CMOS metallization stack.

FIG. 9 is a schematic cross section of multiple pixels in a sensor matrix showing Light-Tunnels (116), also showing a semiconductor substrate (100), a pixel region (102) which comprises a photo-diode (101), a pre-metal dielectric barrier layer (109) which typically is silicon nitride, a pre-metal dielectric (110) which typically is silicon oxide, several metal levels (111) and several inter-metal dielectric layers (112) which typically are silicon oxide or dielectrics with a low permeability, also known as low-k dielectrics. On top of the metallization layer stack, it also shows a passivation layer (113)—typically silicon nitride, an anti-reflection layer (115) having a vertically graded index of refraction, and conventional microlenses (105). The metal side walls (117) of the Light-Tunnels (116) are connected to a perforated planar metal film (123) positioned at the top of the metallization stack. The structured planar metal thin film can be used to select wavelength and/or polarization of the photons to be guided to the photo-diodes.

FIG. 10 is a schematic cross section of multiple pixels in a sensor matrix showing Light-Tunnels (116), also showing a semiconductor substrate (100), a pixel region (102) which comprises a photo-diode (101), a pre-metal dielectric barrier layer (109) which typically is silicon nitride, a pre-metal dielectric (110) which typically is silicon oxide, several metal levels (111) and several inter-metal dielectric layers (112) which typically are silicon oxide or dielectrics with a low permeability, also known as low-k dielectrics. On top of the metallization layer stack, it also shows a passivation layer (113)—typically silicon nitride, an anti-reflection layer (115) having a vertically graded index of refraction, and conventional microlenses (105). The center metal structures (117) of the Light-Tunnels (116) are connected to a perforated planar metal film (124) positioned at the top of the metallization stack. The structured planar metal thin film can be used to select wavelength and/or polarization of the photons to be guided to the photo-diodes.

FIG. 11 is a schematic cross section of multiple pixels in a sensor matrix showing Light-Tunnels (116), also showing a semiconductor substrate (100), a pixel region (102) which comprises a photo-diode (101), a pre-metal dielectric barrier layer (109) which typically is silicon nitride, a pre-metal dielectric (110) which typically is silicon oxide, several metal levels (111) and several inter-metal dielectric layers (112) which typically are silicon oxide or dielectrics with a low permeability, also known as low-k dielectrics. On top of the metallization layer stack, it also shows a passivation layer (113)—typically silicon nitride, an anti-reflection layer (115) having a vertically graded index of refraction, and conventional microlenses (105). The metal side walls (117) of the Light-Tunnels (116) are connected to a perforated planar metal film (123) positioned at the top of the metallization stack. The center metal structures (117) of the Light-Tunnels (116) are connected to a perforated planar metal film (124) positioned at the top of the metallization stack. The structured planar metal thin film can be used to select wavelength and/or polarization of the photons to be guided to the photo-diodes. The patterns in the two top planar metal films could be identical and aligned, or could be identical but with a pre-determined shift in one or two directions in the plane of the films, or it could simply be different for each of the films.

Examples of the patterning of the top metal film include slits in one direction, slits in multiple directions, holes in the metal film with one or more geometrical forms and with one or multiple sizes and pitches, concentric rings of metallic circumferences with varied diameters, etc.

The potential benefits of light coupling to SPPs are many, and include:

(1) Strong resonances for the wavelengths of interest (resulting in signal enhancement);
(2) Possibility of wavelength selectivity (color filtering), thereby rendering unnecessary the fabrication of conventional color filtering arrays (CFAs);
(3) Possibility of polarization selectivity;
(4) Diameter of light beam, impinging on the photo-diodes, much smaller than the wavelength of light, which allows for photo-diodes with much smaller lateral dimensions, and yet receive all the light impinging on the corresponding pixel area on the focal plane, thereby enhancing signal-to-noise ratio.

Light-Tunnels to Replace Microlens and Color Filters

As already mentioned in this disclosure, in a scenario in which the Light-Tunnels replace conventional microlenses and color filters, after the fabrication of Light-Tunnels, further processing becomes possible, including the formation of a region of high index of refraction, along with anti-reflection structures, at the focal plane produced by the system lens.

FIG. 12 is similar to FIG. 8, and in which the anti-reflection structure, positioned on top of the Light-Tunnels, consists of a planar film (115) with varying composition and correspondingly a varying index of refraction along the vertical direction (the direction of deposition). The index of refraction is largest at the bottom where it interfaces with the Light-Tunnels, and smallest at the top where the film ends and therefore where it interfaces with air.

FIG. 13 is similar to FIG. 8, and in which the anti-reflection structure, positioned on top of the Light-Tunnels, consists of a film (125) with a large index of refraction, for example having the same index of refraction of the inner region of the Light-Tunnels, with suitable thickness and whose top surface is patterned with subwavelength features, which are known to suppress reflection.

One important consequence of having the focal plane in a medium with a large index of refraction is that, the image circle produced by the system lens has its lateral dimensions reduced by a numerical factor given by the ratio of the indices of refraction of said medium with high index of refraction over that of air. In this case, the lateral dimensions of the pixels in the imaging matrix, as well as the dimensions of the matrix itself, are also scaled by the same numerical factor. It should be noted that this will not change the amount of light received by each pixel. FIG. 14 (Prior Art) shows the image circle (132) at a focal plane (131) in air as produced by a system lens (130).

For example, for a material at the focal plane with an index of refraction equal to 2, leads to an image circle with a diameter that is half (and thus an area that is one fourth) of that for an image circle formed in air. It should be noted that the size of the pixels is scaled accordingly, and therefore the number of pixels remains constant, with each pixel receiving the same amount of light from the system lens, since each pixel preserves the same ratio of its area over the total area of the image circle. FIG. 15 shows the image circle (133) at a focal plane (131) in a medium with high index of refraction (116) as produced by a system lens (130) identical to that of FIG. 14.

It must be emphasized that for these calculations, the system lens is kept constant, and the pixels can be smaller than the resolution of the lens system, because the area scaling was obtained through a medium with a higher index of refraction. Also, the ratio between the size of the pixel and the wavelength of the light rays is kept constant, since pixels and wavelengths are scaled down by the same numerical factor.

Another consequence of scaling the image circle and the pixels, is that the area of the photo-diodes is reduced, thereby reducing the dark current, but the amount of light impinging on each pixel, remains constant, since that is determined by the system lens, which does not change. Therefore the signal-to-noise ratio is increased accordingly.

With a reduced image circle, the area of the pixel matrix is scaled accordingly. Since in typical conventional image sensors the area of the pixel matrix is much more than 50% of the total area of the image sensor integrated circuit, a strong reduction, for example by a factor of 2, in the area of the pixel matrix will automatically result in a strong reduction in the total area of said integrated circuit, with the consequential benefits in terms of size, yield, and cost.

The configurations shown in FIGS. 12 and 13 are not compatible with imaging systems having conventional microlenses. The formation of desirable materials with high index of refraction, such as diamond, requires certain processing conditions, such as temperature, that would destroy the microlenses and color filters. Also, even if the processing conditions were not an obstacle, the placement, immediately above the microlenses of a material with an index of refraction than that of the microlenses, would decrease the efficiency of light coupling to the microlens. But even if the coupling efficiency were not a problem, the fact that conventional microlenses are diffraction-limited optical elements, the minimum pixel size would be determined by the microlenses, and placing a material with a high index of refraction above the microlenses would not produce any advantage.

The implementation of Light-Tunnels as shown in FIG. 12 and FIG. 13, achieve new effects that are beyond the simple replacement of microlenses and color filters by simpler implementations: a Light-Tunnels becomes a wavelength-selective waveguide having an integrated GRIN lens.

Light-Tunnels with High Aspect Ratios

FIGS. 16A to 16F, 17A to 17I, and 18A to 18M show process flows for the fabrication of the Light-Tunnels shown in FIGS. 3, 4, and 12, respectively. As it can be seen from the figures of the process flows, the aspect ratio of Light-Tunnels can be high. The trend for smaller pixels and increased number of metal layers, inevitably leads to "Light-Tunnels" with increasingly larger aspect ratios (height divided by diameter), which makes them progressively more difficult to fabricate.

A solution to this problem consists in fabricating the "Light-Tunnel" in multiple stages, in which each stage has a much smaller aspect ratio. Conceptually the "multiple stage" solution permits the fabrication of Light-Tunnels for any pixel size and any number of metal levels (any thickness of the metallization stack). The drawback of multiple stages is the need to perform the same set of process steps for each stage. Alignment issues between stages can be minimized by suitably engineering the thickness of the several films deposited at each stage, and by using sufficiently selective etch steps. A fabrication flow showing such possibility is described in FIGS. 19A to 19P. A process flow with two stages and having a center metal column is shown in FIGS. 20A to 20Q.

Light-Tunnels can also be fabricated with bends, allowing light to be routed to photo-diodes which are not vertically aligned with the focus point of the microlens (or other optical device). FIGS. 21A to 21Q depict such process flow.

There are several optical technologies capable of performing 90 degree bends for light rays, such as dielectric photonic crystals, metallodielectric photonic crystals, plasmonic devices (using surface plasmon-polariton structures), etc. In the example below, the bends in the light-tunnel are made with conventional microoptical structures.

With a "single stage" fabrication flow, the bend in the light-tunnel can be made on top of the metallization stack. With a "multiple stage" fabrication flow, the bend in the light-tunnel can be made on top of the metallization stack and/or at any of the intermediate fabrication stages. The process flow listed below, shows the fabrication on top of the metallization stack. A "marker" layer (for example silicon nitride) could be embedded in the top dielectric layer (typically silicon oxide) to improve the accuracy and repeatability of the depth of the trench etched into the top dielectric layer.

In order to facilitate the bending of light at the corners, the light-tunnels could have slanted corners. This could achieved with "gray photolithography" step for example. The bends can also have thin metal films surrounding the light tunnel, as already shown for the "straight" light-tunnels.

Light-Tunnels and Interconnect Technologies

The present invention is also applicable when the inter-metal dielectric layers are removed to form what has been designated as "Air Gap Interconnect" technology, which was devised as a solution to lower the capacitance between metal lines. The present invention is compatible with "air gap interconnects" because the etching away of the dielectric materials used during the formation of the metallization stack does not remove the Light-Tunnels, neither those made with dielectrics only, nor those having metal films surrounding the dielectric material with a higher index of refraction.

Light-Tunnels made with dielectrics only are not removed because the dielectric materials used to make the Light-Tunnel are sufficiently different from those used as inter-metal dielectrics necessary to build the metal interconnect structure and later removed. The dielectrics for the Light-Tunnels should have a higher index of refraction, such as, for example, silicon nitride ($Si_3N_4$) or silicon-oxide-nitride ($SiO_xN_y$) compounds (with nitrogen content varying from 4% to 90%); while the materials used as inter-metal dielectrics are silicon oxides and related materials, including porous materials, which are removed by etching agents that do not remove silicon-nitride-based materials. Another advantage of silicon nitride-based materials is the higher index of refraction which, for a given wavelength, allow light to be confined or travel through waveguides with smaller dimensions.

The Light-Tunnels having metal films surrounding the dielectric material are not removed because, with the proper choice of metal, for example one of those used for the metal interconnects, are immune to etch process used to remove the inter-metal dielectrics.

It should be understood that the present invention can also be applied to extract light from a light-emitting element placed underneath a metallization stack. Light-Tunnels facilitate the extraction of light from near the surface of the substrate to the top of the metallization stack where it can then be routed with waveguides. The use of surface plasmon polariton effects is also possible to enhance the efficiency of the light emission process.

One exemplary application is optical interconnects. Another exemplary application is displays, by simply replacing photo-diodes by light emitting devices (LEDs) or light-valves controlling the light intensity from an external source. In this case, it could be advantageous to make the Light-Tunnels with a diameter slightly larger than that of the LEDs and/or Light-Valves, in order to insure that all light emitted and/or transmitted is coupled into the Light-Tunnels.

The present invention can also be implemented back-side illuminated image sensors made on Thin-Film SOI or GOI substrates, such as those described in U.S. Pat. No. 7,153,720 ("CMOS Image Sensor"). In this case the Light-Tunnels can be made by artificially increasing the distance between the focal plane (with color filters and microlenses) and the back-surface of the photo-diodes by depositing one or more layers of one or more dielectric materials. After this, the fabrication of the Light-Tunnels would be very similar to the flows described in the figures for front-side illuminated image sensors.

Exemplary Process Flows for the Fabrication of Light-Tunnels

Process Flow #1:
FIGS. 16A to 16F, show the sequence of process steps describing the fabrication flow of one implementation of the present invention (structure depicted in FIG. 3), in which the Light-Tunnels are made of dielectric films.

Process Flow #2:
FIGS. 17A to 17I, show the sequence of process steps describing the fabrication flow of one implementation of the present invention (structure depicted in FIG. 4), in which the Light-Tunnels are made of dielectric films and have side wall reflectors.

Process Flow #3:
FIGS. 18A to 18M, show the sequence of process steps describing the fabrication flow of one implementation of the present invention (structure depicted in FIG. 12), in which the Light-Tunnels are made of dielectric films have side wall reflectors, and their diameter at the top matches the pixel size.

Process Flow #4:
FIGS. 19A to 19P, show the sequence of process steps describing the fabrication flow of one implementation of the present invention, in which the Light-Tunnels are made of dielectric films, have side wall reflectors, and are made in two stages.

Process Flow #5:
FIGS. 20A to 20Q, show the sequence of process steps describing the fabrication flow of one implementation of the present invention, in which the Light-Tunnels are made of dielectric films, have side wall reflectors, have a metal column at the center, and are made in two stages.

Process Flow #6:
FIGS. 21A to 21Q, show the sequence of process steps describing the fabrication flow of one implementation of the present invention, in which the Light-Tunnels are made of dielectric films, have side wall reflectors, are made in two stages, and individual Light-Tunnels may have bends in different directions.

In the fabrication flows described below, the following assumptions were:
(a) The surface of the photo-diodes is protected by a silicon nitride film (there may be a very thin silicon-oxide film between the two). It is typical of CMOS processes to have a silicon nitride layer formed prior to the deposition and planarization if the Pre-Metal Dielectric (PMD) film(s).
(b) The Pre-Metal Dielectric (PMD) and Inter-Metal Dielectric (IMD) layers and materials are related silicon oxide and other low-K materials, which have a large dry etch selectivity with respect to metals and silicon nitride, and vice-versa.
(c) At each metal level, or just for a few of the metal levels, there is an option to have metal structures overlaid/aligned with the isolation regions separating adjacent pixels. Some of said metal structures may be "dummy" metal structures, and may not even used for conducting electricity, as was already disclosed in WO 2006/010615.
(d) Typically, the dielectric material used in the "Light-Tunnels" is silicon nitride, which has a larger index of refraction than silicon-oxide related materials. Other CMOS-compatible materials with high index of refraction could also be used.

Figure 1A:
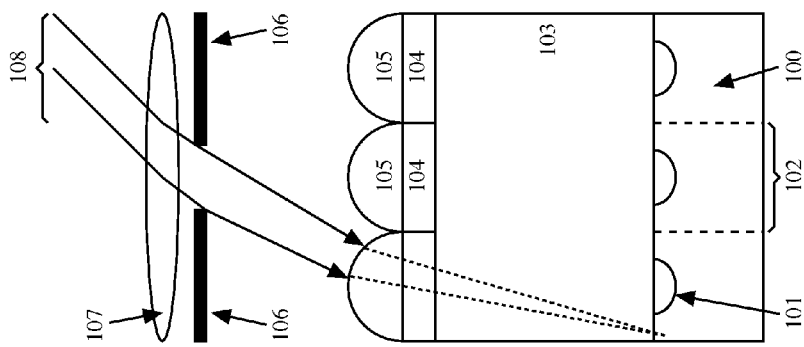
FIG. 1A (Prior Art) is a schematic cross section of multiple pixels in a sensor matrix, having color filters (104) and microlenses (105), also showing a system lens (107) and an iris set for a small aperture (106) and light rays (108) with a narrow angle of incidence.
Figure 1B:
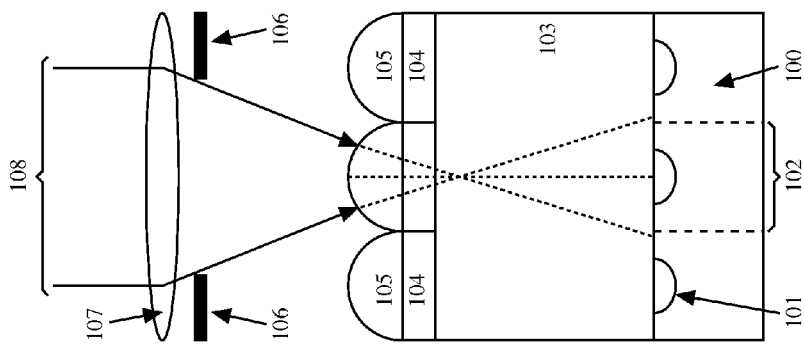
FIG. 1B (Prior Art) is a schematic cross section of multiple pixels in a sensor matrix, having color filters (104) and microlenses (105), also showing a system lens (107) and an iris set for a large aperture (106) and light rays (108) with a narrow angle of incidence.
Figure 1C:
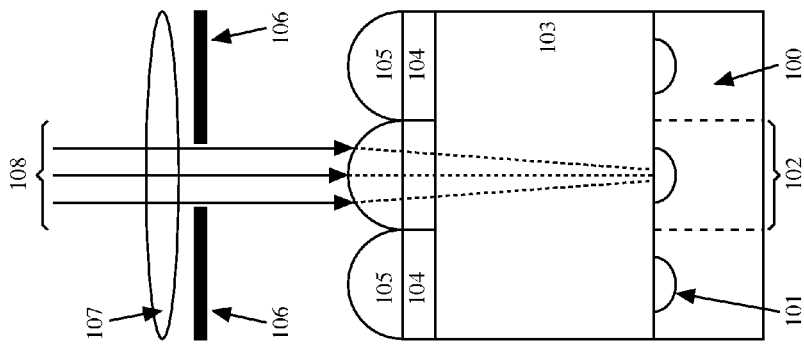
FIG. 1C (Prior Art) is a schematic cross section of multiple pixels in a sensor matrix, having color filters (104) and microlenses (105), also showing a system lens (107) and an iris set for a small aperture (106) and light rays (108) with a wide angle of incidence.
Figure 16A:
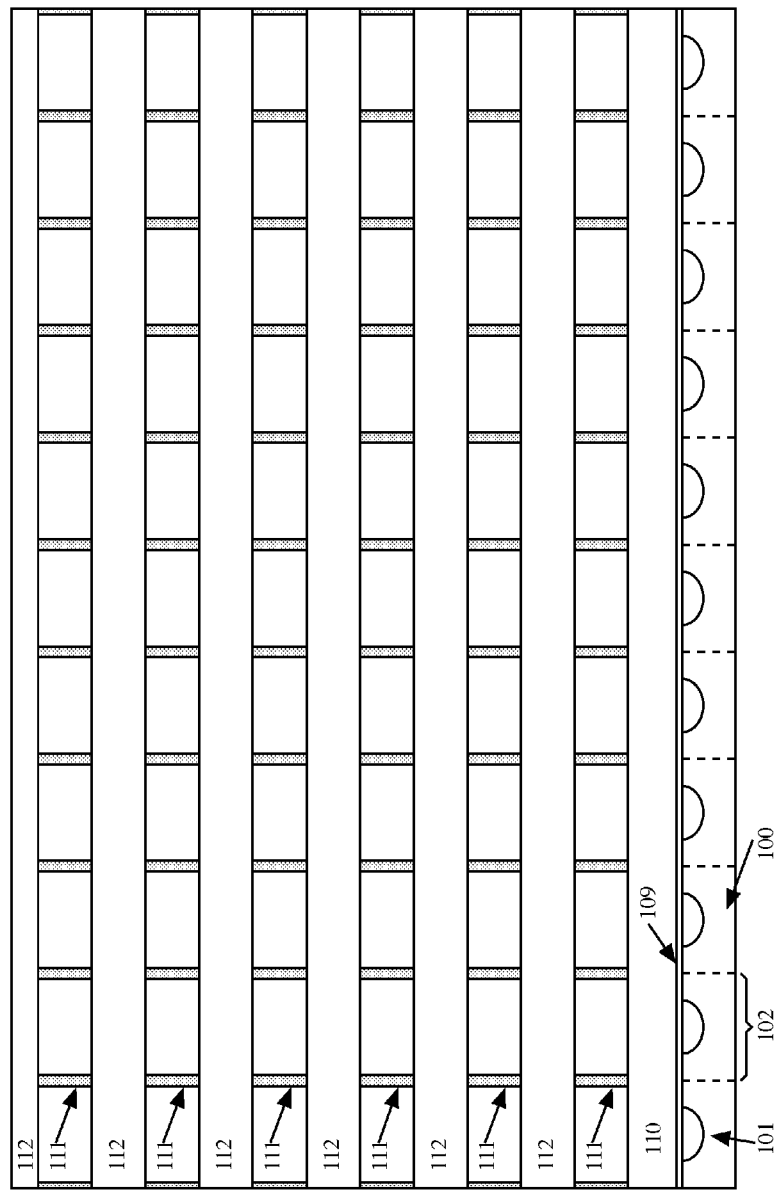
Figure 16B:
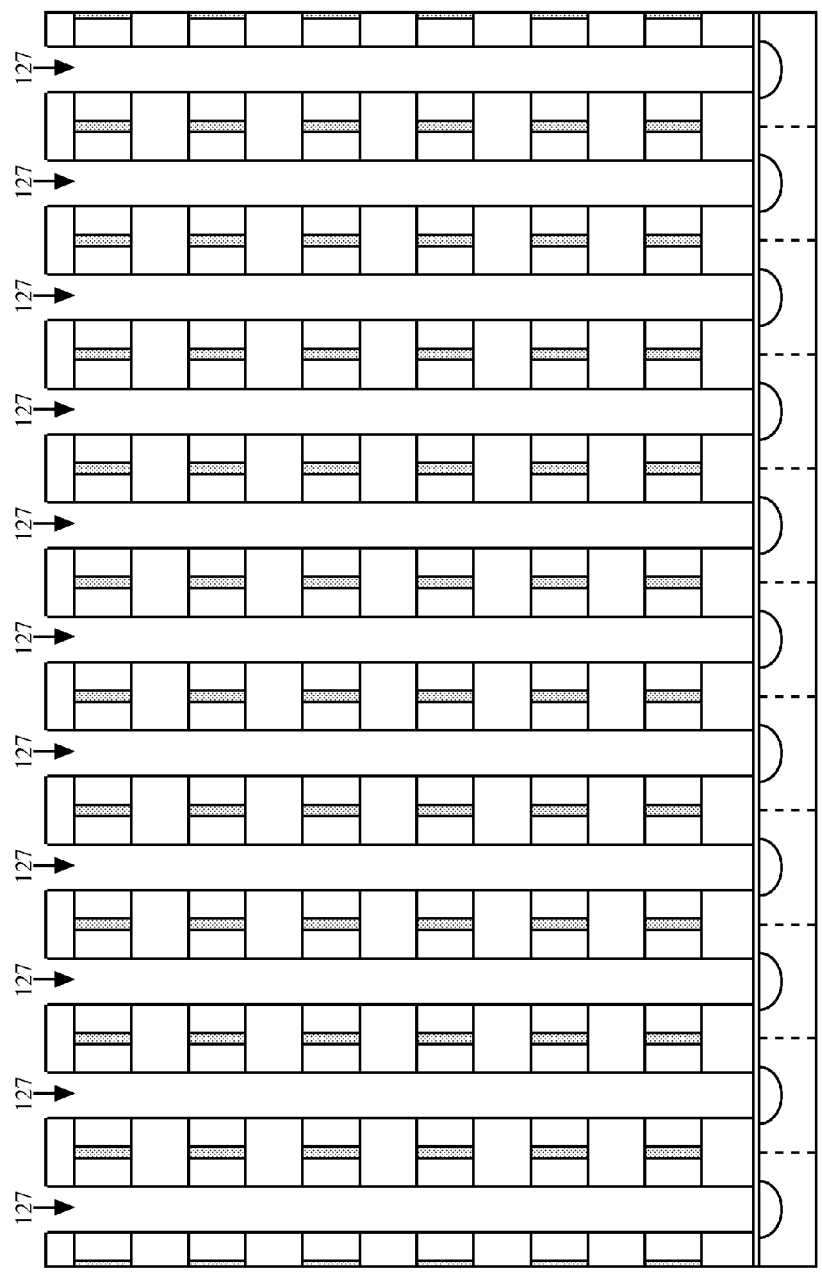
Figure 16C:
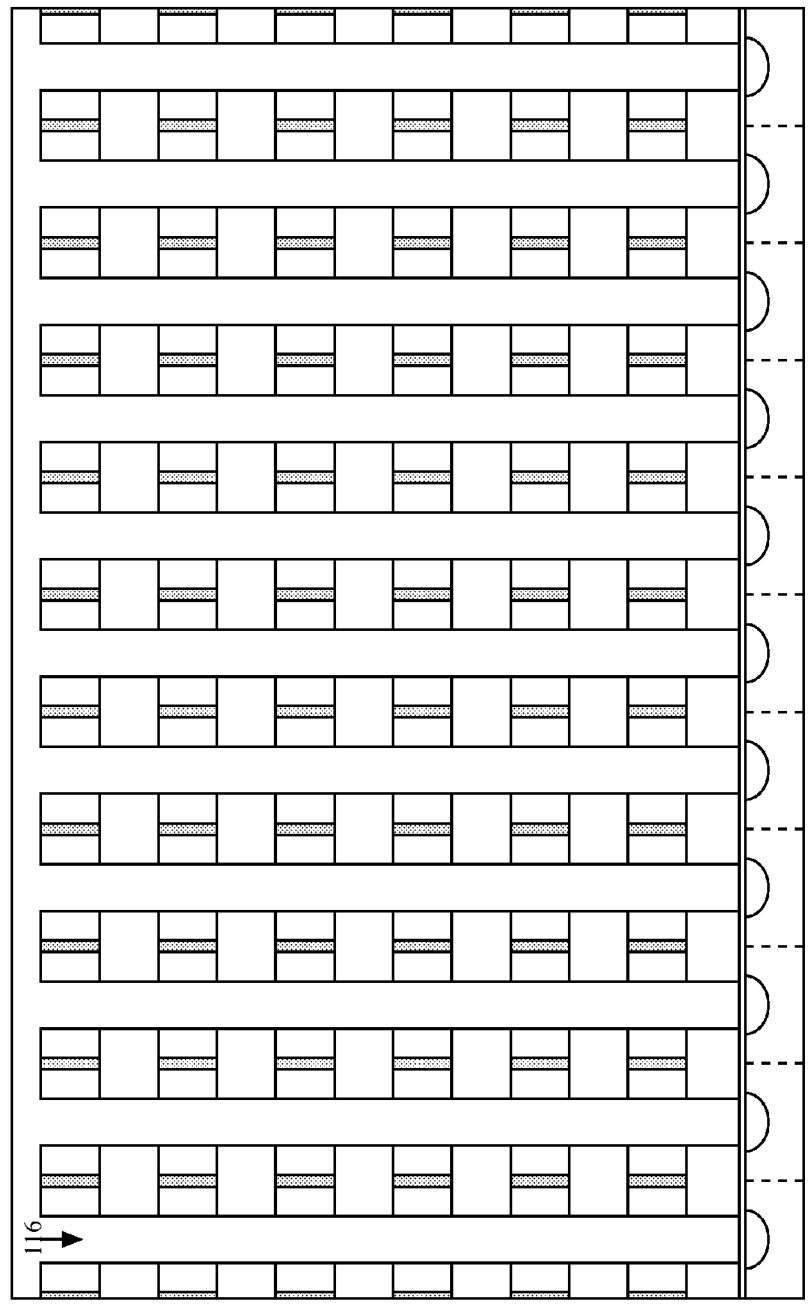
Figure 16D:
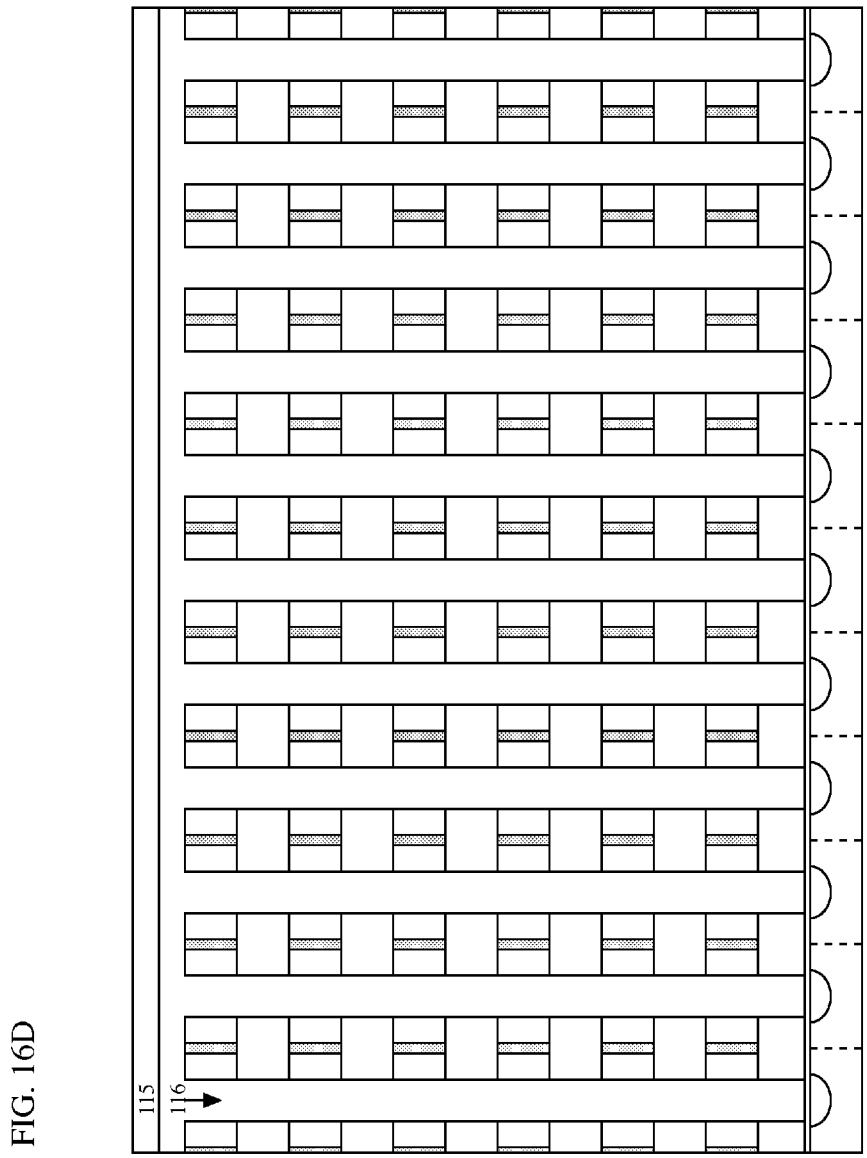
Figure 16E:
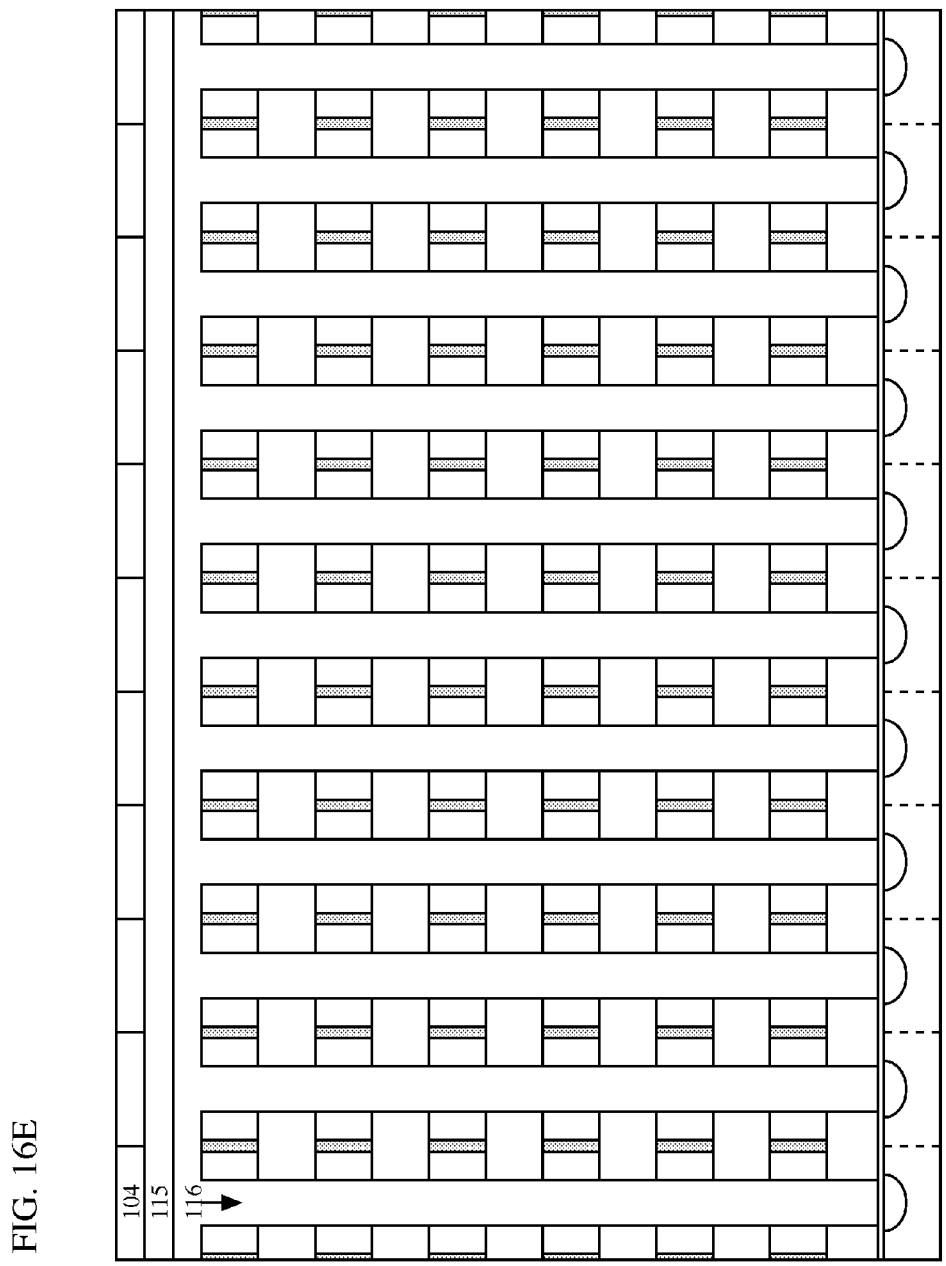
Figure 16F:
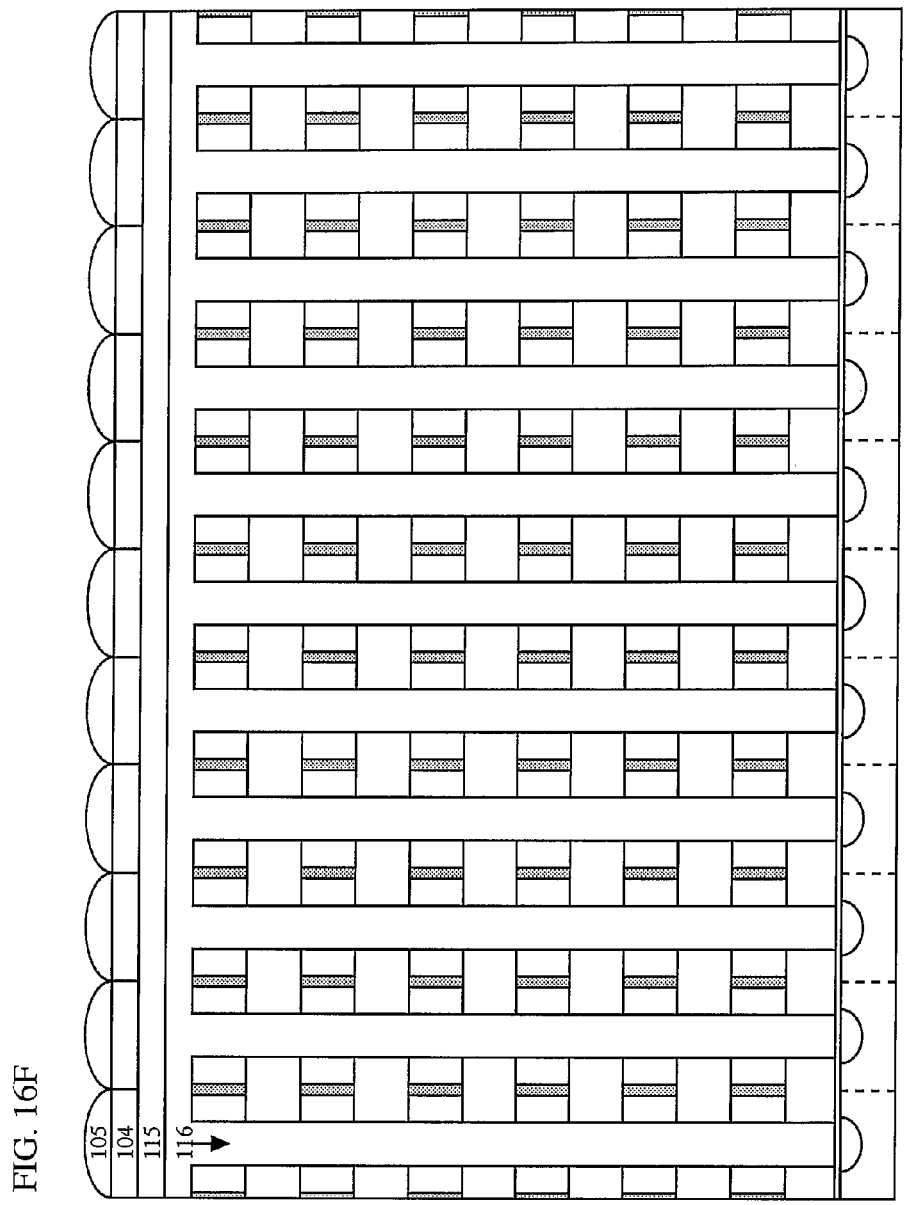
Figure 17A:
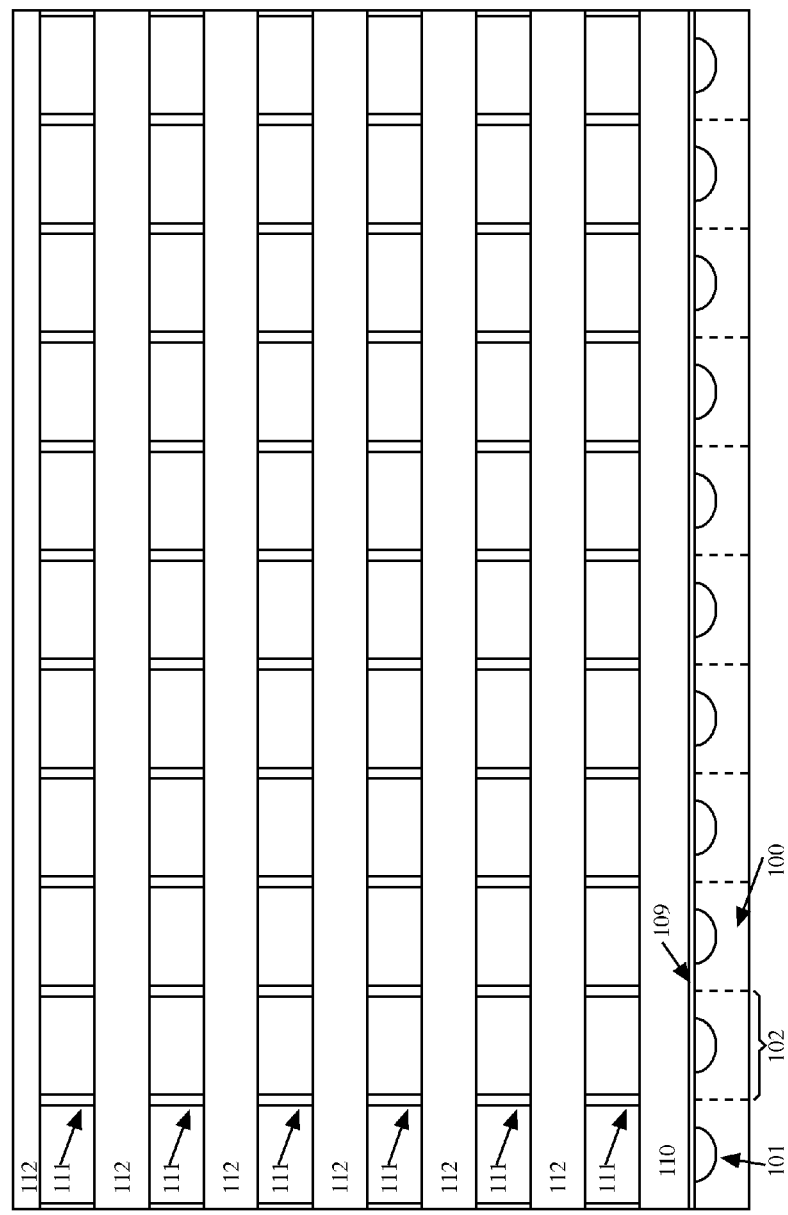
Figure 17B:
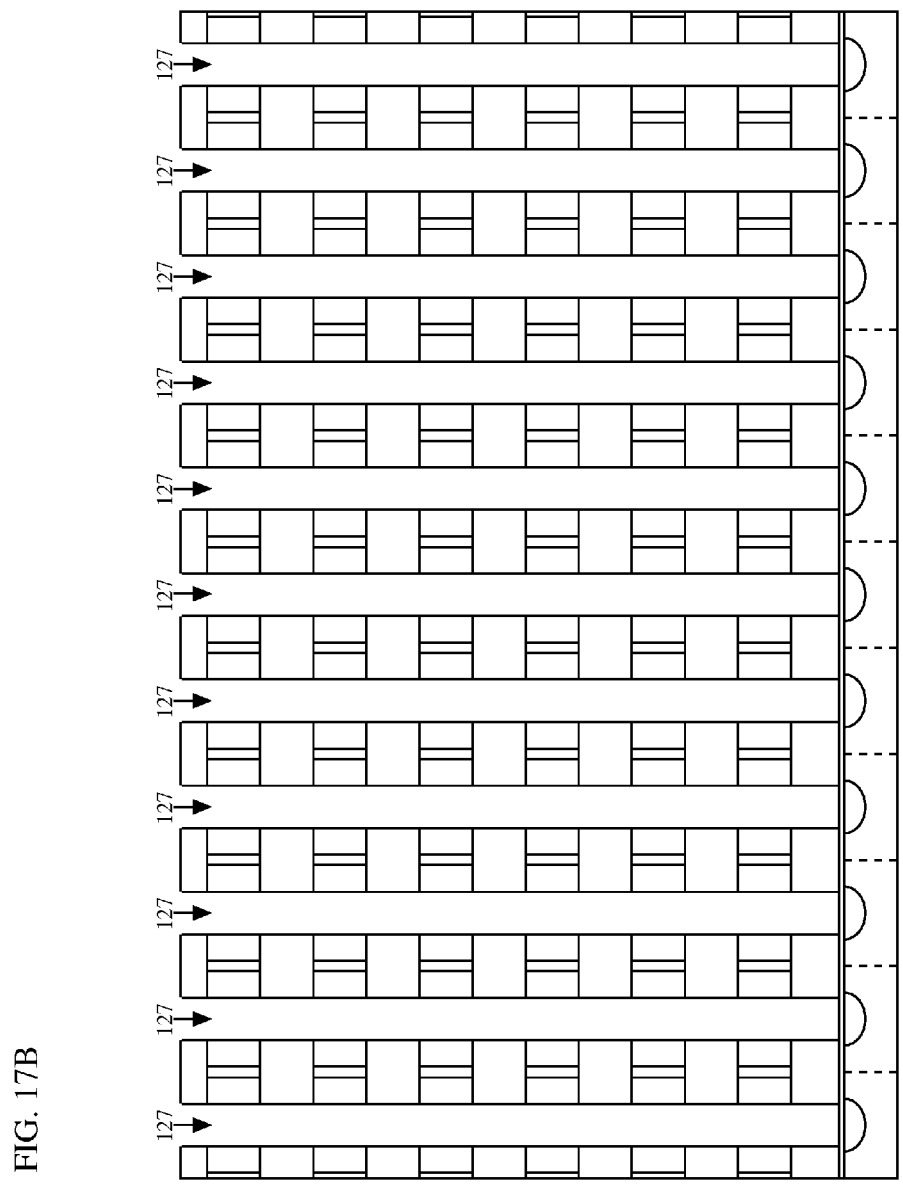
Figure 17C:
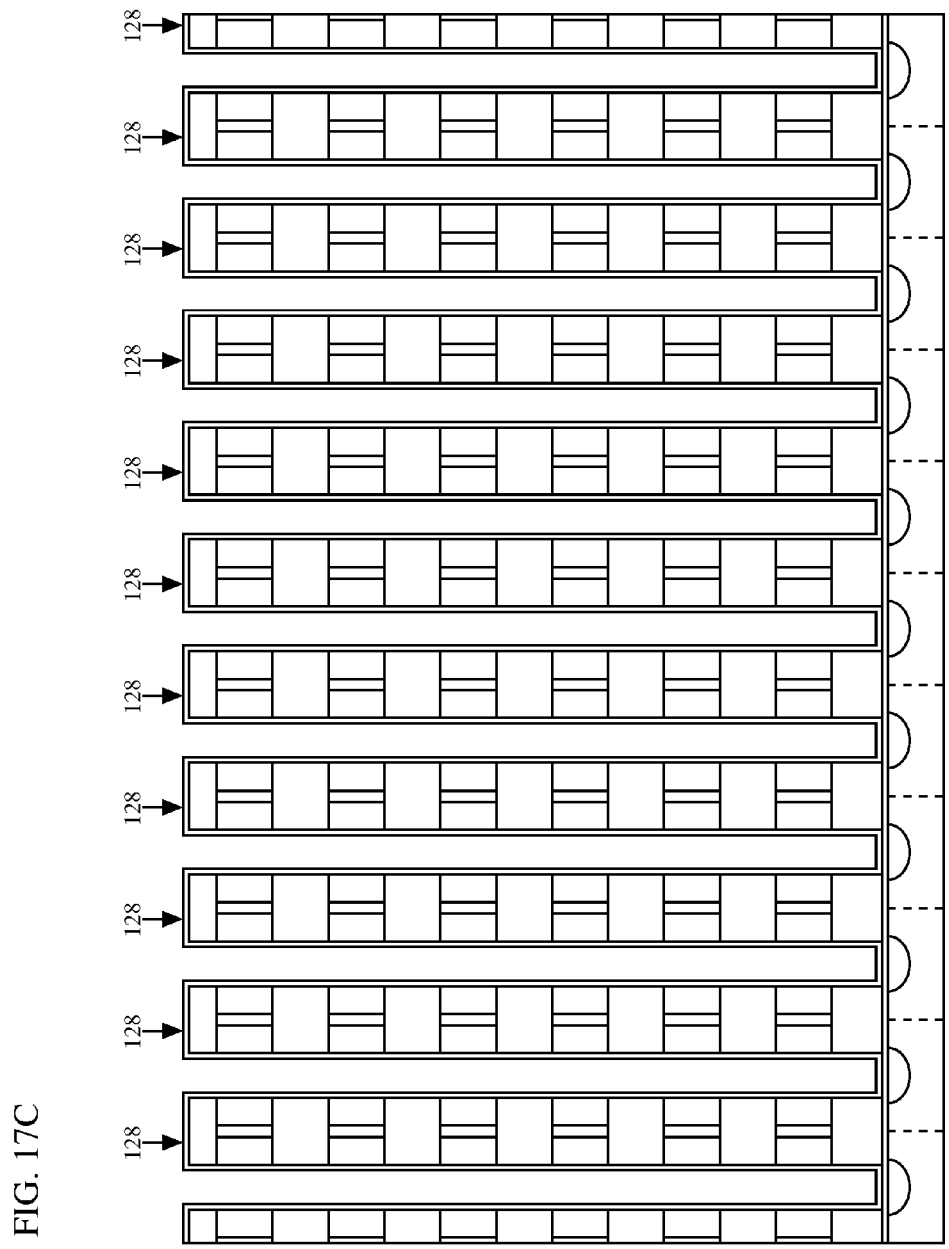
Figure 17D:
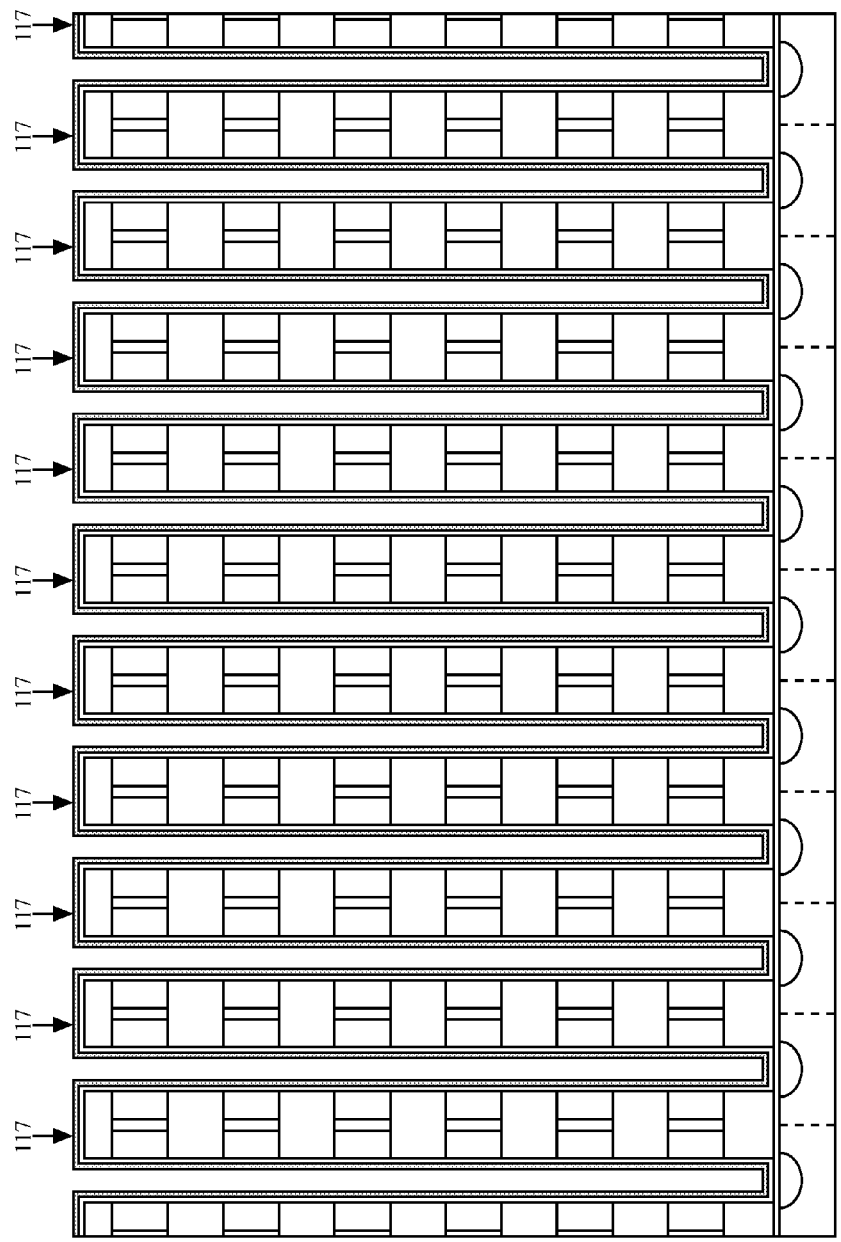
Figure 17E:
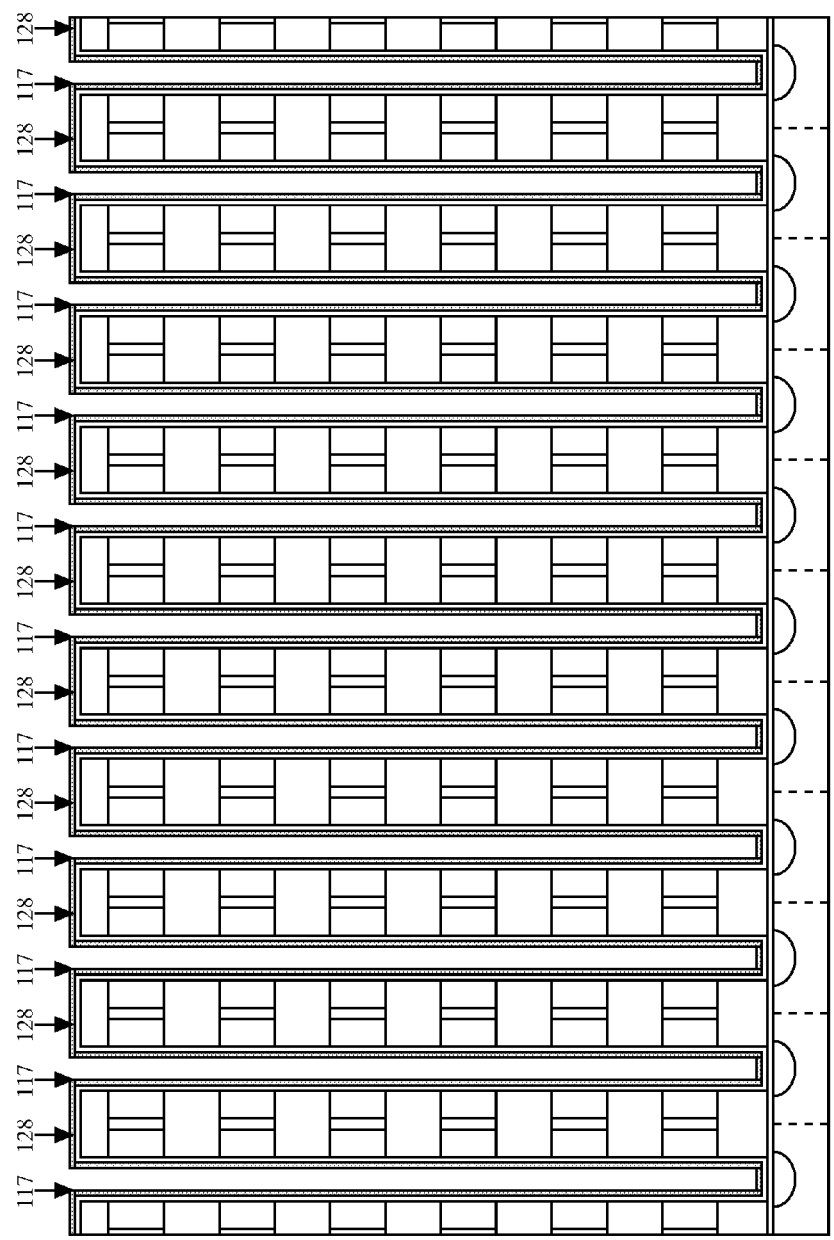
Figure 17F:
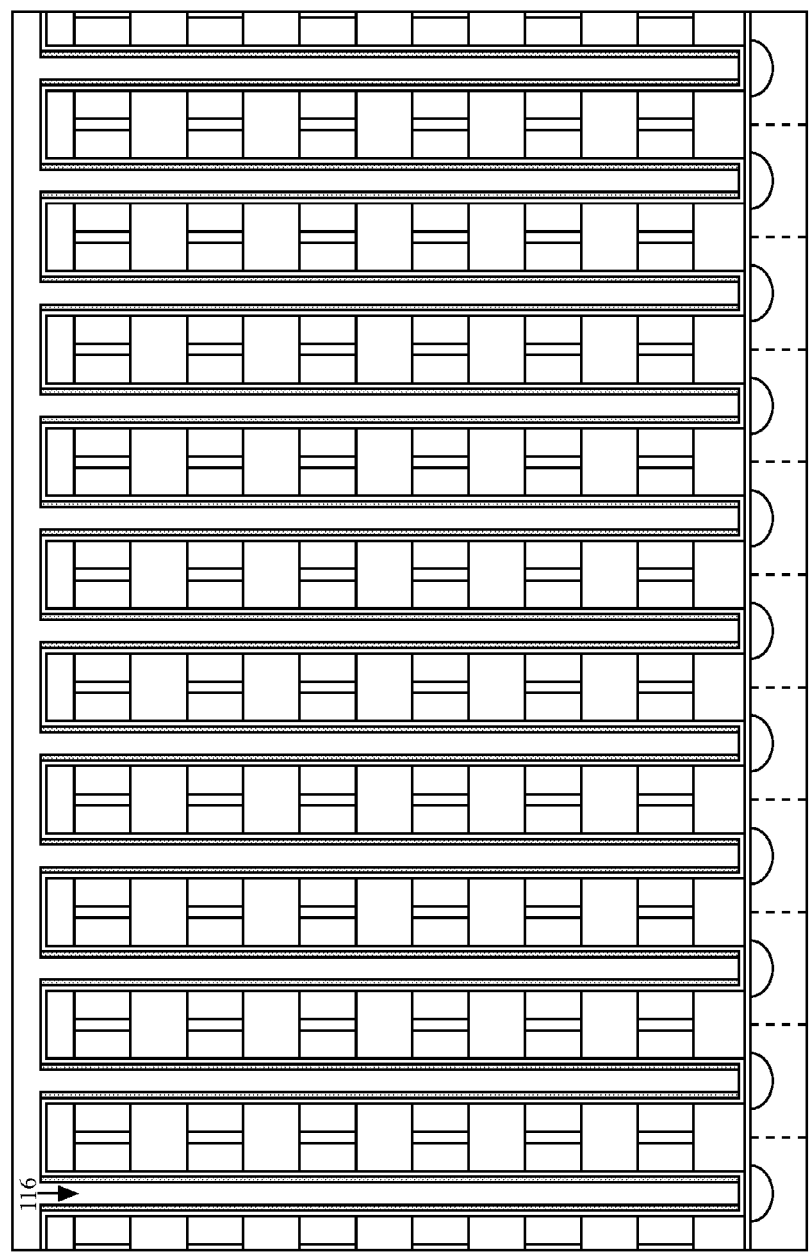
Figure 17G:
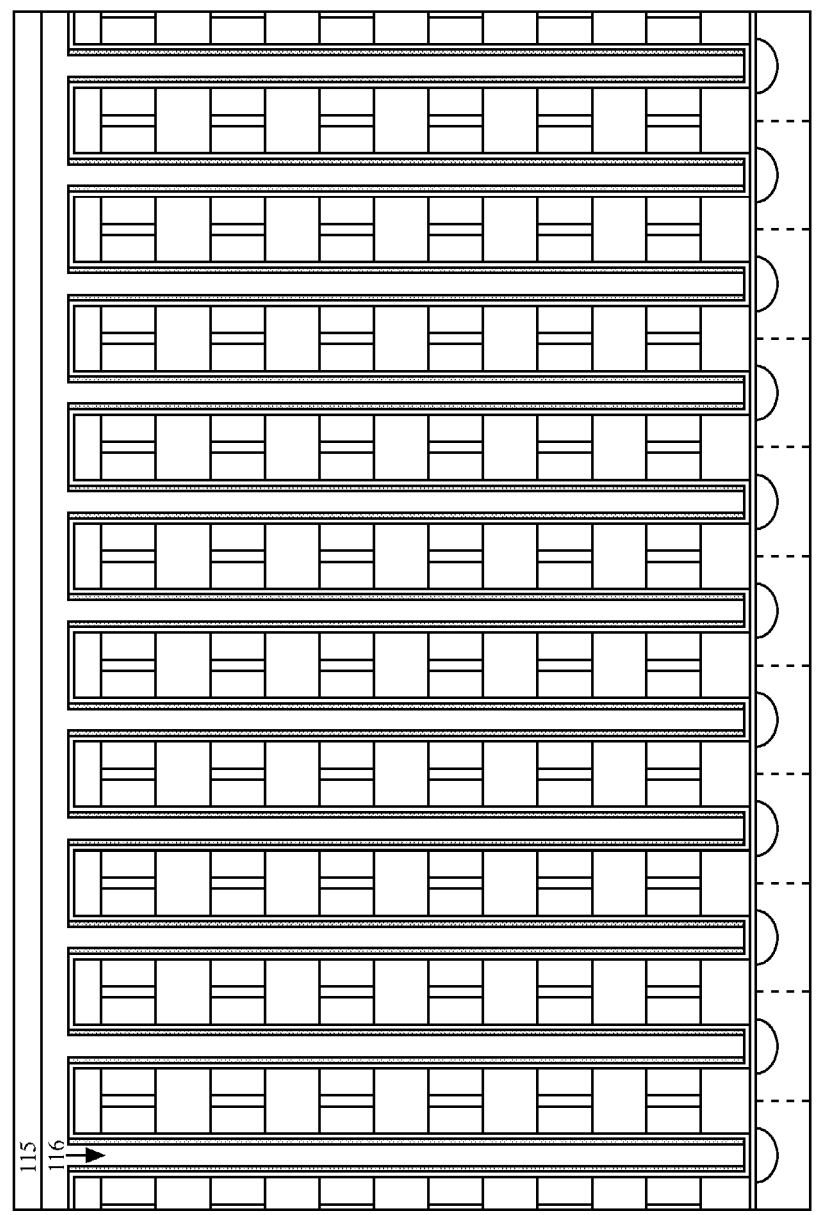
Figure 17H:
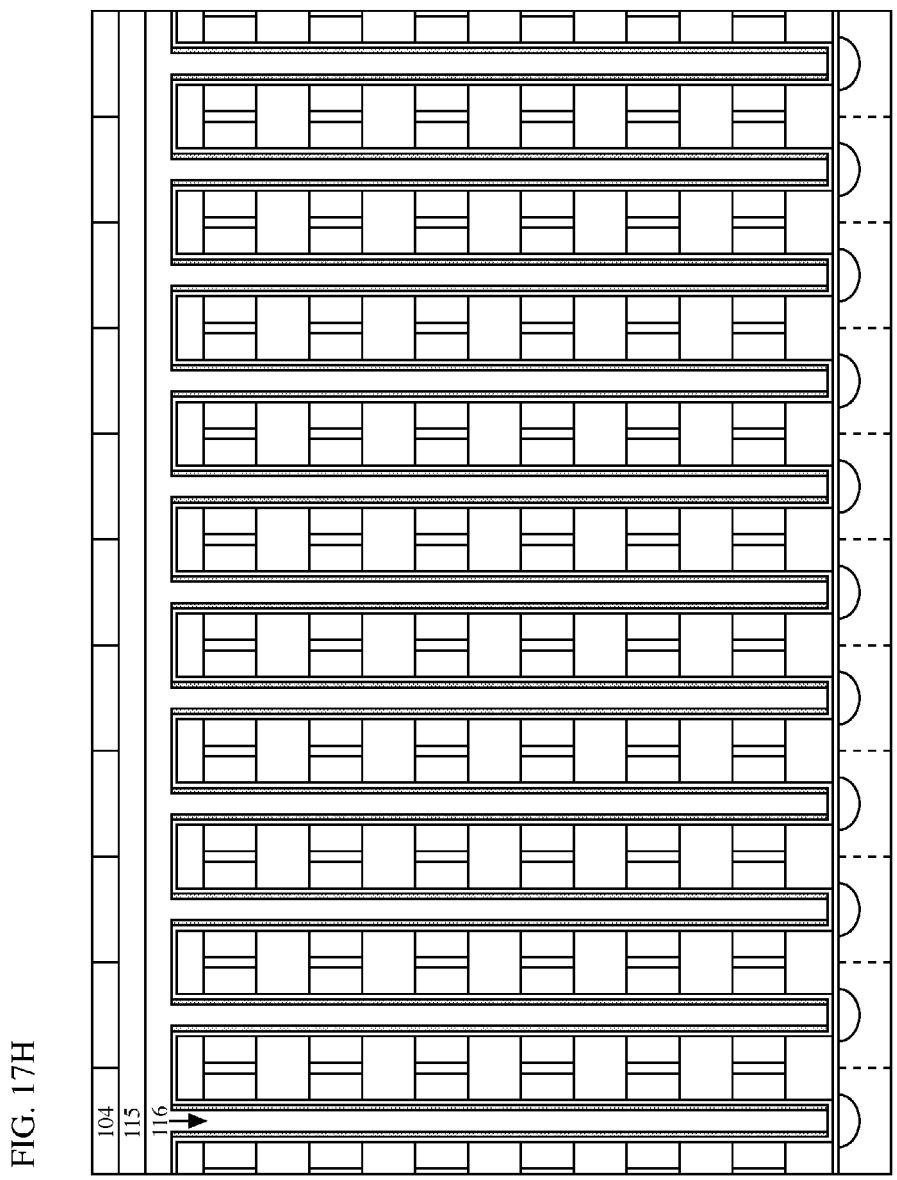
Figure 17I:
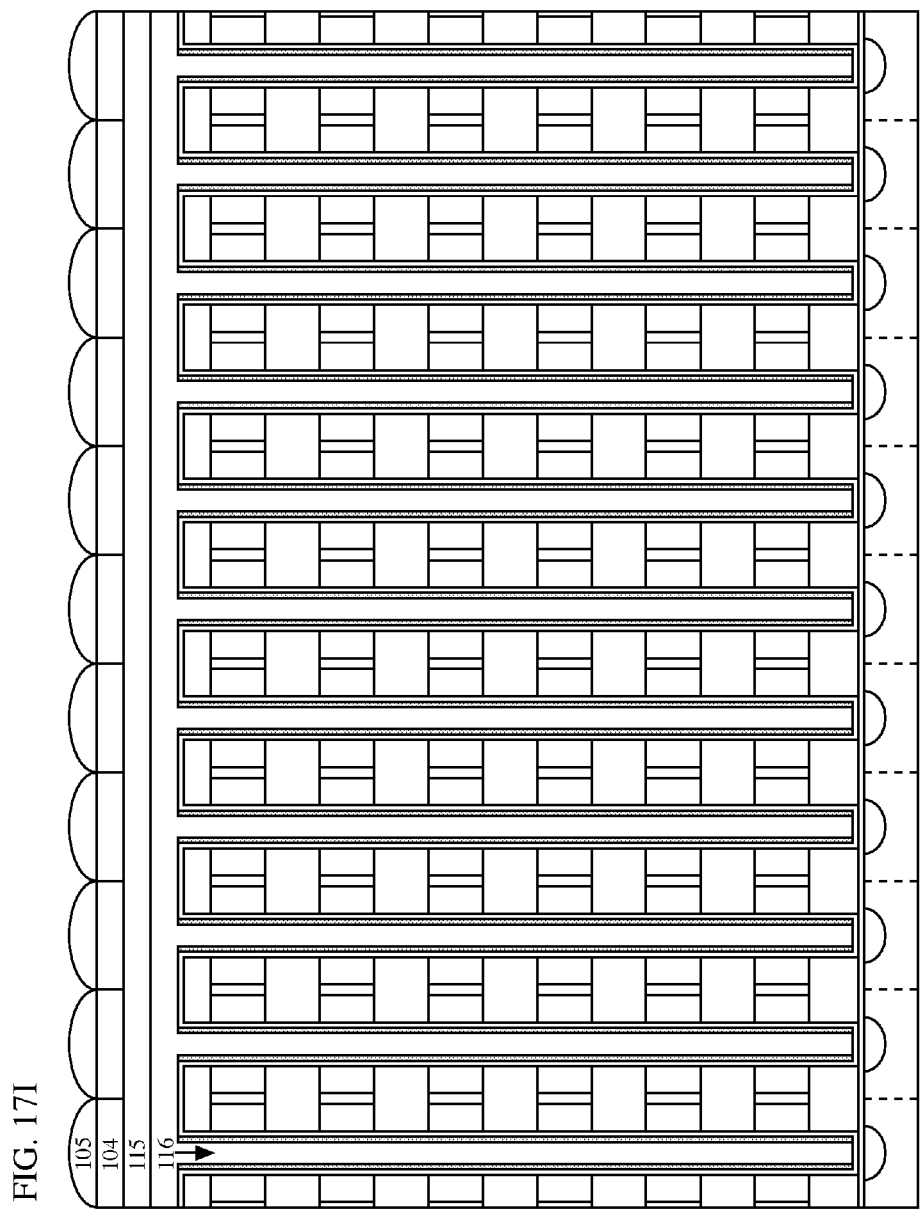
Figure 18A:
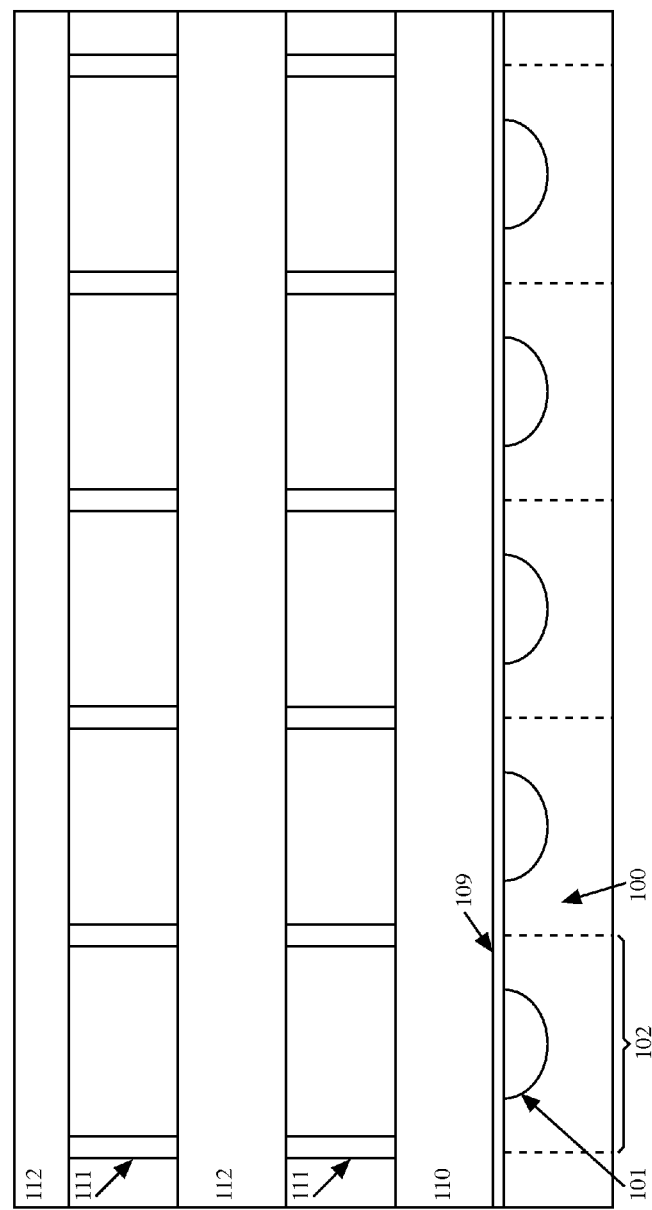
Figure 18B:
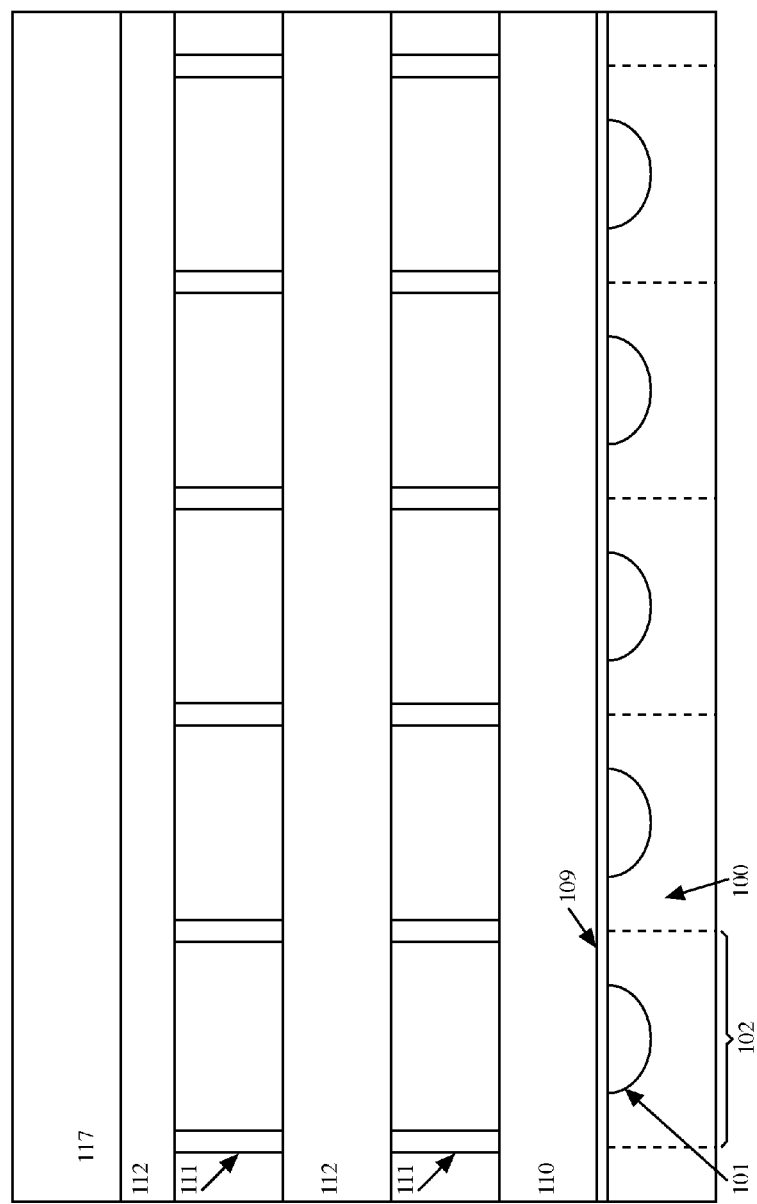
Figure 18C:
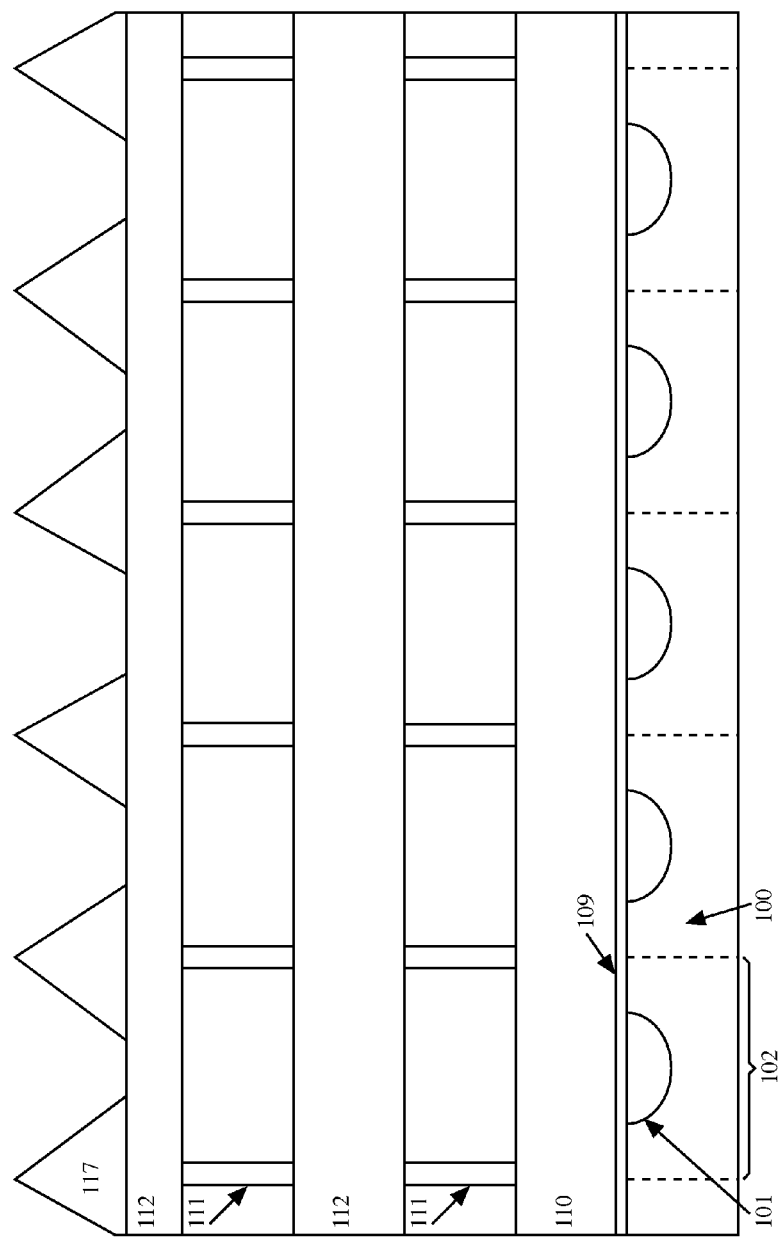
Figure 18D:
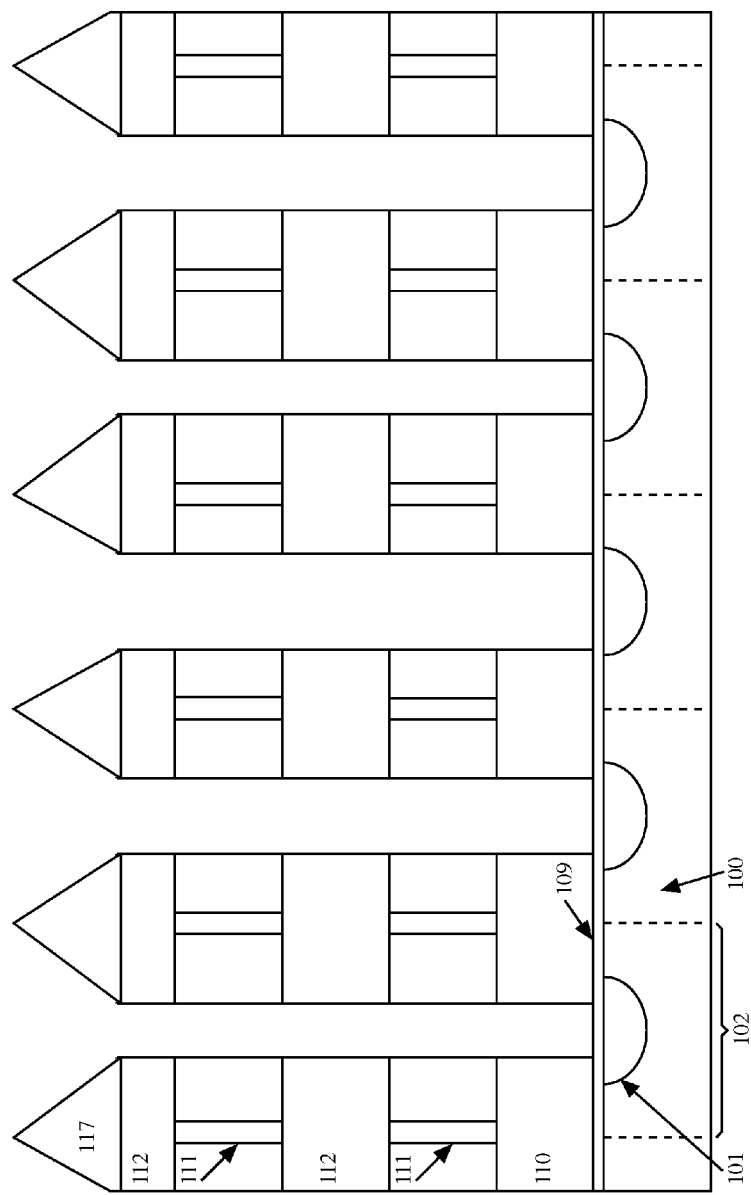
Figure 18E:
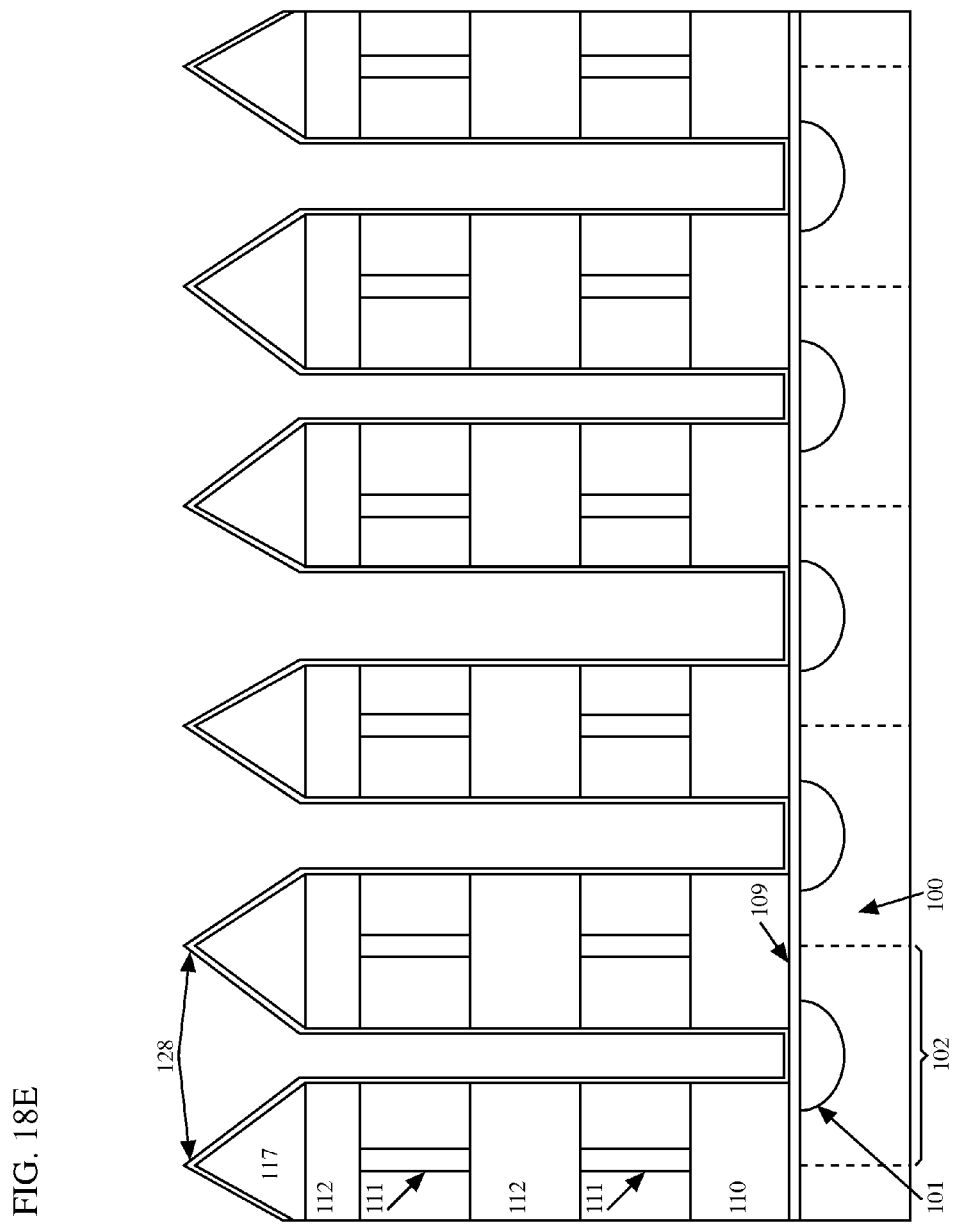
Figure 18F:
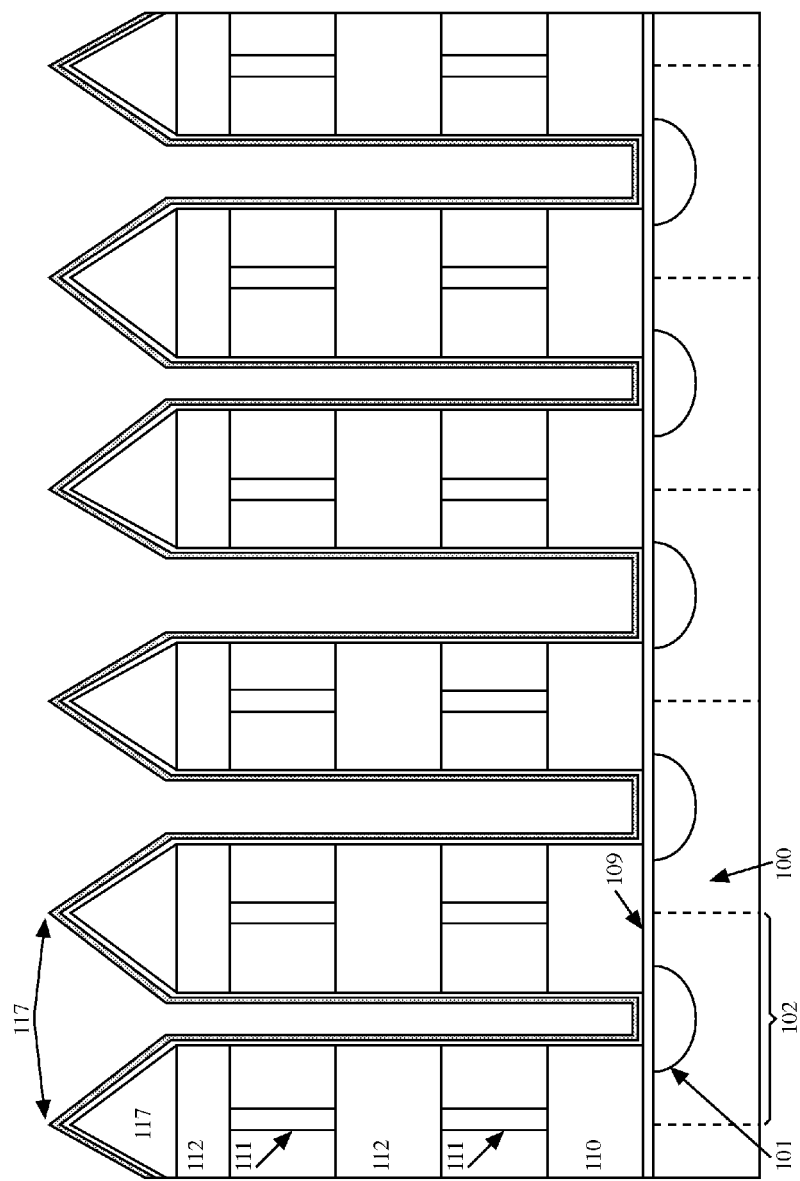
Figure 18G:
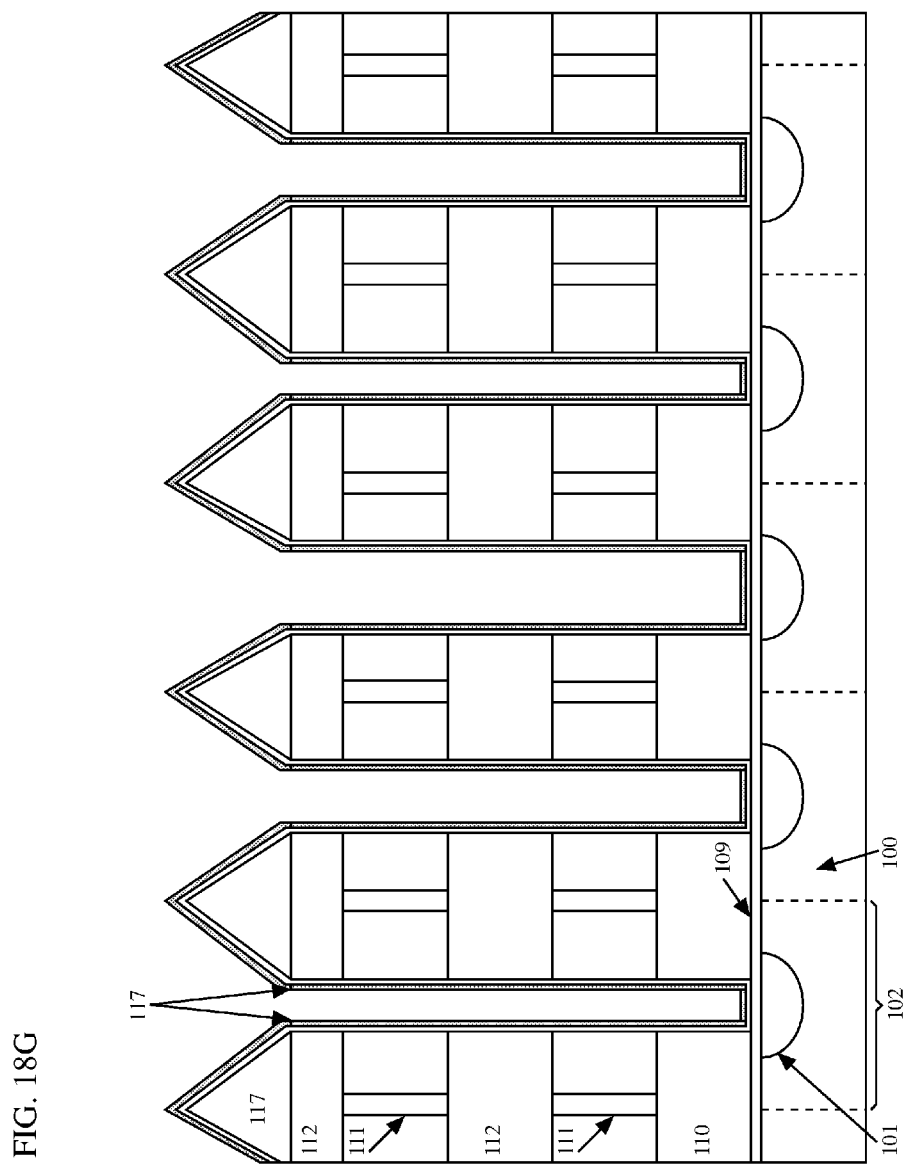
Figure 18H:
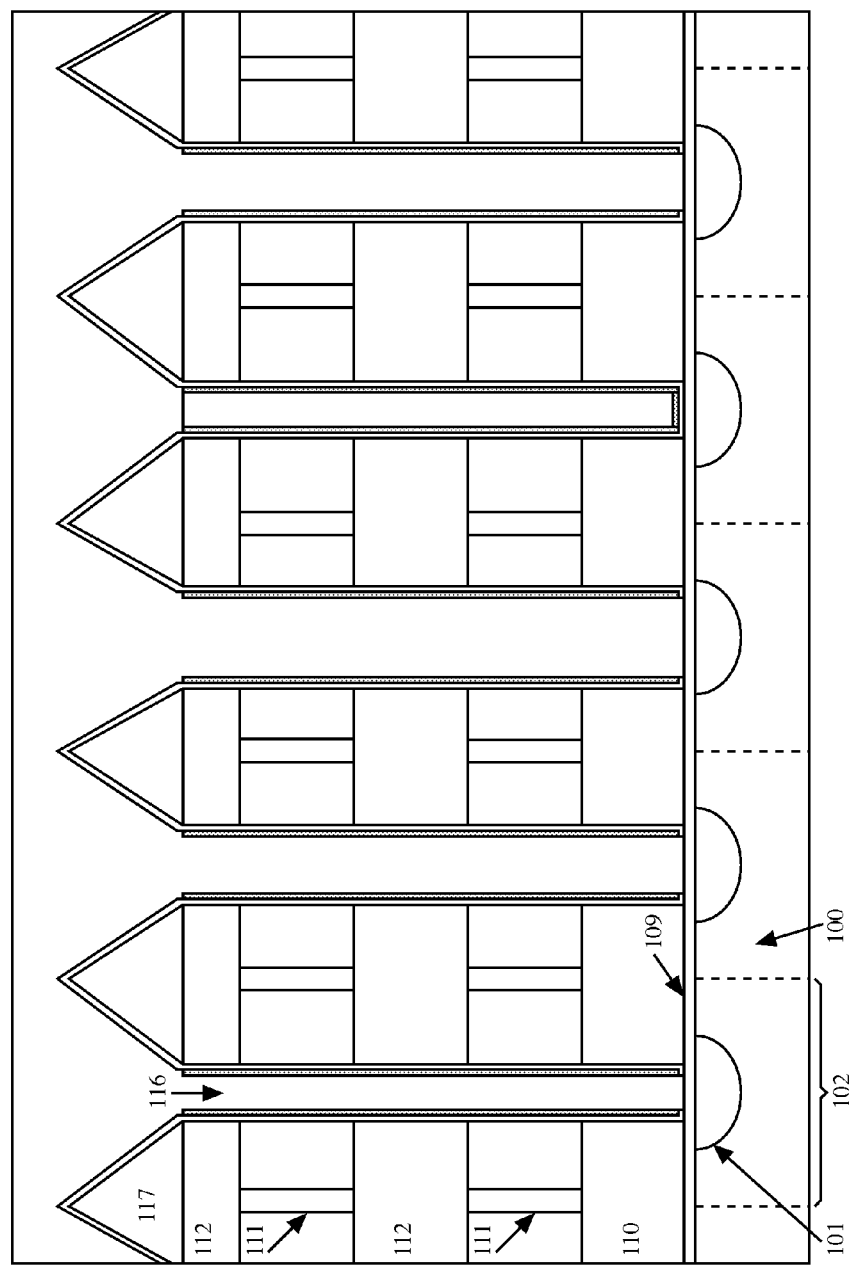
Figure 18I:
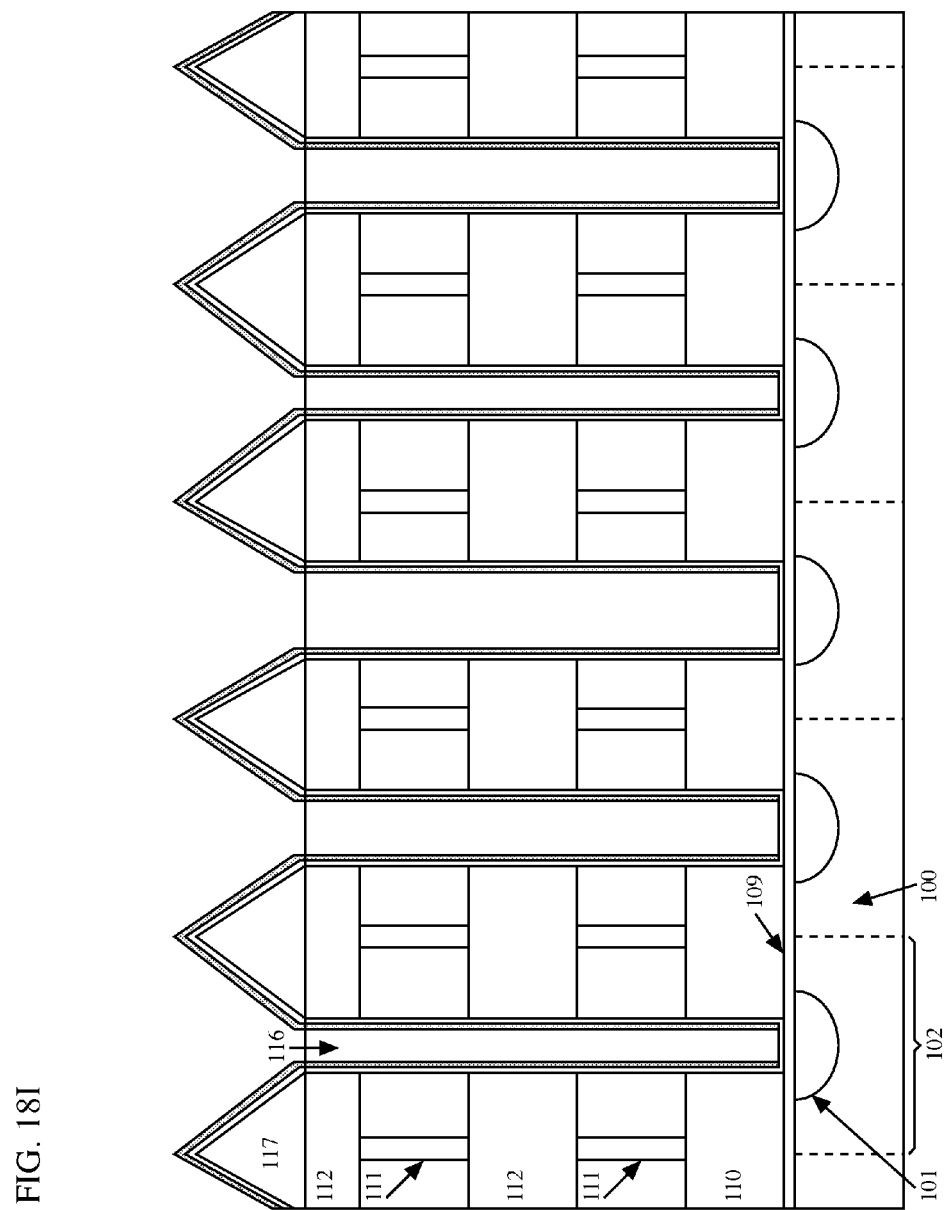
Figure 18J:
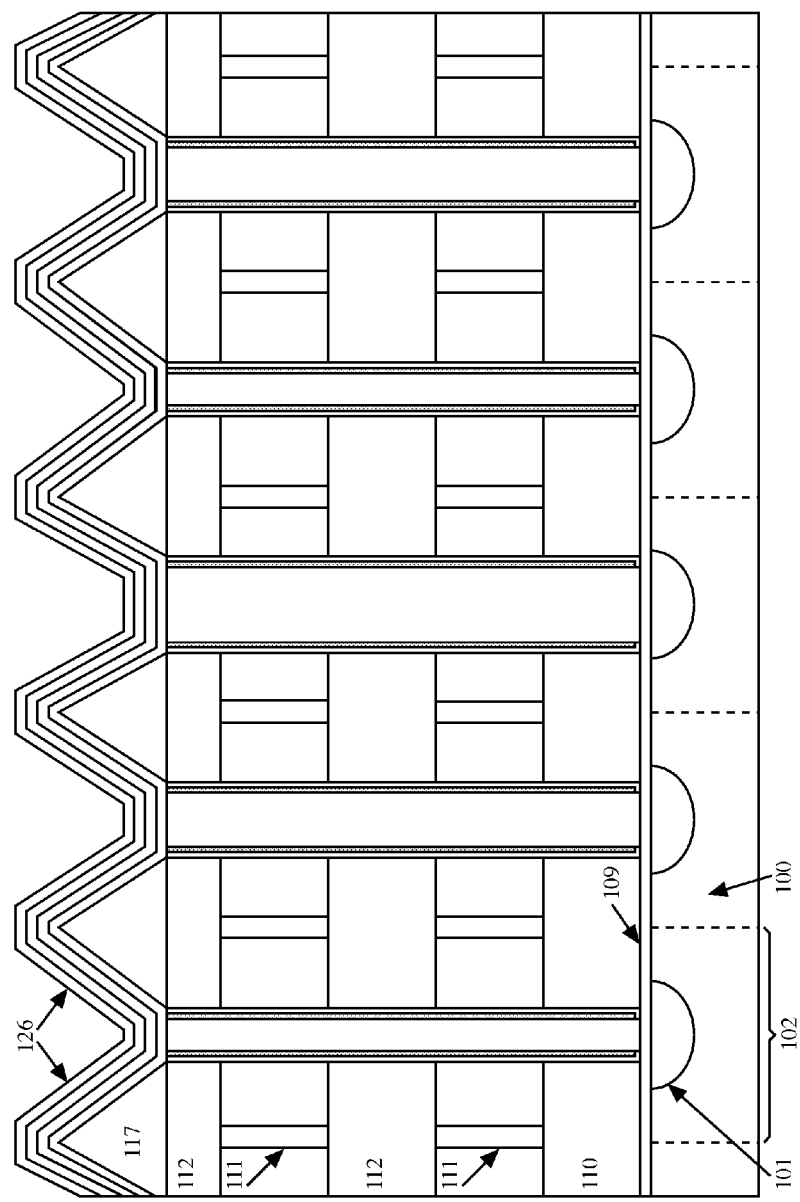
Figure 18K:
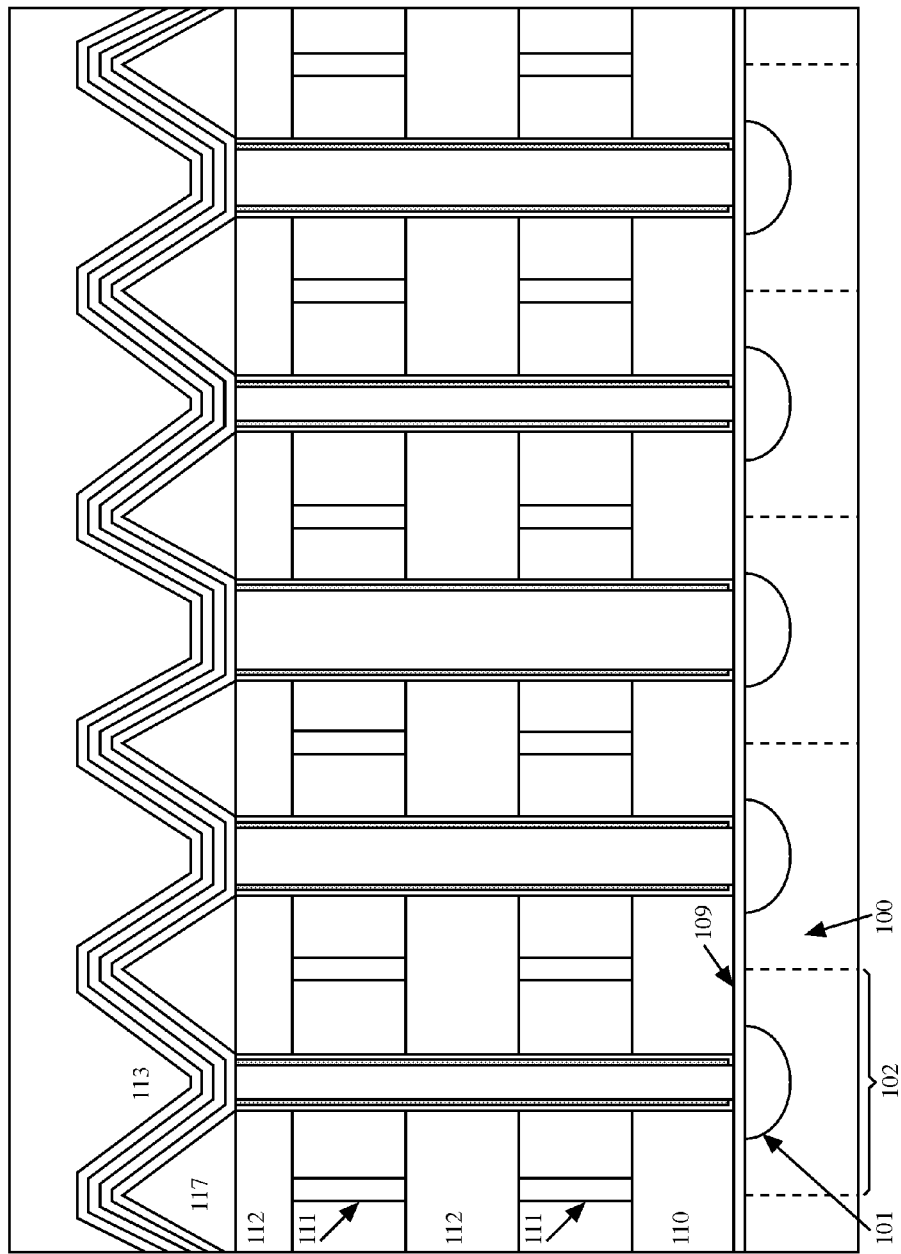
Figure 18L:
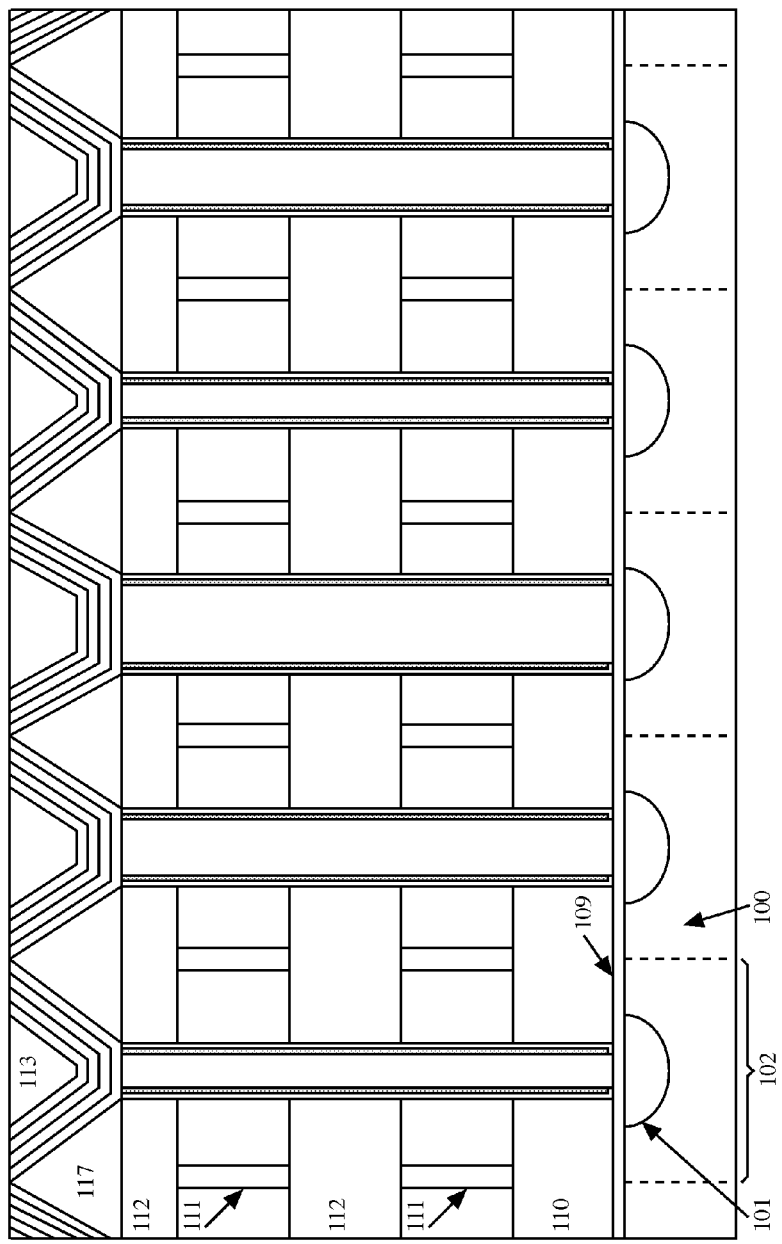
Figure 18M:
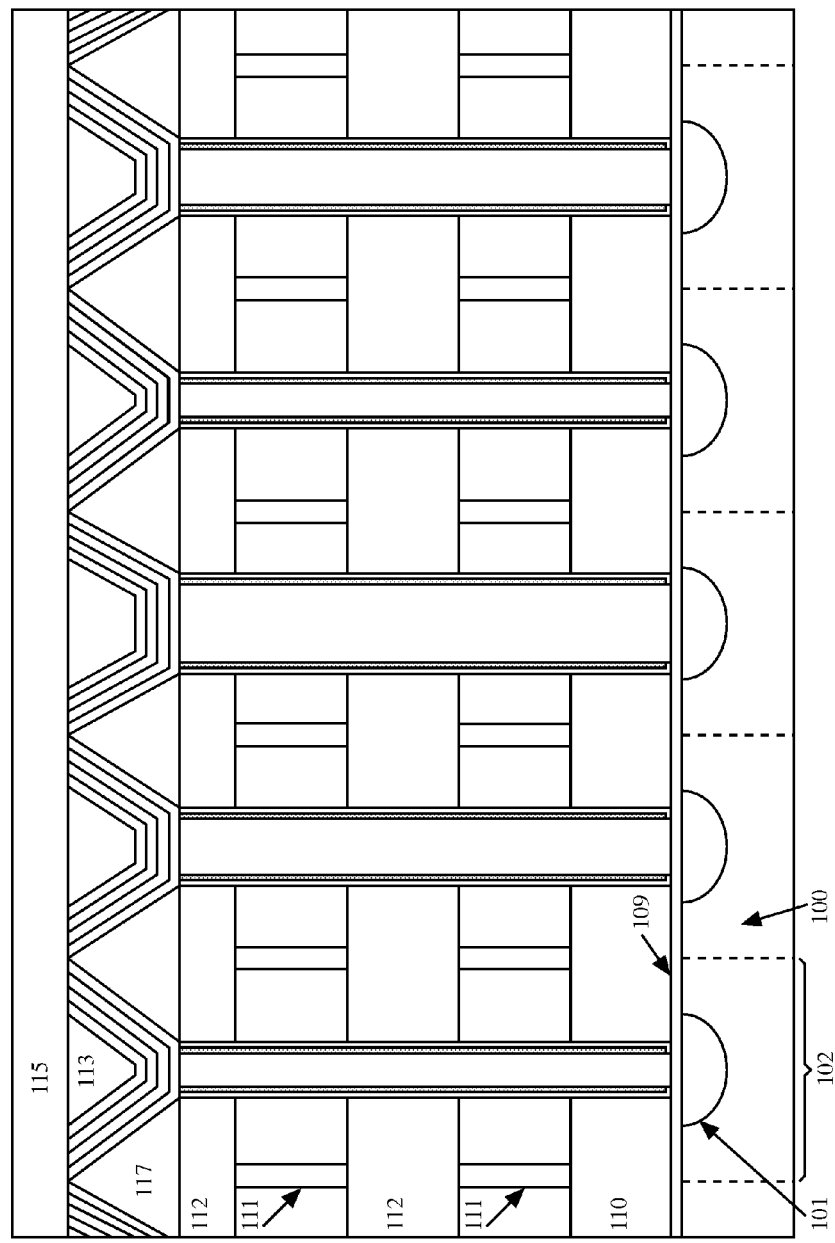

1. Fabrication of Light-Tunnels without Side Wall Reflectors (FIGS. 16A to 16F)
Process Flow #1
1A. Full set of CMOS process steps, including the planarization after the last metal layer, but before the passivation layer, which typically is silicon nitride deposited at low temperature, for example through a plasma assisted process.
FIG. 16A
1B. Photolithography: define holes (127) at the center of every pixel.
1C. Dry Etch through all dielectric layers, stopping on the nitride layer on top of the photo-diodes.
1D. Resist strip & clean.

FIG. 16B

1E. Deposition of dielectric layer with high index of refraction (116), such as silicon nitride.

Given that the "dielectric plug" is silicon nitride, which is also the material typically used as the passivation layer, it is therefore unnecessary to have a separate process step for that layer. Also, since the "hole plug" and the film protecting the photo-diodes are both silicon-nitride (or other films with very similar indices of refraction) there should not be any reflections at the interface between those two regions.

FIG. 16C

1F. Deposition of films having a graded index of refraction (115), starting from silicon nitride, the film composition should be slowly graded to a film possessing the index of refraction that best matches that of the color filters, thereby minimizing reflections at that interface.

FIG. 16D

1G. Fabrication of color filters (104).

FIG. 16E

1H. Fabrication of microlenses (105).

FIG. 16F

End of Process Flow #1

2. Fabrication of Light-Tunnels with Side Wall Reflectors (FIGS. 17A to 17I)

Process Flow #2

2A. Full set of CMOS process steps, including the planarization after the last metal layer, but before the passivation layer, which typically is silicon nitride deposited at low temperature, for example through a plasma assisted process.

FIG. 17A

2B. Photolithography: define holes (127) at the center of every pixel.

2C. Dry Etch through all dielectric layers, stopping on the nitride layer on top of the photo-diodes.

2D. Resist strip & clean.

FIG. 17B

2E. Deposition of a thin dielectric layer such as silicon nitride (128), just a few nanometers thick.

FIG. 17C

2F. Deposition of a thin metal layer (117), just a few nanometers thick.

The metal in question should be a good reflector for light with the wavelengths of interest. For example, Aluminum is a good reflector for a wide range of wavelengths, and can be deposited at low temperature (for example using ALD).

FIG. 17D

2G. Etchback of the metal film, forming metal spacers inside the hole, by removing metal from the bottom of the hole and from the top surface.

FIG. 17E

2H. Deposition of dielectric layer with high index of refraction (116), such as silicon nitride.

Given that the "dielectric plug" is silicon nitride, which is also the material typically used as the passivation layer, it is therefore unnecessary to have a separate process step for that layer. Also, since the "hole plug" and the film protecting the photo-diodes are both silicon-nitride (or other films with very similar indices of refraction) there should not be any reflections at the interface between those two regions.

FIG. 17F

2I. Deposition of films having a graded index of refraction (115), starting from silicon nitride, the film composition should be slowly graded to a film possessing the index of refraction that best matches that of the color filters, thereby minimizing reflections at that interface.

FIG. 17G

2J. Fabrication of color filters (104).

FIG. 17H

2K. Fabrication of microlenses (105).

FIG. 17I

End of Process Flow #2

3. Fabrication of Light-Tunnels with Side Wall Reflectors (FIG. 18A to 18M)

Process Flow #3

3A. Full set of CMOS process steps, including the planarization after the last metal layer, but before the passivation layer, which typically is silicon nitride deposited at low temperature, for example through a plasma assisted process.

FIG. 18A

3B. Deposition of a metal layer (117) to be used as a hard mask.

FIG. 18B

3C. Patterning of the metal layer to be used as a hard mask for example using gray level photolithography to define metal lines with a triangular cross section.

3D. Dry Etch through the metal layers, stopping on the planarized dielectric layer underneath.

3E. Resist strip & clean.

FIG. 18C

3F. Use metal lines as a hard mask to etch holes through all dielectric layers, stopping on the nitride layer on top of the photo-diodes.

3G. Resist strip & clean.

FIG. 18D

3H. Deposition of a thin dielectric layer such as silicon nitride (128), just a few nanometers thick.

FIG. 18E

3I. Deposition of a thin metal layer (117), just a few nanometers thick.

The metal in question should be a good reflector for light with the wavelengths of interest. For example, Aluminum is a good reflector for a wide range of wavelengths, and can be deposited at low temperature (for example using ALD).

FIG. 18F

3J. Etchback of the metal film, forming metal spacers inside the hole, by removing metal from the bottom of the hole and from the top surfaces.

FIG. 18G

3K. Deposition of dielectric layer (116) with high index of refraction, such as silicon nitride.

FIG. 18H

3L. Etchback of the dielectric layer with high index of refraction, forming "plugs" in the holes.

FIG. 18I

3M. Conformal deposition, for example using ALD, of dielectric films with varying composition and increasing index of refraction (126).

FIG. 18J

3N. Non-conformal deposition of a thicker film of the material with the highest index of refraction (113).

FIG. 18K

3O. Planarization through etchback or Chemical Mechanical Polishing (CMP). The top surface of the metal lines can be used as a marker layer. Outside the pixel areas there can be large metal surface areas, thereby facilitating the role of a marker layer for the steps just described.

FIG. 18L

3P. Deposition of films having a graded index of refraction (115), starting from the highest and ending with the lowest.

FIG. 18M

End of Process Flow #3

4. Fabrication of Light-Tunnels in Multiple Stages (FIGS. 19A to 19P)

Process Flow #4

4A. Fabrication of metal interconnects from contacts up to metal level #N.

FIG. 19A

The first stage is inserted after the deposition and planarization of an inter-metal dielectric layer, after metal level #N.

4B. Photolithography: define holes (127) at the center of every pixel.

4C. Dry Etch through all dielectric layers, stopping on the nitride layer on top of the photo-diodes.

4D. Resist strip & clean.

FIG. 19B

4E. Deposition of a thin dielectric layer such as silicon nitride (128), just a few nanometers thick.

FIG. 19C

4F. Deposition of a thin metal layer (117), just a few nanometers thick.

The metal in question should be a good reflector for light with the wavelengths of interest. For example, Aluminum is a good reflector for a wide range of wavelengths, and can be deposited at low temperature (for example using ALD).

FIG. 19D

4G. Etchback of the metal films, forming metal spacers inside the hole, by removing metal from the bottom of the hole and from the top surface.

FIG. 19E

4H. Deposition of dielectric layer (116) with high index of refraction, such as silicon nitride.

FIG. 19F

4I. Etchback of silicon nitride from, and stopping at, the IMD film surface.

FIG. 19G

4J. Fabrication of metal interconnects from metal level #N, to the last metal level.

FIG. 19H

The second stage is inserted after the deposition and planarization of the last dielectric layer that is usually formed before deposition of the passivation layer.

4K. Photolithography: define holes (127) at the center of every pixel.

4L. Dry Etch through all dielectric layers, stopping on the nitride layer fabricated during the "first stage".

4M. Resist strip & clean.

FIG. 19I

4N. Deposition of a thin dielectric layer (128) such as silicon nitride, just a few nanometers thick.

FIG. 19J

4O. Deposition of a thin metal layer (117), just a few nanometers thick.

The metal in question should be a good reflector for light with the wavelengths of interest. For example, Aluminum is a good reflector for a wide range of wavelengths, and can be deposited at low temperature (for example using ALD).

FIG. 19K

4P. Etchback of the metal film, forming metal spacers inside the hole, by removing metal from the bottom of the hole and from the top surface.

FIG. 19L

4Q. Deposition of dielectric layer (116) with high index of refraction, such as silicon nitride.

Given that the "dielectric plug" is silicon nitride, which is also the material typically used as the passivation layer, it is therefore unnecessary to have a separate process step for that layer. Also, since the "hole plug" and the film protecting the photo-diodes are both silicon-nitride (or other films with very similar indices of refraction) there should not be any reflections at the interface between those two regions.

FIG. 19M

4R. Deposition of films (115) having a graded index of refraction, starting from silicon nitride, the film composition should be slowly graded to a film possessing the index of refraction that best matches that of the color filters, thereby minimizing reflections at that interface.

FIG. 19N

4S. Fabrication of color filters (104).

FIG. 19O

4T. Fabrication of microlenses (105).

FIG. 19P

End of Process Flow #4

5. Fabrication of Light-Tunnels with SPP enhancements (FIGS. 20A to 20Q)

Process Flow #5

5A. Fabrication of metal interconnects from contacts up to metal level #N.

FIG. 20A

The first stage is inserted after the deposition and planarization of an inter-metal dielectric layer, after metal level #N.

5B. Photolithography: define holes (127) at the center of every pixel.

5C. Dry Etch through all dielectric layers, stopping on the nitride layer on top of the photo-diodes.

5D. Resist strip & clean.

FIG. 20B

5E. Deposition of a thin dielectric layer (128) such as silicon nitride, just a few nanometers thick.

FIG. 20C

5F. Deposition of a thin metal layer (117), just a few nanometers thick.

The metal in question should be a good reflector for light with the wavelengths of interest. For example, Aluminum is a good reflector for a wide range of wavelengths, and can be deposited at low temperature (for example using ALD).

FIG. 20D

5G. Etchback of the metal films, forming metal spacers inside the hole, by removing metal from the bottom of the hole and from the top surface.

FIG. 20E

5H. Deposition of dielectric layer with high index of refraction (116), such as silicon nitride.

5I. Deposition of thin metal layer (117).

5J. Deposition of dielectric layer with high index of refraction (116), such as silicon nitride.

FIG. 20F

5K. Etchback of dielectric and metal films, stopping on the dielectric material (typically silicon oxide) of the metallization stack.

FIG. 20G

5L. Fabrication of metal interconnects from metal level #N, to the last metal level.

FIG. 20H

The second stage is inserted after the deposition and planarization of the last dielectric layer that is usually formed before deposition of the passivation layer.

5M. Photolithography: define holes (127) at the center of every pixel.

5N. Dry Etch through all dielectric layers, stopping on the nitride layer fabricated during the "first stage".

5O. Resist strip & clean.

FIG. 20I

5P. Deposition of a thin dielectric layer (128) such as silicon nitride, just a few nanometers thick.

FIG. 20J

5Q. Deposition of a thin metal layer (117), just a few nanometers thick.

The metal in question should be a good reflector for light with the wavelengths of interest. For example, Aluminum is a good reflector for a wide range of wavelengths, and can be deposited at low temperature (for example using ALD).

FIG. 20K

5R. Etchback of the metal films, forming metal spacers inside the hole, by removing metal from the bottom of the hole and from the top surface.

FIG. 20L

5S. Deposition of dielectric layer (116) with high index of refraction, such as silicon nitride.

5T. Deposition of thin metal layer (117).

5U. Deposition of dielectric layer (116) with high index of refraction, such as silicon nitride.

FIG. 20M

5V. Etchback of dielectric and metal films, stopping on the dielectric material (typically silicon oxide) of the metallization stack.

FIG. 20N

5W. Deposition of passivation layer (113), typically silicon nitride.

5X. Deposition of films (115) having a graded index of refraction, starting from silicon nitride, the film composition should be slowly graded to a film possessing the index of refraction that best matches that of the color filters, thereby minimizing reflections at that interface.

FIG. 20O

5Y. Fabrication of color filters (104).

FIG. 20P

5Z. Fabrication of microlenses (105).

FIG. 20Q

End of Process Flow #5

6. Fabrication of Light-Tunnels with Bends (FIGS. 21A to 21Q)

Process Flow #6

6A. Fabrication of metal interconnects from contacts up to metal level #N. The top dielectric layer (112)(typically silicon oxide) has an embedded thin layer (109) of a different dielectric material (for example silicon nitride).

FIG. 21A

6B. Photolithography: define trenches into the top dielectric, producing a slanted corner.

6C. Dry etch through the top dielectric layer, stopping at the embedded "marker" layer.

6D. Resist strip & clean.

FIG. 21B

6E. Deposition of: thin metal film (117). Optional step: deposition of thin silicon nitride layer prior to the deposition of the thin metal layer.

FIG. 21C

6F. Photolithography: define holes (127) into the metallization stack, aligned with the photo-diodes.

6G. Dry etch of holes through metallization stack (typically oxide layers), stopping at the silicon nitride film immediately over the photo-diodes.

6H. Resist strip & clean.

FIG. 21D

6I. Deposition of a dielectric thin film (128), such as silicon nitride.

FIG. 21E

6J. Deposition metal thin film (117), for example aluminum.

FIG. 21F

6K. Etchback of the metal thin film, stopping on the silicon nitride.

FIG. 21G

6L. Deposition of a dielectric film (113), for example silicon nitride, to fill the holes and trenches.

FIG. 21H

6M. Etchback of silicon nitride, stopping on the top dielectric (oxide).

FIG. 21I

6N. Photolithography: define a slant on the silicon nitride, on top of the hole centered on the photo-diode. This step can be achieved with "gray level lithography".

6O. Dry etch of silicon nitride, forming a slanted corner.

6P. Resist strip & clean.

FIG. 21J

6Q. Deposition of metal (117), for example aluminum.

FIG. 21K

6R. Optional deposition of a dielectric material (112), for example silicon oxide.

FIG. 21L

6S. Photolithography: removal of metal from the areas around the trenches & holes.

6T. Dry etch of metal, stopping on silicon nitride and/or oxide.

6U. Resist strip & clean.

FIG. 21M

6V. Deposition of dielectric material (113), such as silicon nitride, to fill the holes and form the passivation layer.

FIG. 21N

6W. Deposition of films (115) with graded index of refraction.

FIG. 21O

6X. Fabrication of color filters (104).

FIG. 21P

6Y. Fabrication of microlenses (105).

FIG. 21Q

End of Process Flow #6

The invention claimed is:

1. Photonic passive structure to couple and guide light between photonic active devices, light emitting devices and light-valves, monolithically integrated with CMOS devices, which may be arranged into 2d arrays, and the top of the CMOS metallization layer stack interconnecting said photonic devices and CMOS devices, wherein said photonic passive structure comprises a hole between the near surface of said photonic active devices and the top of said CMOS metallization stack, said hole being filled with a dielectric and having inner surfaces covered with a metal film, in which the dielectric filling the hole has an index of refraction larger than the index of refraction of the inter-metal dielectrics in the metallization stack in which the dielectric filled holes have embedded metal columns, at the center of said holes, in which the cross section area of said columns is smaller than the cross section area of said holes, in which said holes have also embedded metal thin films along the outer perimeter.

2. The structure of claim 1, in which the dielectric filled holes have embedded metal columns, at the center of said holes, in which the cross section area of said columns is much small than the cross section are of said holes, and in which said holes have also embedded metal thin films along the outer perimeter.

3. The structure of claim 1 in which the dielectric filled holes have embedded metal thin films along the outer perimeter, and wherein the embedded metal thin films are connected to planar perforated metal films formed on top of the metallization stack.

4. The structure of claim 1 in which the embedded metal columns are connected to planar perforated metal films formed on top of the metallization stack.

5. The structure of claim 1 in which the embedded metal thin films are connected to a first planar perforated metal films formed on top of the metallization stack, and in which the embedded metal columns are connected to a second planar perforated metal films formed on top of the metallization stack, having a dielectric formed between said first and second perforated metal films.

6. The structure of claim 1 having horizontal waveguiding structures to couple light between regions at the top of the metallization stack and photonic active devices that are not aligned vertically.

7. Method of fabrication of the structure of claim 1, comprising the full fabrication of a metallization stack,
- formation of holes extending from the top of the metallization stack, through said stack, down to the barrier layer at the bottom of said stack,
- filling said holes with a dielectric with a high index of refraction and that may comprise embedded metal films,
- the formation of a passivation layer with an index of refraction similar to that of the dielectric filling the holes,
- formation of a film with a vertical gradient in the index of refraction which at the bottom matches the index of refraction of the passivation film and at the top matching the index of refraction of the color filters formed thereon, and
- the formation of microlenses.

8. The method of fabrication of claim 7 in which said embedded films are formed as embedded side walls to said dielectric filled holes.

9. The method of fabrication of claim 7 in which said embedded films are formed as embedded center columns in said dielectric filled holes.

10. The method of fabrication of claim 7 in which said embedded films are formed as embedded side walls to said dielectric filled holes and also as embedded center columns in said dielectric filled holes.

11. The method of fabrication of claim 7 in which said embedded films are formed as embedded side walls to said dielectric filled holes, and in which a portion said embedded metallic film is formed over a planar region surrounding the dielectric filled holes, and in which said portion of said metal films is perforated according to pre-defined patterns.

12. The method of fabrication of claim 7 in which said embedded films are formed as embedded center columns in said dielectric filled holes, and in which a portion said embedded metallic film is formed over a planar region surrounding the dielectric filled hole, and in which said portion of said metal films is perforated according to pre-defined patterns.

13. The method of fabrication of claim 7 in which said embedded films are formed as embedded side walls to said dielectric filled holes and also as embedded center columns in said dielectric filled holes, and in which a portion of each said embedded metallic films is formed over a planar region surrounding the dielectric filled hole, each said metal film being separated from the other by a dielectric layer, and in which said portions of said metal films are perforated according to pre-defined patterns.

14. Method of fabrication of the structure of claim 1, comprising the fabrication of a fraction of the complete metallization stack,
- the formation of holes extending from the top of the metallization stack, through said stack, down to the barrier layer at the bottom of said stack,
- filling said holes with a dielectric with a high index of refraction and that may comprise embedded metal films,
- repetition of the previous process steps for all fractions of the complete metallization stack,
- formation of a passivation layer with an index of refraction similar to that of the dielectric filling the holes,
- formation of a film with a vertical gradient in the index of refraction which at the bottom matches the index of refraction of the passivation film and at the top matching the index of color filters formed thereon, and
- the formation of microlenses.

15. Method of fabrication of the structure of claim 6, comprising the full fabrication of a metallization stack,
- the formation of a first, a second and a third dielectric layers,
- said second dielectric being different from the first and third dielectrics,
- the patterning of the third dielectric layer, producing sloped surfaces and using the second dielectric layer as a marker,
- the conformal deposition of a thin metal film,
- the formation of holes through areas in which the third dielectric layer had been removed, reaching the barrier layer underneath the pre-metal dielectric layer,
- the conformal deposition of a thin dielectric film,
- the conformal deposition and etchback of a thin metal film,
- the deposition of a fourth dielectric layer,
- planarization and etchback at the level of the remaining regions of said third dielectric,
- the patterned etch of said fourth dielectric producing sloped surfaces over the region in which the holes through the metallization stack were done,
- the deposition of a thicker metal layer,
- the deposition of a fifth dielectric layer,
- the formation of holes through said fifth dielectric and thick metal layers, stopping on sloped surfaces of the first dielectric layer,
- the deposition of a sixth dielectric layer with a high index of refraction filling said holes and covering the surface of the fifth dielectric layer,
- the formation of a film with a vertical gradient in the index of refraction which at the bottom matches the index of refraction of the passivation film and at the top matching the index of refraction of the color filters formed thereon, and
- the formation of microlenses.

* * * * *